US012802429B2

(12) United States Patent
Orémuš et al.

(10) Patent No.: US 12,802,429 B2
(45) Date of Patent: Nov. 17, 2026

(54) LAMELLA END-POINTING VIA GRAPH-WEIGHTED NEURAL NETWORKS

(71) Applicant: FEI Company, Hillsboro, OR (US)

(72) Inventors: Zoltán Orémuš, Šlapanice (CZ); Jamie Dee Gravell, Beaverton, OR (US); Jakub Strejček, Brno (CZ)

(73) Assignee: FEI Company, Hillsboro, OR (US)

( * ) Notice: Subject to any disclaimer, the term of this patent is extended or adjusted under 35 U.S.C. 154(b) by 165 days.

(21) Appl. No.: 18/611,256

(22) Filed: Mar. 20, 2024

(65) Prior Publication Data

US 2025/0104410 A1 Mar. 27, 2025

Related U.S. Application Data

(60) Provisional application No. 63/585,891, filed on Sep. 27, 2023.

(51) Int. Cl.
*G06V 10/82* (2022.01)
*G06F 30/12* (2020.01)
*G06V 10/764* (2022.01)
*G06V 10/774* (2022.01)
*G06V 20/69* (2022.01)
*G06V 20/70* (2022.01)

(52) U.S. Cl.
CPC .............. *G06V 10/82* (2022.01); *G06F 30/12* (2020.01); *G06V 10/764* (2022.01); *G06V 10/774* (2022.01); *G06V 20/693* (2022.01); *G06V 20/698* (2022.01); *G06V 20/70* (2022.01)

(58) Field of Classification Search
None
See application file for complete search history.

(56) References Cited

U.S. PATENT DOCUMENTS 5,435,850 A 7/1995 Rasmussen
5,851,413 A 12/1998 Casella et al.
(Continued)

FOREIGN PATENT DOCUMENTS

CN 113592008 A * 11/2021 ........... G06F 18/214

OTHER PUBLICATIONS

Xiao et al. "HSGACN: Hyperspectral Image Classification Algorithm Based On Graph Convolutional Network", IGARSS 2021-2021 IEEE International Geoscience and Remote Sensing Symposium | 978-1-6654-0369-6/21/$31.00 © 2021 (Year: 2021).*
(Continued)

*Primary Examiner* — Randolph I Chu
(74) *Attorney, Agent, or Firm* — Amin, Turocy & Watson, LLP

(57) ABSTRACT

Systems or techniques are provided for facilitating lamella end-pointing via graph-weighted neural networks. In various embodiments, a system can access an image captured by a scientific instrument, wherein the image depicts a cutface of a lamella. In various aspects, the system can generate, via execution of a graph-weighted neural network, a classification label for the cutface, wherein the classification label can indicate to which one of a plurality of defined classes the cutface belongs. In various instances, the system can, in response to the classification label indicating that the cutface does not belong to a target class of the plurality of defined classes, instruct the scientific instrument to incrementally mill the cutface of the lamella.

20 Claims, 26 Drawing Sheets

(56) References Cited

U.S. PATENT DOCUMENTS

| | | | | |
|---|---|---|---|---|
| 10,465,293 | B2 * | 11/2019 | Miller | G01N 1/32 |
| 12,354,256 | B2 | 7/2025 | Besson et al. | |
| 2010/0229145 | A1 | 9/2010 | Sahouria et al. | |
| 2012/0080406 | A1 * | 4/2012 | Boguslavsky | H01J 37/302<br>216/66 |
| 2014/0061032 | A1 * | 3/2014 | Miller | H01J 37/304<br>204/298.36 |
| 2018/0336454 | A1 * | 11/2018 | Lim | G06N 3/08 |
| 2021/0334623 | A1 * | 10/2021 | De Haan | G06N 3/045 |
| 2022/0067915 | A1 * | 3/2022 | Miller | G06V 10/454 |
| 2023/0034667 | A1 | 2/2023 | Flanagan et al. | |
| 2023/0351215 | A1 | 11/2023 | Sun et al. | |
| 2024/0071040 | A1 | 2/2024 | Miller et al. | |
| 2025/0104410 | A1 | 3/2025 | Orémušet al. | |

OTHER PUBLICATIONS

Tsurusawa et al. "Robotic fabrication of high-quality lamellae for aberration-corrected transmission electron microscopy", (Year: 2021).*

Translation of CN-113592008-A (Year: 2021).*

Non-Final Office Action received for U.S. Appl. No. 18/950,590 dated Aug. 19, 2026, 19 pages.

* cited by examiner

602

| | |
|---|---|
| RAW CLASS A PROBABILITY | 0.20 |
| RAW CLASS B PROBABILITY | 0.05 |
| RAW CLASS C PROBABILITY | 0.30 |
| RAW CLASS D PROBABILITY | 0.40 |
| RAW CLASS E PROBABILITY | 0.05 |

404

IF CLASS A IS THE BASE CLASS

| | |
|---|---|
| MODIFIED CLASS A PROBABILITY | 0.53 |
| MODIFIED CLASS B PROBABILITY | 0.07 |
| MODIFIED CLASS C PROBABILITY | 0.40 |
| MODIFIED CLASS D PROBABILITY | 0 |
| MODIFIED CLASS E PROBABILITY | 0 |

404

IF CLASS D IS THE BASE CLASS

| | |
|---|---|
| MODIFIED CLASS A PROBABILITY | 0 |
| MODIFIED CLASS B PROBABILITY | 0 |
| MODIFIED CLASS C PROBABILITY | 0 |
| MODIFIED CLASS D PROBABILITY | 0.94 |
| MODIFIED CLASS E PROBABILITY | 0.06 |

FIG. 9

LAMELLA END-POINTING VIA GRAPH-WEIGHTED NEURAL NETWORKS

CROSS-REFERENCE TO RELATED APPLICATIONS

This application claims priority to U.S. Provisional Application No. 63/585,891, entitled, "WEIGHTED GRAPH REINFORCED NEURAL NETWORK ENDPOINTING," which was filed on Sep. 27, 2023. The entirety of the aforementioned application is hereby incorporated herein by reference.

BACKGROUND

Various scientific instruments can perform milling and imaging of lamellas. Such milling and imaging, when used in conjunction with artificial neural networks, can facilitate end-pointing of such lamellas.

SUMMARY

The following presents a summary to provide a basic understanding of one or more embodiments. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus or computer program products that facilitate lamella end-pointing via graph-weighted neural networks are described.

According to one or more embodiments, a system is provided. The system can comprise a non-transitory computer-readable memory that can store computer-executable components. The system can further comprise a processor that can be operably coupled to the non-transitory computer-readable memory and that can execute the computer-executable components stored in the non-transitory computer-readable memory. In various embodiments, the computer-executable components can comprise an access component that can access an image captured by a scientific instrument, wherein the image can depict a cutface of a lamella. In various aspects, the computer-executable components can comprise a model component that can generate, via execution of a graph-weighted neural network, a classification label for the cutface, wherein the classification label can indicate to which one of a plurality of defined classes the cutface belongs. In various instances, the computer-executable components can comprise a milling component that can, in response to the classification label indicating that the cutface does not belong to a target class of the plurality of defined classes, instruct the scientific instrument to incrementally mill the cutface of the lamella.

According to one or more embodiments, a computer-implemented method is provided. In various embodiments, the computer-implemented method can comprise accessing, by a device operatively coupled to a processor, an image captured by a scientific instrument, wherein the image can depict a cutface of a lamella. In various aspects, the computer-implemented method can comprise generating, by the device and via execution of a graph-weighted neural network, a classification label for the cutface, wherein the classification label can indicate to which one of a plurality of defined classes the cutface belongs. In various instances, the computer-implemented method can comprise instructing, by the device and in response to the classification label indicating that the cutface does not belong to a target class of the plurality of defined classes, the scientific instrument to incrementally mill the cutface of the lamella.

According to one or more embodiments, a computer program product for facilitating lamella end-pointing via graph-weighted neural networks is provided. In various embodiments, the computer program product can comprise a non-transitory computer-readable memory having program instructions embodied therewith. In various aspects, the program instructions can be executable by a processor to cause the processor to access an image captured by a dual beam charged-particle microscope, wherein the image can depict a cutface of a lamella. In various instances, the program instructions can be executable to cause the processor to generate, via execution of a graph-weighted neural network, a classification label for the cutface, wherein the classification label can indicate which one of a plurality of structures the cutface contains. In various cases, the program instructions can be executable to cause the processor to instruct, in response to the classification label indicating that the cutface does not contain a target structure, the dual beam charged-particle microscope to incrementally mill the cutface of the lamella.

DESCRIPTION OF THE DRAWINGS

Various embodiments will be readily understood by the following detailed description in conjunction with the accompanying figures. To facilitate this description, like reference numerals designate like structural elements. Embodiments are illustrated by way of example, not by way of limitation, in the figures. The figures are not necessarily drawn to scale.

FIGS. 5-9 illustrate example, non-limiting block diagrams showing how a graph-weighted neural network can be used to generate a classification label in accordance with one or more embodiments described herein.

DETAILED DESCRIPTION

Figure 1:
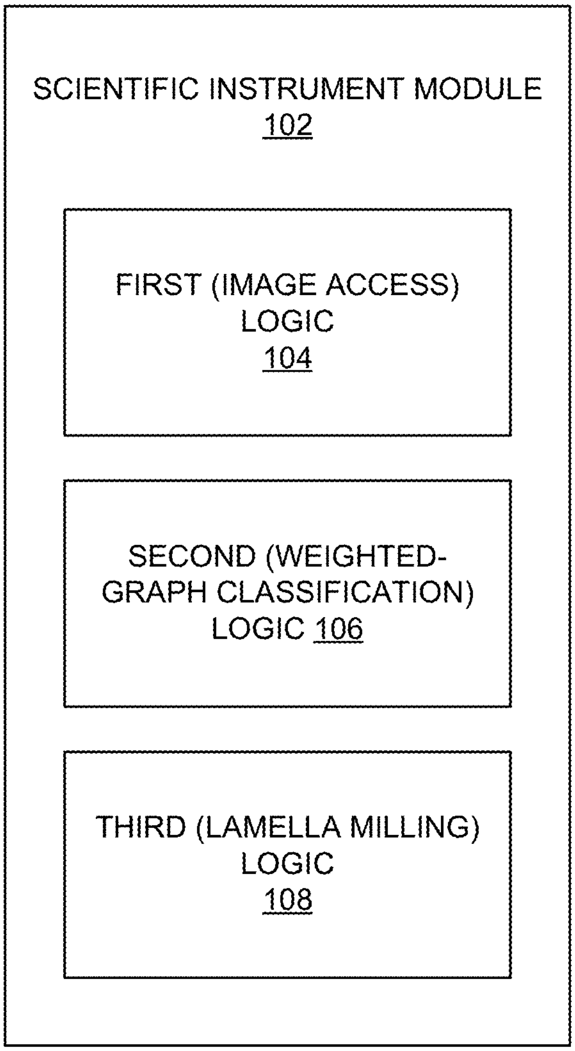
FIG. 1 illustrates an example, non-limiting block diagram of a scientific instrument module in accordance with various embodiments described herein.

The following detailed description is merely illustrative and is not intended to limit embodiments or application/uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Various operations can be described as multiple discrete actions or operations in turn, in a manner that is most helpful in understanding the subject matter disclosed herein. However, the order of description should not be construed as to imply that these operations are necessarily order dependent. In particular, these operations can be performed in an order different from the order of presentation. Operations described can be performed in a different order from the described embodiments. Various additional operations can be performed, or described operations can be omitted in additional embodiments.

Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices. As used herein, the phrase "based on" should be understood to mean "based at least in part on," unless otherwise specified.

A scientific instrument (e.g., mass spectrometer, charged-particle microscope) can be any suitable computerized device that can capture or generate electronic measurements in a scientific, laboratory, research, or clinical operational context (e.g., that can capture or generate spectroscopic images or composition spectra). To facilitate the capture or generation of such electronic measurements, scientific instruments can leverage complex arrangements of actuatable parts (e.g., ion sources, ion lenses, heaters, coolers, fluid valves, fluid pumps, circuit switches, specimen stages, apertures), sensors (e.g., ion detectors, voltmeters, thermistors, potentiometers, pressure gauges), or consumables (e.g., carrier fluids, calibrants, filters).

Various scientific instruments (e.g., scanning or transmission electron microscopes, electron energy-loss microscopes) can utilize their constituent actuatable parts to capture images (e.g., electron tomography images, X-ray tomography images, confocal microscopy images) of specimens. In some cases, those images can be two-dimensional arrays of pixels. In other cases, those images can instead be three-dimensional arrays of voxels. In addition to being able to capture images of specimens, various scientific instruments (e.g., dual beam charged-particle microscopes) can perform milling (e.g., material removal or etching) on such specimens.

In various instances, the ability of various scientific instruments to perform both imaging and milling on specimens can be leveraged to facilitate lamella end-pointing. In particular, a lamella can be a thin, rectangular layer or slice that is cut from a larger, manufactured specimen (e.g., that is cut from a printed circuit board or from a semiconductor substrate). In various cases, the lamella can contain one or more structures or sub-structures of interest. For example, the lamella can contain a transistor that was fabricated or otherwise built (e.g., via any suitable photolithography or deposition techniques) into or onto the larger, manufactured specimen, and that transistor can itself be considered as being made up of a gate, a source drain, and a fin. In various aspects, it can be desired to determine whether or not various ones of those structures or sub-structures (e.g., whether or not the gate, source drain, or fin) were fabricated or built correctly or otherwise as expected. To facilitate such determination, it can be desired to first physically isolate a given one of those structures or sub-structures and to subsequently analyze that given structure or sub-structure (e.g., via transmission electron microscopy). In various aspects, isolation of that given structure or sub-structure can be facilitated by a process called lamella end-pointing.

In various instances, lamella end-pointing can involve: a scientific instrument that is capable of both imaging and milling a lamella; and an artificial neural network that is trained or otherwise configured to classify structures or sub-structures of a particular lamella (e.g., two different lamellas containing different or otherwise non-identical types of structures or sub-structures can necessitate two differently trained or configured artificial neural networks). More specifically, the scientific instrument can incrementally mill (e.g., remove material from) a first side (e.g., front-side) of the lamella (e.g., via an ion beam of a dual beam microscope), thereby forming a cutface on that first side of the lamella. The scientific instrument can then capture an image of that cutface post-milling (e.g., via an electron beam of a dual beam microscope). Next, that image can be fed to the artificial neural network, and the artificial neural network can produce a classification label that indicates which specific structure or sub-structure of the lamella is depicted in the image. If the classification label indicates that the depicted structure or sub-structure is different from whichever structure or sub-structure that is desired to be physically isolated, various operations mentioned above can be repeated (e.g., the scientific instrument can again incrementally mill and image the cutface, and the artificial neural network can generate a new classification label indicating whether or not the desired structure or sub-structure has yet been reached). Instead, if the classification label indicates that the depicted structure or sub-structure is the desired structure or sub-structure, it can be concluded that lamella end-pointing with respect to the first side of the lamella is complete or finished. Lamella end-pointing can then be performed with respect to a second side (e.g., back-side) of the lamella. Once lamella end-pointing with respect to the second side is complete or finished, the desired structure or sub-structure can be considered as now being physically isolated. In other words, all other structures or sub-structures of the lamella can be considered as having been iteratively removed from the lamella via milling.

Accordingly, lamella end-pointing can be considered as an iterative milling-and-imaging process that progressively thins a lamella until the lamella contains only whichever specific structure or sub-structure that is desired to be isolated (e.g., before end-pointing, the lamella can have a thickness measuring on the order of 50 nanometers (nm) to 130 nm; after end-pointing, the lamella can have a thickness measuring on the order of 25 nm or less, depending upon the thickness of the structure or sub-structure that is desired to be isolated).

Unfortunately, existing techniques for facilitating lamella end-pointing suffer from various disadvantages. In particular, whatever artificial neural network that is used to perform lamella end-pointing can first be trained in supervised fashion using training images and respectively corresponding ground-truth classification labels. When some existing techniques are implemented, the artificial neural network can be trained on a voluminous number of image-annotation pairs (e.g., many thousands of training images, each with a corresponding ground-truth classification label). Although such existing techniques can cause the artificial neural network to achieve a high level of classification accuracy, such existing techniques regrettably involve the sacrifice of very many lamellas. Indeed, a few tens or dozens of image-annotation pairs can be obtained by iteratively imaging and milling a single lamella. So, in order to train the artificial neural network to a satisfactory or sufficient level of classification accuracy, some existing techniques require the sacrifice or destruction of hundreds of lamellas. This can be considered as excessively wasteful (e.g., lamellas are layers or slices of real-world specimens that have non-zero costs associated with their manufacture or fabrication; destroying lamellas in order to create end-pointing training data can thus be considered as costly). When other existing techniques are implemented, the artificial neural network can instead be trained on far fewer image-annotation pairs. Although such other existing techniques can involve the sacrifice or destruction of a much smaller number of lamellas (e.g., and can thus be considered as less wasteful), the artificial neural network of such other existing techniques often cannot achieve a satisfactory or sufficient level of classification accuracy (e.g., with too little training, the artificial neural network cannot properly learn how to recognize lamella structures or sub-structures). Such low accuracy can be undesirable.

Accordingly, systems or techniques that can ameliorate one or more of these technical problems can be desirable.

Various embodiments described herein can address one or more of these technical problems. One or more embodiments described herein can include systems, computer-implemented methods, apparatus, or computer program products that can facilitate lamella end-pointing via graph-weighted neural networks. In particular, various embodiments described herein can facilitate or otherwise perform end-pointing for a given lamella by utilizing an artificial neural network whose classification labels are multiplicatively modified (e.g., are weighted) via a neighborhood graph that corresponds to the given lamella. More specifically, as mentioned above, the given lamella can be considered as containing various structures or sub-structures of interest, and end-pointing can be considered as physically isolating specific ones of those structures or sub-structures, so that it can be subsequently determined whether or not those isolated structures or sub-structures were manufactured or fabricated properly. In other words, the structures or sub-structures of interest can have been manufactured or fabricated according to a specific engineering design or schematic, and the structures or sub-structures of interest can thus be expected to be physically located or positioned along the direction or axis of milling within the lamella in some particular order that is defined by that specific engineering design or schematic. In still other words, it can be expected to encounter certain structures or sub-structures of interest during end-pointing before encountering other structures or sub-structures of interest (e.g., it can be expected that the gate of a transistor is encountered during end-pointing before the source drain of the transistor is encountered; it can be expected that the source drain of the transistor is encountered during end-pointing before the fin of the transistor is encountered). In various aspects, the neighborhood graph can be a directed graph (e.g., comprising nodes and directed edges) that represents or otherwise captures such positional or locational ordering of the structures or sub-structures within the given lamella. In particular, nodes of the neighborhood graph can respectively represent the structures or sub-structures within the given lamella, each node can be coupled to all other nodes via directed edges, and weights of those directed edges can respectively indicate which of those structures or sub-structures are or are not neighbors of each other along the direction or axis of milling (e.g., larger weights can be given to edges that couple neighbors, and lower weights can be given to edges that couple non-neighbors). In various cases, whenever the artificial neural network produces a classification label for an image of a lamella, the structure-wise probabilities in that classification label can be multiplied by respective ones of the weights in the neighborhood graph. This can yield a modified classification label. As described herein, the modified classification label (rather than the raw classification label that is directly outputted by the artificial neural network) can be used to trigger the termination of lamella end-pointing. As the inventors of various embodiments described herein experimentally verified, weighting the artificial neural network via the neighborhood graph in this way can be considered as boosting classification accuracy of the artificial neural network. Accordingly, the artificial neural network can be trained on a small dataset that does not require the sacrifice or destruction of numerous lamellas, without suffering from poor classification accuracy. Contrast this with existing techniques, which force a choice between: high accuracy at the expense of many sacrificed lamellas; and sacrificing fewer lamellas at the expense of deteriorated classification accuracy.

Various embodiments described herein can be considered as a computerized tool (e.g., any suitable combination of computer-executable hardware or computer-executable software) that can facilitate lamella end-pointing via graph-weighted neural networks. In various aspects, such computerized tool can comprise an access component, a model component, or a milling component.

In various embodiments, there can be a scientific instrument. In various aspects, the scientific instrument can be any suitable computerized device that can perform or facilitate both milling and imaging of a lamella. As a non-limiting example, the scientific instrument can be a dual beam microscope that can facilitate milling via an ion beam and that can facilitate imaging via an electron beam. In various instances, the lamella can be a thin, rectangular slice or layer that was cut from any suitable larger specimen. In various cases, the lamella can contain or otherwise comprise any suitable structures of interest. As a non-limiting example, if the lamella was cut from a semiconductor circuitry specimen, the lamella can contain a transistor that was fabricated via photolithography onto the semiconductor circuitry specimen, and that transistor can be made up of one or more gates, one or more source drains, and one or more fins. In such example, the one or more gates, the one or more source drains, and the one or more fins can be considered as the structures of interest.

In various aspects, the scientific instrument can electronically capture an image of the lamella. In various instances, the image can be a two-dimensional pixel array that visually depicts a cutface of the lamella. In various cases, the cutface can be a surface of the lamella (e.g., a front surface; a rear surface) from which material that was previously part of the lamella was removed via a previous milling operation by the scientific instrument. Accordingly, the cutface can be considered as a cross-section of the lamella that has been revealed via milling. Note that the performance of more or additional milling can be considered as causing the cutface to move deeper into the lamella. The lamella can contain different structures of interest at different depths, and so different ones of those structures can be visible in or on the cutface, depending upon the depth of the cutface (e.g., depending upon how much total or cumulative milling has been performed on the lamella).

In any case, it can be desired to perform end-pointing on the lamella, based on the image of the cutface. That is, it can be desired to determine whether or not the lamella has been sufficiently milled, such that a desired structure is contained or otherwise present in or on the cutface. As described herein, the computerized tool can facilitate such end-pointing.

In various embodiments, the access component of the computerized tool can electronically access the image of the cutface. For instance, the access component can receive, retrieve, or otherwise obtain the image from any suitable centralized or decentralized data structure (e.g., graph data structure, relational data structure, hybrid data structure). As a non-limiting example, the access component can receive, retrieve, or obtain the image from the scientific instrument itself. In any case, the access component can be considered as a conduit through which other components of the computerized tool can electronically interact with (e.g., read, write, edit, copy, manipulate) the image.

In various embodiments, the model component of the computerized tool can electronically store, maintain, control, or otherwise access a deep learning neural network. In various aspects, the deep learning neural network can exhibit any suitable deep learning internal architecture. For example, the deep learning neural network can include any suitable numbers of any suitable types of layers (e.g., input layer, one or more hidden layers, output layer, any of which can be convolutional layers, dense layers, non-linearity layers, long short-term memory (LSTM) layers, pooling layers, batch normalization layers, or padding layers). As another example, the deep learning neural network can include any suitable numbers of neurons in various layers (e.g., different layers can have the same or different numbers of neurons as each other). As yet another example, the deep learning neural network can include any suitable activation functions (e.g., softmax, sigmoid, hyperbolic tangent, rectified linear unit) in various neurons (e.g., different neurons can have the same or different activation functions as each other). As still another example, the deep learning neural network can include any suitable interneuron connections or interlayer connections (e.g., forward connections, skip connections, recurrent connections).

Regardless of its specific internal architecture, the deep learning neural network can be configured as an image classifier that corresponds to the specific structures that are contained within the lamella. In particular, the deep learning neural network can be configured to classify which (if any) of whatever structures that are contained in the lamella are depicted or illustrated in an inputted image. Accordingly, the model component can electronically execute the deep learning neural network on the image of the cutface of the lamella, and such execution can cause the deep learning neural network to produce a raw classification label. More specifically, the model component can feed the image of the cutface to an input layer of the deep learning neural network, the image of the cutface can complete a forward pass through one or more hidden layers of the deep learning neural network, and an output layer of the deep learning neural network can compute or calculate the raw classification label based on activations provided by the one or more hidden layers.

In various aspects, the raw classification label can be a vector whose numerical elements indicate probabilities that respective ones of the structures contained within the lamella are depicted in the image of the cutface. As a non-limiting example, suppose that the lamella is known to contain n distinct structures, for any suitable positive integer n. In such case, the raw classification label can comprise a total of n probabilities that respectively correspond to those n structures. In various instances, a first probability value of the raw classification label can indicate a likelihood that a first structure within the lamella is depicted or illustrated in the image of the cutface (e.g., can indicate a likelihood that the first structure is visible in or on the cutface as currently milled). Similarly, an n-th probability value of the raw classification label can indicate a likelihood that an n-th structure within the lamella is depicted or illustrated in the image of the cutface (e.g., can indicate a likelihood that the n-th structure is visible in or on the cutface as currently milled).

Now, in various aspects, the model component can electronically store, maintain, control, or otherwise access a neighborhood graph that corresponds to the lamella. In various instances, the neighborhood graph can comprise nodes and edges. In various cases, each node of the neighborhood graph can represent a respective one of whatever structures are known to be contained within the lamella. So, if the lamella is known to have a total of n structures, then the neighborhood graph can comprise n nodes: a first node representing the first structure that is known to be within the lamella, to an n-th node that represents the n-th structure that is known to be within the lamella. In various aspects, edges of the neighborhood graph can indicate which structures within the lamella are known to be milling-neighbors of each other. In other words, for any given structure within the lamella, the edges of the neighborhood graph can indicate: which other structures within the lamella can be arrived at or exposed after one iteration of incremental milling (e.g., after the removal of 1 or 2 nm or less of material) is performed when the given structure is known to be visible in or on the cutface of the lamella; and which other structures within the lamella cannot be arrived at or exposed after one iteration of incremental milling is performed when the given structure is known to be visible in or on the cutface of the lamella.

In some instances, this can be considered as a type of one-way physical adjacency. As a non-limiting example, suppose that a structure A and a structure B are located at different depths within the lamella but are nevertheless physically adjacent to each other. In particular, suppose that the structure A is located at lesser depth than the structure B. In such case, the structure B can be considered as a milling-neighbor of the structure A (e.g., since it is possible for one iteration of incremental milling to move the cutface from the structure A downward to the structure B). However, in such case, the structure A cannot necessarily be considered as a milling-neighbor of the structure B (e.g., if the cutface shows the structure B, this can mean that the structure A, which is above or at a lesser depth than the structure B, has already been removed via milling; and so it can be not possible for one iteration of incremental milling to move the cutface from the structure B upward to the structure A).

In some cases, each given node of the neighborhood graph can be coupled by a directed edge to all other nodes in the neighborhood graph, and weights of those directed edges can distinguish neighboring nodes from non-neighboring nodes (e.g., lower weights (close to 0) can indicate non-neighbors, whereas higher weights can indicate neighbors). In some instances, each given node in the neighborhood graph can have a high-weight edge with itself (e.g., a given structure can be thicker than whatever amount of material is removed during a single iteration of incremental milling; thus, the given structure can be considered as being its own milling-neighbor).

As a non-limiting example for purposes of illustration, suppose that the lamella is known to comprise four structures of interest (e.g., n=4): a gate; a gate entrance; a source drain; and a source drain entrance. In various aspects, the neighborhood graph can thus comprise four nodes: a gate node; gate entrance node; a source drain node; and a source drain entrance node.

Now, suppose that it is known that, when the gate entrance is visible in or on the cutface, one iteration of incremental milling can cause the cutface to either stay within the gate entrance or to instead move to the gate. In such case, the neighbors of the gate entrance can include: itself; and the gate. So, the neighborhood graph can include: a high-weight directed edge that links the gate entrance node to itself; another high-weight directed edge that links the gate entrance node to the gate node (e.g., in some cases, this another high-weight directed edge can be less weighty than the recursive edge coupling the gate entrance node to itself); a low-weight directed edge that links the gate entrance node to the source drain node; and another low-weight directed edge that links the gate entrance node to the source drain entrance node.

Similarly, suppose that it is known that, when the gate is visible in or on the cutface, one iteration of incremental milling can cause the cutface to either stay within the gate or to instead move to the source drain entrance. In such case, the neighbors of the gate can include: itself; and the source drain entrance. So, the neighborhood graph can include: a high-weight directed edge that links the gate node to itself; another high-weight directed edge that links the gate node to the source drain entrance node (e.g., in some cases, this another high-weight directed edge can be less weighty than the recursive edge coupling the gate node to itself); a low-weight directed edge that links the gate node to the source drain node; and another low-weight directed edge that links the gate node to the gate entrance node.

Likewise, suppose that it is known that, when the source drain entrance is visible in or on the cutface, one iteration of incremental milling can cause the cutface to either stay within the source drain entrance or to instead move to the source drain. In such case, the neighbors of the source drain entrance can include: itself; and the source drain. So, the neighborhood graph can include: a high-weight directed edge that links the source drain entrance node to itself; another high-weight directed edge that links the source drain entrance node to the source drain node (e.g., in some cases, this another high-weight directed edge can be less weighty than the recursive edge coupling the source drain entrance node to itself); a low-weight directed edge that links the source drain entrance node to the gate node; and another low-weight directed edge that links the source drain entrance node to the gate entrance node.

Lastly, suppose that it is known that, when the source drain is visible in or on the cutface, one iteration of incremental milling can cause the cutface to either stay within the source drain or to instead move to another instantiation of the gate (e.g., semiconductor circuitry often exhibits repeated patterns or layouts of structures). In such case, the neighbors of the source drain can include: itself; and the gate. So, the neighborhood graph can include: a high-weight directed edge that links the source drain node to itself; another high-weight directed edge that links the source drain node to the gate node (e.g., in some cases, this another high-weight directed edge can be less weighty than the recursive edge coupling the source drain node to itself); a low-weight directed edge that links the source drain node to the gate entrance node; and another low-weight directed edge that links the source drain node to the source drain entrance node.

In any case, the neighborhood graph can be considered as indicating which structures within the lamella are known to neighbor or not neighbor each other along the direction or axis of milling. In various aspects, such neighborhood information can be obtained from any suitable design documentation regarding the fabrication or manufacture of the larger specimen from which the lamella was cut (e.g., can be gleaned or derived from a computer-aided design (CAD) file according to which that larger specimen was supposed or expected to be constructed). In various other aspects, such neighborhood information can instead be obtained from whichever lamellas are sacrificed or destroyed to train the deep learning neural network (e.g., during manual annotation of training images captured from sacrificed lamellas, structure/class order along the direction or axis of milling can be noted or recorded).

In various instances, the model component can modify the raw classification label according to the neighborhood graph, thereby yielding a modified classification label. In various cases, such modification can depend upon whichever specific structure within the lamella was known or predicted to be visible in or on the cutface prior to the most recent round or iteration of incremental milling. In other words, such modification can depend upon whichever specific structure within the lamella was indicated by a previous or prior modified classification label as being visible in or on the cutface. Note that, if no previous or prior modified classification label is available (e.g., as can be the case on the very first round or iteration of incremental milling), then the modification can depend upon whichever specific structure within the lamella was indicated by one or more previous or prior raw classification labels as being visible in or on the cutface. In any case, the model component can identify that previously-visible structure (e.g., by reading or recalling a prior modified classification label for the cutface, or by reading or recalling one or more prior raw classification labels if there is no prior modified classification label for the cutface), and the neighborhood graph can indicate the neighbors and non-neighbors of that previously-visible structure along the direction of milling. In various aspects, the model component can modify the raw classification label by multiplying its probability values by respective weights of the neighbor edges and the non-neighbor edges of the previously-visible structure and by normalizing those resulting products into new probability values.

As a non-limiting example, suppose again that the lamella contains a gate, a gate entrance, a source drain, and a source drain entrance, as described above. Moreover, suppose that the raw classification label is $\text{label}_{raw}$=[0.05; 0.20; 0.35; 0.40], which can indicate a source drain entrance probability of 5%, a source drain probability of 20%, a gate entrance probability of 35%, and a gate probability of 40%. Furthermore, suppose that each node in the neighborhood graph has an edge weight of 100 with itself, an edge weight of 50 with each of its neighbors, and an edge weight of 0.1 with each of its non-neighbors.

Now, suppose that the previously-visible structure was the source drain. In such case, the model component can modify the raw classification label by multiplication and normalization as follows. The raw source drain entrance probability can be multiplied by the weight of whatever edge in the neighborhood graph is directed from the source drain node to the source drain entrance node, thereby yielding a first multiplicative product: 0.05*0.1=0.005. The raw source drain probability can be multiplied by the weight of whatever edge in the neighborhood graph is directed from the source drain node to itself, thereby yielding a second multiplicative product: 0.2*100=20. The raw gate entrance probability can be multiplied by the weight of whatever edge in the neighborhood graph is directed from the source drain node to the gate entrance node, thereby yielding a third multiplicative product: 0.35*50=17.5. The raw gate probability can be multiplied by the weight of whatever edge in the neighborhood graph is directed from the source drain node to the gate node, thereby yielding a fourth multiplicative product: 0.40*0.1=0.04. In various cases, those multiplicative products can be normalized by dividing each by the sum of all four:

$$0.005+20+17.5+0.04=37.545;\ \frac{0.005}{37.545}\approx 0;$$
$$\frac{20}{37.545}\approx 0.53;\ \frac{17.5}{37.545}\approx 0.47;\ \frac{0.004}{37.545}\approx 0.$$

Accordingly, the modified classification label can be as follows: $\text{label}_{modified}$=[0; 0.53; 0.47; 0], which can indicate a modified source drain entrance probability of 0%, a modified source drain probability of 53%, a modified gate entrance probability of 47%, and a modified gate probability of 0%. In other words, in this example where the previously-visible structure was the source drain, the raw classification label can be considered as mistakenly indicating that the gate is now visible in or on the cutface, whereas the modified classification label can instead be considered as more reliably indicating that the source drain is still visible in or on the cutface (although the relatively high modified probability value for the gate entrance can be considered as indicating that the gate entrance might soon be revealed in the next milling iteration or two).

Instead, suppose that the previously-visible structure was the gate entrance, rather than the source drain. In such case, the model component can modify the raw classification label by multiplication and normalization as follows. The raw source drain entrance probability can be multiplied by the weight of whatever edge in the neighborhood graph is directed from the gate entrance node to the source drain entrance node, thereby yielding a first multiplicative product: 0.05*0.1=0.005. The raw source drain probability can be multiplied by the weight of whatever edge in the neighborhood graph is directed from the gate entrance node to the source drain node, thereby yielding a second multiplicative product: 0.2*0.1=0.02. The raw gate entrance probability can be multiplied by the weight of whatever edge in the neighborhood graph is directed from the gate entrance node to itself, thereby yielding a third multiplicative product: 0.35*100=35 The raw gate probability can be multiplied by the weight of whatever edge in the neighborhood graph is directed from the gate entrance node to the gate node, thereby yielding a fourth multiplicative product: 0.40*50=20. In various cases, those multiplicative products can be normalized by dividing each by the sum of all four:

$$0.005+0.02+35+20=55.025;\ \frac{0.005}{55.025}\approx 0;$$
$$\frac{0.02}{55.025}\approx 0;\ \frac{35}{55.025}\approx 0.64;\ \frac{20}{55.025}\approx 0.36.$$

Accordingly, the modified classification label can be as follows: $\text{label}_{modified}$=[0; 0; 0.64; 36], which can indicate a modified source drain entrance probability of 0%, a modified source drain probability of 0%, a modified gate entrance probability of 64%, and a modified gate probability of 36%. In other words, in this example where the previously-visible structure was the gate entrance, the raw classification label can be considered as prematurely indicating that the gate is now visible in or on the cutface, whereas the modified classification label can instead be considered as more reliably or safely indicating that the gate entrance is still visible in or on the cutface (and the sizable modified probability value for the gate can be considered as indicating that the gate might soon be revealed in the following several milling iterations).

By modifying the raw classification label in this way according to the neighborhood graph, the model component can be considered as helping to boost or otherwise improve the classification performance of the deep learning neural network. In other words, the neighborhood graph can be considered as capturing or encompassing known a priori structural information about the lamella (e.g., as indicating which structures of the lamella are milling-neighbors of each other), and the model component can be considered as leveraging such known a priori structural information to reduce the possibility of false positive classifications or false negative classifications from the deep learning neural network. In still other words, modification of the raw classification label with the neighborhood graph as described herein can be considered as a type of sanity enforcement mechanism on the deep learning neural network where predicted probability values are enhanced for neighbors and are diminished for non-neighbors. Accordingly, the chances of mistakenly determining that a single iteration or round of incremental milling has caused the cutface to move to a non-neighboring structure can be greatly reduced, as can the chances of prematurely determining that a single iteration or round of incremental milling has caused the cutface to move to a neighboring structure.

In any case, the modified classification label can be considered as indicating probabilities that respective ones of the structures of the lamella are visible in or on the cutface. Because of the weighting/modification described herein, the modified classification label can be considered as more reliable, confident, or sane than the raw classification label.

Now, in various embodiments, the milling component of the computerized tool can electronically identify a target structure that is desired to be isolated within the lamella. In some cases, the target structure can be selected or chosen by any suitable user-input (e.g., a technician associated with the scientific instrument can use a keyboard or touchscreen to indicate or identify the target structure). In various aspects, the milling component can determine whether or not the target structure is indicated by (e.g., has the highest modified probability value in) the modified classification label.

If not, the milling component can conclude that the target structure is not yet visible in or on the cutface of the lamella. Accordingly, the milling component can electronically instruct or command the scientific instrument to perform another round or iteration of incremental milling, and whatever structure is indicated by the modified classification label can be considered or treated as the previously-visible structure during the classification that follows such another round or iteration of incremental milling. That is, such another round or iteration of milling can cause the cutface to move a little bit deeper into the lamella, the scientific instrument can capture a new image of the cutface, the deep learning neural network can generate a new raw classification label for that new image, and that new raw classification label can be modified via the neighborhood graph (by treating whatever structure is indicated by the modified classification label as being the previously-visible structure), thereby yielding a new modified classification label.

Instead, if the milling component determines that the target structure is indicated by the modified classification label, the milling component can conclude that the target structure is now visible in or on the cutface of the lamella and that end-pointing is thus complete with respect to at least one side of the lamella. If appropriate, the above-described end-pointing procedure can be repeated from a reverse side of the lamella. Once the target structure is visible in or on both sides of the lamella (e.g., both a front and rear of the lamella), the target structure can be considered as now being physically isolated in the lamella (e.g., the remaining structures can be considered as having been removed via milling and thus are no longer in the lamella). Once the target structure is physically isolated, the computerized tool can facilitate or initiate any other suitable analysis for the isolated target structure (e.g., can schedule or slate the isolated target structure for transmission electron microscopy analysis, or can otherwise cause such transmission electron microscopy analysis to be performed on the isolated target structure).

To help cause the classification labels described herein to be accurate, the deep learning neural network can first undergo training. In various aspects, the computerized tool described herein can facilitate such training in any suitable fashion (e.g., in supervised fashion) based on any suitable training dataset. However, note that the deep learning neural network can undergo far less training than would otherwise be required for the deep learning neural network to achieve satisfactory accuracy, due to the herein-described implementation of the neighborhood graph. In other words, the neighborhood graph can be considered as helping to rectify false positives and false negatives produced by the deep learning neural network, and so it need not be attempted to prevent the deep learning neural network from producing those false positives or false negatives via training on an extensive training dataset. In still other words, when the neighborhood graph is implemented as described herein, hundreds or thousands of lamellas need not be sacrificed in order to adequately train the deep learning neural network.

Various embodiments described herein can be employed to use hardware or software to solve problems that are highly technical in nature (e.g., to facilitate lamella end-pointing via graph-weighted neural networks), that are not abstract and that cannot be performed as a set of mental acts by a human. Further, some of the processes performed can be performed by a specialized computer (e.g., dual beam microscopes) for carrying out defined acts related to lamella end-pointing.

For example, such defined acts can include: accessing, by a device operatively coupled to a processor, an image captured by a scientific instrument, wherein the image can depict a cutface of a lamella; generating, by the device and via execution of a graph-weighted neural network, a classification label for the cutface, wherein the classification label can indicate to which one of a plurality of defined classes the cutface belongs; and instructing, by the device and in response to the classification label indicating that the cutface does not belong to a target class of the plurality of defined classes, the scientific instrument to incrementally mill the cutface of the lamella. In various aspects, the graph-weighted neural network can comprise a deep learning neural network and a class neighborhood graph, wherein nodes of the class neighborhood graph can represent respective ones of the plurality of defined classes, and wherein weighted edges of the class neighborhood graph can indicate which of the plurality of defined classes do and do not physically neighbor one another within the lamella along a direction of milling. In various instances, the deep learning neural network can receive the image or a portion thereof as input and can produce a raw classification label as output, the raw classification label can indicate raw probabilities that the cutface belongs to respective ones of the plurality of defined classes, the device can multiply the raw probabilities by respective weighted edges indicated in the class neighborhood graph and can normalize resulting products, thereby yielding modified probabilities, and the modified probabilities can collectively form the classification label.

Such defined acts are inherently computerized. Indeed, a scientific instrument, such as a dual beam microscope, is a highly-technical computerized device comprising specific computerized hardware (e.g., temperature sensors, pressure sensors, voltage sensors, ion beam emitters, electron beam emitters, focusing lenses, mass analyzers, ion detectors, beam apertures, fluid valves). A scientific instrument and the operations that it performs cannot be implemented by the human mind, or by a human with pen and paper, in any reasonable or practicable way without computers. Furthermore, an image (e.g., electron tomography image, X-ray tomography image, confocal microscopy image) captured by a scientific instrument is an array of pixels or voxels that collectively depict or illustrate an analytical specimen or a portion thereof. Such an image cannot be generated or captured by the human mind, or by a human with pen and paper, in any reasonable or practicable way without computers. Further still, lamella end-pointing is a specific type of laboratory task that involves physically milling one or both sides of a lamella of an analytical specimen, so that the lamella contains only a desired or target structure. It should certainly go without saying that neither the human mind nor a human with mere pen and paper can physically mill the front and rear sides of a lamella. In other words, it makes no sense whatsoever to discuss the physical task of lamella end-pointing outside of a computerized hardware and software context.

Moreover, various embodiments described herein can integrate into a practical application various teachings relating to lamella end-pointing via graph-weighted neural networks. As explained above, lamella end-pointing can be considered as an iterative slice-and-image procedure in which a lamella is incrementally milled, an image of a cutface of the lamella is captured, and an artificial neural network is executed on the image to determine whether or not a target or desired structure is visible in or on the cutface. If so, end-pointing can be considered as complete (at least with respect to one side of the lamella). If not, such milling, imaging, and classification can be repeated. In order for this process to work correctly, the artificial neural network should first be trained. Unfortunately, such training is where existing techniques suffer. In particular, some existing techniques train the artificial neural network on very voluminous training data. Although this can cause the artificial neural network to achieve high classification accuracy, collecting such voluminous training data can require the sacrifice or destruction of hundreds or thousands of lamellas, which can be considered as excessively wasteful. Other existing techniques train the artificial neural network on very little training data. Although such little training data can be obtained by the sacrifice or destruction of just a few lamellas, such limited training often causes the artificial neural network to achieve unsatisfactory or insufficient classification accuracy (e.g., such little training makes the artificial neural network prone to false positives or false negatives). Thus, existing techniques can be considered as disadvantageous.

Various embodiments described herein can help to ameliorate one or more of these technical problems. In particular, various embodiments described herein can facilitate lamella end-pointing via a graph-weighted neural network. More specifically, when given a lamella, the specific structures that are contained within the lamella and their expected locations along a milling direction within the lamella can be known a priori (e.g., the given lamella can be extracted from a larger specimen that was fabricated according to a given CAD schematic or geometry). Accordingly, when the given lamella is milled, the structures within the lamella can be expected to be exposed, uncovered, or revealed in some specific order that is known a priori (e.g., structure A before but not after structure B; structure C after but not before structure D). In various aspects, this a priori knowledge can be represented in a neighborhood graph, where nodes of the neighborhood graph represent respective structures within the given lamella, and where weighted and directed edges of the neighborhood graph represent which structures are or are not milling-neighbors of each other. In various aspects, an image of the cutface of the given lamella can be captured, and an artificial neural network can be executed on that image or a portion thereof, thereby yielding a raw classification label that indicates probabilities of respective structures of the lamella being visible in the image and thus in or on the cutface. In various instances, the raw classification label can be modified (e.g., via multiplication and normalization) by respective weights that are indicated in the neighborhood graph. As described herein, the present inventors experimentally verified that this can yield a modified classification label that is less likely to contain false positives or false negatives. In other words, the classification accuracy of the artificial neural network can be increased, by leveraging the a priori structural knowledge of the lamella that is captured by the neighborhood graph. Thus, a satisfactory or sufficient level of classification accuracy can be obtained, without having to sacrifice or destroy many lamellas. Indeed, various experiments conducted by the present inventors showed that satisfactory or sufficient classification accuracy was able to be obtained by sacrificing only six lamellas. Thus, various embodiments described herein can be considered as addressing or ameliorating various technical problems or disadvantages that plague existing techniques. For at least these reasons, various embodiments described herein can be considered as a concrete and tangible technical improvement in the field of lamella end-pointing. Accordingly, various embodiments described herein certainly qualify as useful and practical applications of computers.

Furthermore, various embodiments described herein can control real-world tangible devices based on the disclosed teachings. For example, various embodiments described herein can electronically activate, deactivate, or otherwise actuate real-world hardware (e.g., ion beam emitters, ion focusing lenses, carrier fluid valves/pumps) of real-world scientific instruments (e.g., dual beam microscopes), perform real-world analyses on real-world data captured by those real-world scientific instruments (e.g., generate classification labels for images captured by scientific instruments), and can electronically initiate real-world actions based on the results of such real-world analyses (e.g., can incrementally mill a lamella based on the classification label generated for a cutface of that lamella).

FIG. 1 illustrates an example, non-limiting block diagram of a scientific instrument module 102 in accordance with various embodiments described herein.

In various embodiments, the scientific instrument module 102 can be implemented by circuitry (e.g., including electrical or optical components), such as a programmed computing device. Logic of the scientific instrument module 102 can be included in a single computing device or can be distributed across multiple computing devices that are in communication with each other as appropriate. Examples of computing devices that may, singly or in combination, implement the scientific instrument module 102 are discussed herein with reference to FIGS. 22 and 24, and examples of systems or networks of interconnected computing devices, in which the scientific instrument module 102 may be implemented across one or more of the computing devices, are discussed herein with reference to FIGS. 23 and 25.

The scientific instrument module 102 can include first logic 104, second logic 106, and third logic 108. As used herein, the term "logic" can include an apparatus that is to perform a set of operations associated with the logic. For example, any of the logic elements included in the scientific instrument module 102 can be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" can refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module can omit one or more of the logic elements depicted in the associated drawings; for example, a module may include a subset of the logic elements depicted in the associated drawings when that module is to perform a subset of the operations discussed herein with reference to that module.

In various embodiments, there can be a scientific instrument corresponding to the scientific instrument module 102. In various aspects, the scientific instrument can be any suitable computerized device that can electronically measure some scientifically-relevant, clinically-relevant, or research-relevant characteristic, property, or attribute of an analytical specimen (e.g., of a known or unknown mixture, compound, or collection of matter). As a non-limiting example, a scientific instrument can be a mass spectrometer that is operatively coupled to a gas chromatograph or a liquid chromatograph. In such case, the scientific instrument can measure or determine ion spectra (e.g., relative ion abundance as a function of mass-to-charge ratio) of the analytical specimen. As another non-limiting example, a scientific instrument can be a scanning electron microscope. In such case, the scientific instrument can measure or determine a surface topography of the analytical specimen. As yet another non-limiting example, a scientific instrument can be a transmission electron microscope. In such case, the scientific instrument can measure or determine internal structural details of the analytical specimen. As a more general non-limiting example, a scientific instrument can be any suitable type of charged-particle microscope (e.g., some types of microscopes can use beams of non-electron ions to capture images).

In some situations, the scientific instrument can be able to perform both imaging and milling of a lamella that is cut or extracted from an analytical specimen. As a non-limiting example, the scientific instrument can be a dual beam microscope that is equipped with both an ion beam emitter and an electron beam emitter. In such case, the ion beam emitter can facilitate milling (e.g., material removal) of the lamella at various voltage, current, or power levels, and the electron beam emitter can (in conjunction with electron detectors and optical lenses) facilitate imaging of the lamella.

In various embodiments, the first logic 104 can access an image that is captured or otherwise generated by the scientific instrument. In various aspects, the image can be any suitable pixel array or voxel array that depicts or illustrates a cutface (e.g., a milling site) of a lamella.

In various embodiments, the second logic 106 can generate, via execution of a graph-weighted neural network, a classification label for the cutface, where the classification label can indicate to which one of a plurality of defined classes the cutface belongs. More specifically, the plurality of defined classes can respectively represent a plurality of structures that are known to be contained somewhere within or inside of the lamella, and so the classification label can indicate probabilities that respective ones of the plurality of structures are visible in or on the cutface of the lamella. In various aspects, the graph-weighted neural network can comprise a deep learning neural network and a class neighborhood graph. In various instances, the deep learning neural network can be configured as an image classifier. Accordingly, the logic 106 can involve feeding the image (or any suitable portion thereof) as input to the deep learning neural network, thereby causing the deep learning neural network to produce a raw classification label as output. In various cases, the class neighborhood graph can comprise nodes and edges. In various aspects, the nodes can represent respective classes and thus respective structures of the lamella. In various instances, the edges can represent or indicate which nodes, and thus which structures of the lamella, are or are not milling-neighbors of each other. In various cases, the logic 106 can involve modifying, via multiplication and normalization, the raw classification label with respective weights indicated in the class neighborhood graph, thereby converting the raw classification label into the classification label. As explained herein, such modification based on the class neighborhood graph can be considered as leveraging a priori knowledge of the lamella so as to boost or augment the classification accuracy of the deep learning neural network.

In various embodiments, the third logic 108 can, in response to the classification label indicating that the cutface does not belong to a target class of the plurality of defined classes (e.g., in response to determination that a target structure is not yet visible in or on the cutface of the lamella), instruct the scientific instrument to incrementally mill the cutface of the lamella.

In various aspects, the imaging, graph-weighted classification, and milling operations encompassed by the first logic 104, the second logic 106, and the third logic 108 can be repeated until the most recent classification label indicates that the cutface belongs to the target class (e.g., indicates that the target structure is now visible in or on the cutface of the lamella). At such time, end-pointing of the lamella can be considered as complete, at least with respect to one side of the lamella. If appropriate, such procedure can be repeated for an opposing or reverse side of the lamella, thereby causing the target structure to become physically isolated (e.g., thereby removing enough material from the lamella such that only the target structure remains within the lamella).

Accordingly, the scientific instrument module 102 can facilitate lamella end-pointing via graph-weighted neural networks.

Figure 2:
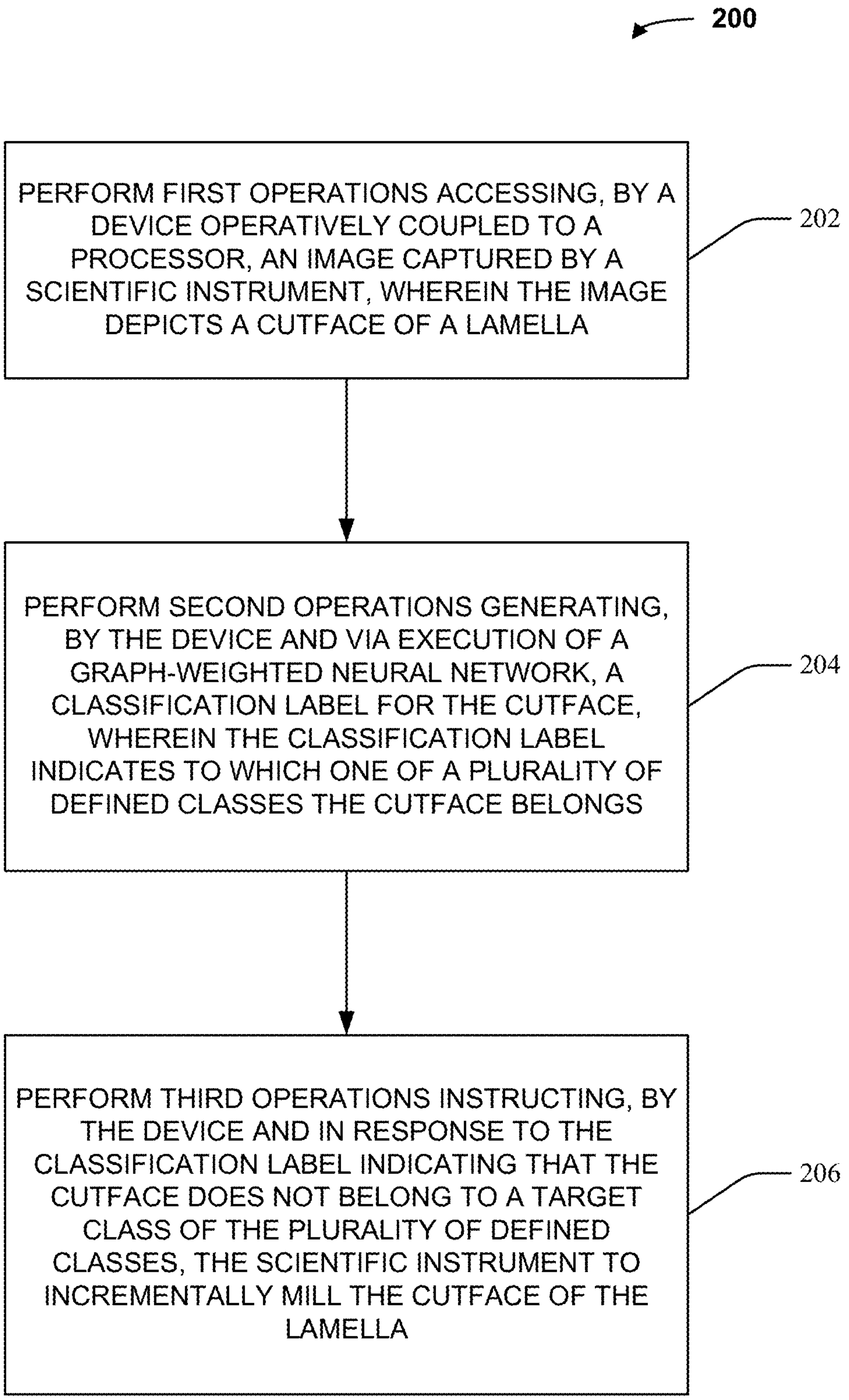
FIG. 2 illustrates an example, non-limiting flow diagram of a computer-implemented method in accordance with various embodiments described herein.

FIG. 2 is an example, non-limiting flow diagram of a computer-implemented method 200 in accordance with various embodiments described herein. The operations of the computer-implemented method 200 may be used in any suitable context to perform any suitable operations (e.g., can be performed by or used in conjunction with any of the various modules, computing devices, or graphical user interfaces described with respect to of FIGS. 1, 21, 22, 23, 24, and 25). Operations are illustrated once each and in a particular order in FIG. 2, but the operations may be reordered or repeated as desired and appropriate (e.g., different operations performed may be performed in parallel, as suitable).

In various aspects, act 202 can include accessing, by a device operatively coupled to a processor, an image captured by a scientific instrument, wherein the image can depict a cutface of a lamella. In various cases, the first logic 104 can perform or otherwise facilitate act 202.

In various instances, act 204 can include performing second operations generating, by the device and via execution of a graph-weighted neural network, a classification label for the cutface, wherein the classification label can indicate to which one of a plurality of defined classes the cutface belongs. In various cases, the second logic 106 can perform or otherwise facilitate act 204.

In various aspects, act 206 can include instructing, by the device and in response to the classification label indicating that the cutface does not belong to a target class of the plurality of defined classes, the scientific instrument to incrementally mill the cutface of the lamella. In various cases, the third logic 108 can perform or otherwise facilitate act 206.

Accordingly, the computer-implemented method 200 can facilitate lamella end-pointing via graph-weighted neural networks.

Figure 3:
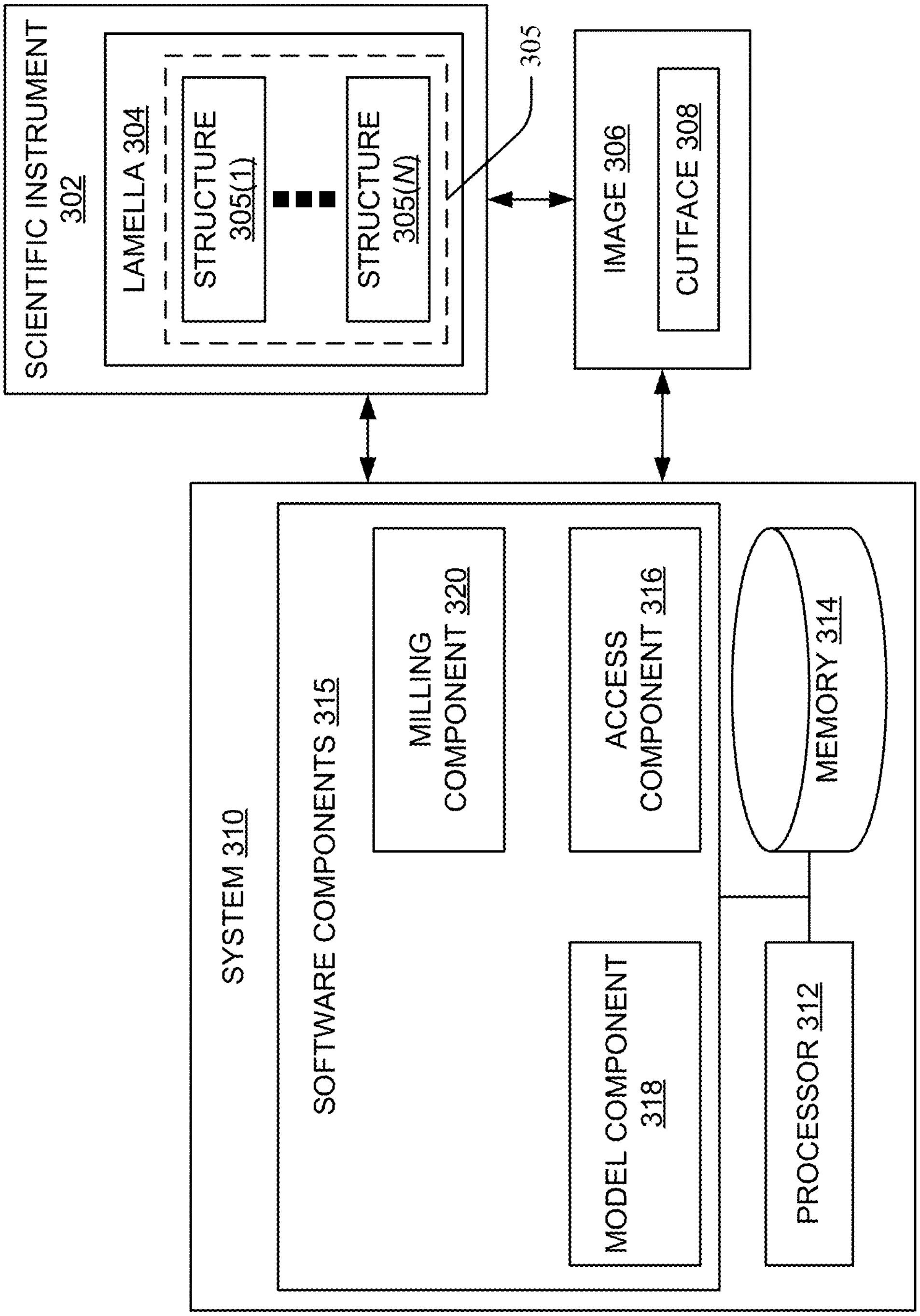
FIG. 3 illustrates a block diagram of an example, non-limiting system that facilitates lamella end-pointing via graph-weighted neural networks in accordance with one or more embodiments described herein.

FIG. 3 illustrates a block diagram of an example, non-limiting system that can facilitate lamella end-pointing via graph-weighted neural networks in accordance with one or more embodiments described herein.

In various embodiments, there can be a scientific instrument 302. In various aspects, the scientific instrument 302 can be as described above. That is, the scientific instrument 302 can be any suitable computerized device that can electronically measure any suitable scientifically-relevant, clinically-relevant, or research-relevant characteristic, attribute, or property of any suitable analytical specimen. In particular, the scientific instrument 302 can be any suitable computerized device that can leverage its constituent hardware (e.g., electron sources, anodes, condenser lenses, condenser apertures, scan coils, objective lenses, objective apertures, deflectors, condensers, stigmators, electron detectors, X-ray detectors, actuatable specimen stages) to facilitate both imaging and milling of a lamella 304. As a non-limiting example, the scientific instrument 302 can be a dual beam charged-particle microscope.

In various aspects, the lamella 304 can be cut or otherwise extracted from any suitable analytical specimen. In various instances, the lamella 304 can be any suitable rectangular plate, layer, or slice of that analytical specimen, such that a thickness of the lamella 304 can be one or more multiples or orders of magnitude smaller than its length and width. As a non-limiting example, the thickness of the lamella 304 can range from 50 nm to 130 nm, whereas the length and width of the lamella 304 can instead each measure on the order of microns. In any case, the lamella 304 can physically contain a plurality of structures 305. In various aspects, the plurality of structures 305 can comprise n structures, for any suitable positive integer n: a structure 305(1) to a structure **305(*n*). In various instances, each of the plurality of structures 305 can be any suitable designed or fabricated structure that can have been manufactured in or on the analytical specimen according to any suitable photolithography techniques. As some non-limiting examples, any of the plurality of structures 305 can be: a transistor gate; an entrance region or exit region of a transistor gate; a transistor source drain; an entrance region or exit region of a transistor source drain; a transistor fin; an entrance region or exit region of a transistor fin; any other suitable microelectromechanical circuitry component; or an entrance region, an exit region, or any other suitable region of any other suitable microelectromechanical circuitry component. In various cases, the process or procedure of lamella end-pointing can be considered as a first task taken so as to check whether or not any or all of the plurality of structures 305** were properly or correctly fabricated.

In various aspects, the scientific instrument 302 can electronically capture or generate an image 306 with respect to the lamella 304. In some instances, the image 306 can be a two-dimensional array of pixels. In other instances, the image 306 can instead be a three-dimensional array of voxels. In any case, the image 306 can visually depict or illustrate a cutface 308 of the lamella 304. In various aspects, the cutface 308 can be a surface of the lamella 304 on which the scientific instrument 302 has performed a milling operation. In other words, the cutface 308 can be a surface of the lamella 304 from which the scientific instrument 302 has removed material (e.g., via emission of a high-voltage or low-voltage ion beam).

As a non-limiting example, suppose that the length, width, and thickness of the lamella 304 extend along an x-axis, a y-axis, and a z-axis of Cartesian three-space, respectively. In such case, assuming that milling is performed in a negative z-direction (e.g., in a top-down direction), the cutface 308 can be considered as being a top-most surface of the lamella 304, which top-most surface can be parallel to the x-y plane. Equivalently, if milling is instead performed in a positive z-direction (e.g., in a bottom-up direction), the cutface 308 can be considered as being a bottom-most surface of the lamella 304, which bottom-most surface can be parallel to the x-y plane. In any case, the cutface 308 can be considered as a plane or surface of the lamella 304 from which material is removed via milling, such that such plane or surface can be substantially parallel to the x-y plane and can be located at some depth along the z-axis. Note that each progressive or successive round or iteration of milling can be considered as causing the cutface 308 to move to some new depth along the z-axis. For instance, if milling is performed in a negative z-direction (e.g., in a top-down direction), the cutface 308 can begin as the upper-most or top-most surface of the lamella 304 and can move to a lower depth or position along the z-axis with each round of milling. As another instance, if milling is performed in a positive z-direction (e.g., in a bottom-up direction), the cutface 308 can begin as the bottom-most or lower-most surface of the lamella 304 and can move to a higher depth or position along the z-axis with each round of milling. In any case, the cutface 308 can be whichever surface of the lamella 304 from which the scientific instrument 302 removes material via milling. Accordingly, the cutface 308 can be considered as an internal cross-section of the lamella 304 that is revealed, uncovered, or exposed via milling.

In various instances, a system 310 can be electronically integrated (e.g., via any suitable wired or wireless electronic connections) with the scientific instrument 302 or with the image 306. In various cases, it can be desired to mill the lamella 304 until a specific one of the plurality of structures 305 is visible in or on the cutface 308. Indeed, it can be desired to perform such milling from both a top-side and a bottom-side of the lamella 304, so as to cause that specific one of the plurality of structures 305 to become physically isolated in the lamella 304. As described herein, the system 310 can help to achieve this objective.

In various aspects, the system 310 can comprise a processor 312 (e.g., computer processing unit, microprocessor)

and a non-transitory computer-readable memory 314 that is operably or operatively or communicatively connected or coupled to the processor 312. The non-transitory computer-readable memory 314 can store computer-executable instructions which, upon execution by the processor 312, can cause the processor 312 or other components of the system 310 (e.g., access component 316, model component 318, milling component 320) to perform one or more acts. In various embodiments, the non-transitory computer-readable memory 314 can store computer-executable components (e.g., access component 316, model component 318, milling component 320), and the processor 312 can execute the computer-executable components.

In various embodiments, the system 310 can comprise an access component 316. In various aspects, the access component 316 can electronically access the scientific instrument 302. That is, the access component 316 can electronically communicate or otherwise electronically interact with (e.g., transmit electronic instructions or commands to, receive electronic data from) the scientific instrument 302. Accordingly, the access component 316 can be considered as a proxy or conduit through which other components of the system 310 can interact with, communicate with, or otherwise manipulate the scientific instrument 302. In various instances, the access component 316 can electronically access the image 306. That is, the access component 316 can electronically receive, electronically retrieve, or otherwise electronically obtain the image 306, from any suitable electronic source or database (not shown). As a non-limiting example, the access component 316 can electronically receive, retrieve, or otherwise obtain the image 306 from the scientific instrument 302. In any case, the access component 316 can be considered as a proxy or conduit through which other components of the system 310 can interact with or otherwise manipulate the image 306. However, these are mere non-limiting examples. In other cases, the access component 316 can be omitted, and any other components of the system 310 can communicate or interact directly with the scientific instrument 302 or with the image 306.

In various embodiments, the system 310 can comprise a model component 318. In various aspects, the model component 318 can, as described herein, generate a classification label for the cutface 308, by executing a graph-weighted neural network on the image 306. In various instances, the classification label can indicate probabilities that respective ones of the plurality of structures 305 are visible in or on the cutface 308.

In various embodiments, the system 310 can comprise a milling component 320. In various cases, the milling component 320 can, as described herein, instruct the scientific instrument 302 to perform additional or incremental milling on the lamella 304, in response to the classification label indicating that a target or desired one of the plurality of structures 305 is not yet visible in or on the cutface 308.

Note that, in various instances, the access component 316, the model component 318, and the milling component 320 can collectively be considered as being one or more software components 315 of the system 310. In various aspects, it should be appreciated that the one or more software components 315 are described primarily herein as comprising three components (e.g., the access component 316, the model component 318, and the milling component 320) for ease of explanation and illustration. However, the one or more software components 315 are not limited to being implemented as exactly such three components in every embodiment. Indeed, in some embodiments, the functionalities described herein of such three components can be combined in any suitable fashions, so as to be implemented in or by fewer than three components (e.g., in some cases, a single component can perform all of the functionalities that are described herein with respect to the access component 316, the model component 318, and the milling component 320). In other embodiments, the functionalities described herein of such three components can instead be distributed, separated, split, or fragmented in any suitable fashions, so as to be implemented in or by more than three components (e.g., two or more components can facilitate the functionalities that are performable by the access component 316; two or more components can facilitate the functionalities that are performable by the model component 318; two or more components can facilitate the functionalities that are performable by the milling component 320).

Figure 4:
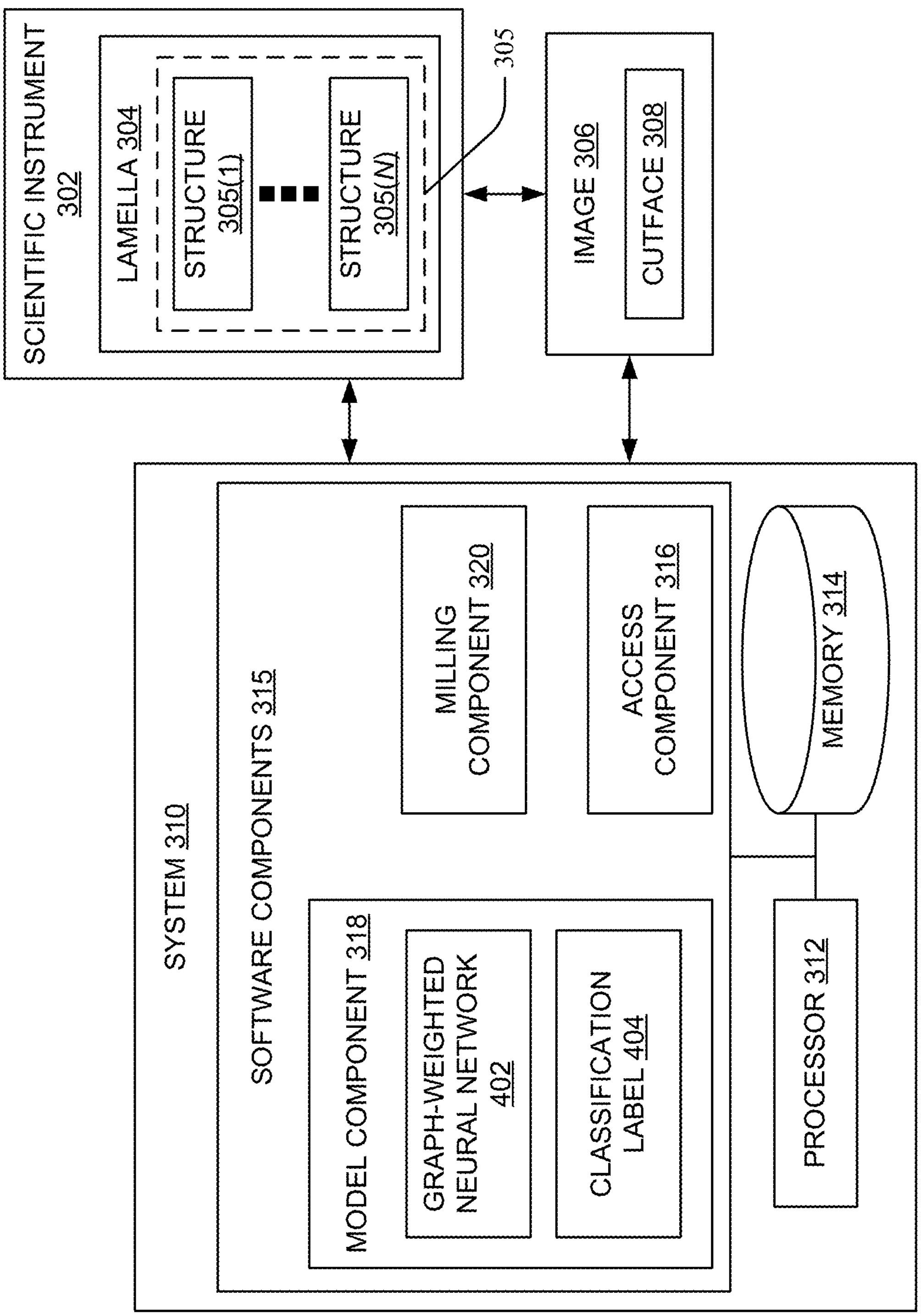
FIG. 4 illustrates a block diagram of an example, non-limiting system including a graph-weighted neural network and a classification label that facilitates lamella end-pointing via graph-weighted neural networks in accordance with one or more embodiments described herein.

FIG. 4 illustrates a block diagram of an example, non-limiting system including a graph-weighted neural network and a classification label that can facilitate lamella end-pointing via graph-weighted neural networks in accordance with one or more embodiments described herein.

In various embodiments, the model component 318 can electronically store, electronically maintain, electronically control, or otherwise electronically access a graph-weighted neural network 402. In various aspects, the model component 318 can electronically execute the graph-weighted neural network 402 on the image 306 (or on a portion thereof). In various instances, such execution can cause the graph-weighted neural network 402 to produce a classification label 404. Non-limiting aspects are described with respect to FIGS. 5-9.

FIGS. 5-9 illustrate example, non-limiting block diagrams showing how the graph-weighted neural network 402 can be used to generate the classification label 404 in accordance with one or more embodiments described herein.

Figure 5:
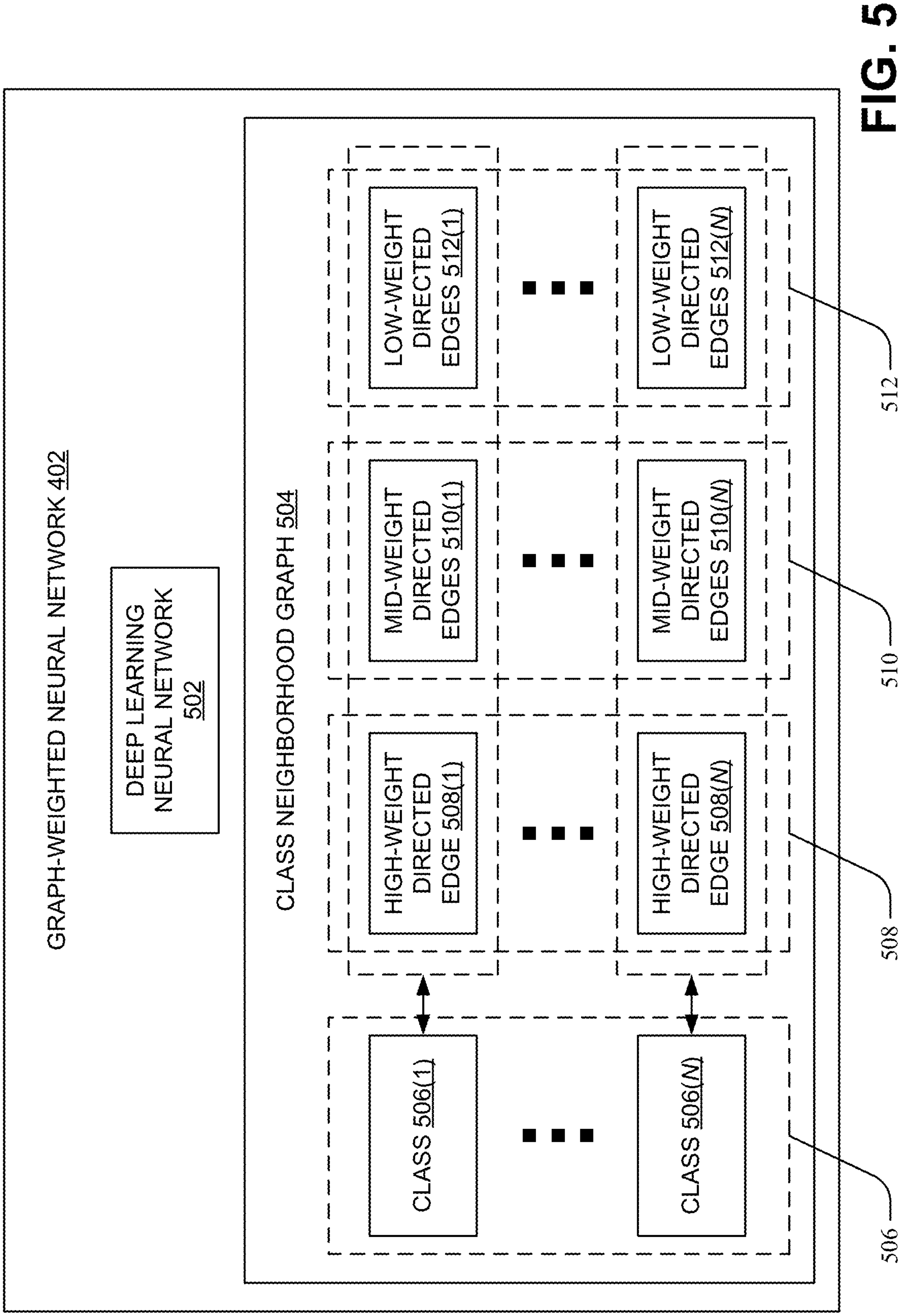

First, consider FIG. 5. In various aspects, the graph-weighted neural network 402 can comprise a deep learning neural network 502 and a class neighborhood graph 504.

In various instances, the deep learning neural network 502 can have or otherwise exhibit any suitable deep learning internal architecture. For instance, the deep learning neural network 502 can have an input layer, one or more hidden layers, and an output layer. In various instances, any of such layers can be coupled together by any suitable interneuron connections or interlayer connections, such as forward connections, skip connections, or recurrent connections. Furthermore, in various cases, any of such layers can be any suitable types of neural network layers having any suitable learnable or trainable internal parameters. For example, any of such input layer, one or more hidden layers, or output layer can be convolutional layers, whose learnable or trainable parameters can be convolutional kernels. As another example, any of such input layer, one or more hidden layers, or output layer can be dense layers, whose learnable or trainable parameters can be weight matrices or bias values. As still another example, any of such input layer, one or more hidden layers, or output layer can be batch normalization layers, whose learnable or trainable parameters can be shift factors or scale factors. As even another example, any of such input layer, one or more hidden layers, or output layer can be LSTM layers, whose learnable or trainable parameters can be input-state weight matrices or hidden-state weight matrices. Further still, in various cases, any of such layers can be any suitable types of neural network layers having any suitable fixed or non-trainable internal parameters. For example, any of such input layer, one or more hidden layers, or output layer can be non-linearity layers, padding layers, pooling layers, or concatenation layers. Regardless of its specific internal architecture, the deep learning neural network 502 can be configured as an image classifier.

In various aspects, the class neighborhood graph 504 can be a graph data structure comprising nodes and edges. In various instances, the nodes of the class neighborhood graph 504 can respectively represent a plurality of classes 506. In various cases, the plurality of classes 506 can respectively correspond to the plurality of structures 305. Thus, since the plurality of structures 305 can comprise n structures, the plurality of classes 506 can comprise n classes: a class 506(1) to a class 506(*n*). In various aspects, each of the plurality of classes 506 can be considered as a defined classification category indicating or representing a respective one of the plurality of structures 305. As a non-limiting example, the class 506(1) can correspond to, and thus represent, the structure 305(1). That is, the class neighborhood graph 504 can comprise a first node that represents the class 506(1) and thus the structure 305(1). As another non-limiting example, the class 506(*n*) can correspond to, and thus represent, the structure 305(*n*). So, the class neighborhood graph 504 can comprise an n-th node that represents the class 506(*n*) and thus the structure 305(*n*).

Now, as mentioned above, each of the plurality of structures 305 can be physically located somewhere within or inside the lamella 304. In various aspects, it can be known a priori how the plurality of structures 305 are physically ordered or arranged (or, at least, how they are supposed or expected to be physically ordered or arranged) within or inside the lamella 304 along whatever axis or direction that milling is performed by the scientific instrument 302. Indeed, as mentioned above, the lamella 304 can be cut or extracted from an analytical specimen, and that analytical specimen can have been manufactured or fabricated (e.g., via photolithography) according to any suitable engineering design. In some cases, such engineering design can be represented or conveyed by a three-dimensional CAD illustration or model of the analytical specimen. In any case, it can be known which of the plurality of structures 305 are expected to be adjacent to each other or are expected to not be adjacent to each along the direction or axis of milling. In other words, if one round or iteration of incremental milling (e.g., removal of 1 or 2 nm or less of material) were to be performed starting from any given one of the plurality of structures 305, it can be known which others of the plurality of structures 305 such round or iteration of incremental milling could and could not uncover, reveal, or expose. For ease of explanation, if it is possible for one round or iteration of incremental milling that begins at a first structure to reveal, expose, or uncover a second structure, then that second structure can be referred to as a milling-neighbor of the first structure (e.g., the first and second structures can be separated from each other in the direction of milling by an amount of material that is thin enough so as to be traversable or removable by a single round or iteration of incremental milling). In contrast, if one round or iteration of incremental milling that begins at the first structure could not reveal, expose, or uncover the second structure, then that second structure can be considered as not being a milling-neighbor of the first structure (e.g., the first and second structures can be separated from each other in the direction of milling by an amount of material that is thick enough so as to not be traversable or removable by a single round or iteration of incremental milling).

Note that a milling-neighbor relation can be considered as one-directional or otherwise as not necessarily bi-directional. Indeed, if the second structure is a milling-neighbor of the first structure, this can mean that it is possible to uncover, expose, or reveal the second structure by a single round or iteration of incremental milling that begins somewhere in the first structure. In other words, the second structure can be considered as being positioned or located in the lamella 304 deeper along the direction or axis of milling than the first structure. So, although the first structure and the second structure can be physically adjacent to each other along the direction of milling, the first structure can be removed by milling chronologically before the second structure is removed. Thus, if milling were to be subsequently performed beginning somewhere in the second structure, such milling could not reveal, expose, or uncover the first structure, since the first structure was already removed via previous milling. Therefore, even though it might be the case that the second structure is a milling-neighbor of the first structure, it is not necessarily the case that the first structure is a milling-neighbor of the second structure. However, in certain circumstances, it is nevertheless possible for the first structure to be a milling-neighbor of the second structure and for the second structure to be a milling-neighbor of the first structure (e.g., the second structure might be sandwiched in the lamella 304 between two instantiations of the first structure).

In various instances, the edges of the class neighborhood graph 504 can indicate or convey which of the plurality of classes 506, and thus which of the plurality of structures 305, are or are not milling-neighbors of each other. In particular, each node of the class neighborhood graph 504 can have a high-weight directed edge with itself, can have one or more mid-weight directed edges (also referred to as intermediate-weight directed edges) with whichever nodes of the class neighborhood graph 504 are its milling-neighbors, and can have one or more low-weight directed edges with whichever nodes of the class neighborhood graph 504 are not its milling-neighbors. In this way, edge weight can be considered as indicating milling adjacency or milling-neighbor relations.

As a non-limiting example, the class 506(1), and thus the structure 305(1), can be represented by a first node of the class neighborhood graph 504. In various aspects, that first node can have a high-weight directed edge 508(1), one or more mid-weight directed edges 510(1), and one or more low-weight directed edges 512(1).

In various instances, the high-weight directed edge 508(1) can point from that first node to that first node. In other words, the high-weight directed edge 508(1) can be considered as a recursive edge that the first node has with itself. In various cases, the high-weight directed edge 508(1) can be implemented, because the class 506(1), and thus the structure 305(1), can be considered as being its own milling-neighbor. Indeed, the structure 305(1) can be thick enough such that one round or iteration of incremental milling that begins somewhere within the structure 305(1) can reveal, uncover, or expose some deeper portion of the structure 305(1).

In various aspects, each of the one or more mid-weight directed edges 510(1) can point from that first node to some other respective node of the class neighborhood graph 504, where that other respective node can represent a respective milling-neighbor of the class 506(1) and thus of the structure 305(1). Suppose that there are i classes, and thus i structures, that are known or expected to be milling-neighbors of the class 506(1), and thus of the structure 305(1), for any suitable positive integer i. In such case, the one or more mid-weight directed edges 510(1) can comprise a total of i mid-weight directed edges: one per milling-neighbor of the class 506(1) (e.g., one per milling-neighbor of the structure 305(1)).

In various instances, each of the one or more low-weight directed edges 512(1) can point from that first node to some other respective node of the class neighborhood graph 504, where that other respective node can represent a respective non-milling-neighbor of the class 506(1) and thus of the structure 305(1). Suppose that there are j classes, and thus j structures, that are known or expected to not be milling-neighbors of the class 506(1), and thus of the structure 305(1), for any suitable positive integer j. In such case, the one or more low-weight directed edges 512(1) can comprise a total of j low-weight directed edges: one per non-milling-neighbor of the class 506(1) (e.g., one per non-milling-neighbor of the structure 305(1)).

In various aspects, the high-weight directed edge 508(1) can be assigned a first scalar weight $W_{high} \in \mathbb{R}^+$. In various instances, each of the one or more mid-weight directed edges 510(1) can be assigned a second scalar weight $w_{mid} \in \mathbb{R}+$ (e.g., such that all of the one or more mid-weight directed edges 510(1) have the same weight as each other). In various cases, each of the one or more low-weight directed edges 512(1) can be assigned a third scalar weight $W_{low} \in \mathbb{R}+$ (e.g., such that all of the one or more low-weight directed edges 512(1) have the same weight as each other). In various aspects, it can be the case that $W_{low}<W_{mid}<W_{high}$, hence the terms "high-weight", "mid-weight", and "low-weight". For instance, it can be the case that $W_{low}$=0.1, $W_{mid}$=50.0, and $W_{high}$=100.0.

As another non-limiting example, the class 506(*n*), and thus the structure 305(*n*), can be represented by an n-th node of the class neighborhood graph 504. In various aspects, that n-th node can have a high-weight directed edge 508(*n*), one or more mid-weight directed edges 510(*n*), and one or more low-weight directed edges 512(*n*).

Just as above, the high-weight directed edge 508(*n*) can point from that n-th node to that n-th node, such that the high-weight directed edge 508(*n*) can be considered as a recursive edge that the n-th node has with itself. Again, this can be due to the fact that the class 506(*n*), and thus the structure 305(*n*), can be considered as being its own milling-neighbor (e.g., the structure 305(*n*) can be thick enough such that one round or iteration of incremental milling that begins somewhere within the structure 305(*n*) can reveal, uncover, or expose some deeper portion of the structure 305(*n*)).

As above, each of the one or more mid-weight directed edges 510(*n*) can point from that n-th node to some other respective node of the class neighborhood graph 504, where that other respective node can represent a respective milling-neighbor of the class 506(*n*) and thus of the structure 305(*n*). So, if there are k classes, and thus k structures, that are known or expected to be milling-neighbors of the class 506(*n*), and thus of the structure 305(*n*), for any suitable positive integer k, then the one or more mid-weight directed edges 510(*n*) can comprise a total of k mid-weight directed edges: one per milling-neighbor of the class 506(*n*) (e.g., one per milling-neighbor of the structure 305(*n*)).

Like above, each of the one or more low-weight directed edges 512(*n*) can point from that n-th node to some other respective node of the class neighborhood graph 504, where that other respective node can represent a respective non-milling-neighbor of the class 506(*n*) and thus of the structure 305(*n*). Thus, if there are l classes, and thus I structures, that are known or expected to not be milling-neighbors of the class 506(*n*), and thus of the structure 305(*n*), for any suitable positive integer l, then the one or more low-weight directed edges 512(*n*) can comprise a total of l low-weight directed edges: one per non-milling-neighbor of the class 506(*n*) (e.g., one per non-milling-neighbor of the structure 305(*n*)).

In various aspects, the high-weight directed edge 508(*n*) can be assigned the first scalar weight $W_{high}$ (e.g., same weight as the high-weight directed edge 508(1)). In various instances, each of the one or more mid-weight directed edges 510(*n*) can be assigned the second scalar weight $w_{mid}$ (e.g., same weight as assigned to each of the one or more mid-weight directed edges 510(1)). In various cases, each of the one or more low-weight directed edges 512(*n*) can be assigned the third scalar weight $W_{low}$ (e.g., same weight as each of the one or more low-weight directed edges 512(1)).

In various aspects, the high-weight directed edge 508(1) to the high-weight directed edge 508(*n*) can be collectively referred to as a plurality of high-weight directed edges 508. In various instances, the one or more mid-weight directed edges 510(1) to the one or more mid-weight directed edges 510(*n*) can be collectively referred to as a plurality of mid-weight directed edges 510. In various cases, the one or more low-weight directed edges 512(1) to the one or more low-weight directed edges 512(*n*) can be collectively referred to as a plurality of low-weight directed edges 512.

It should be appreciated that the specific edge weights or edge weight relationships described herein are mere non-limiting examples. In various cases, any edges within the class neighborhood graph 504 can have the same or different weights as each other.

Figure 6:
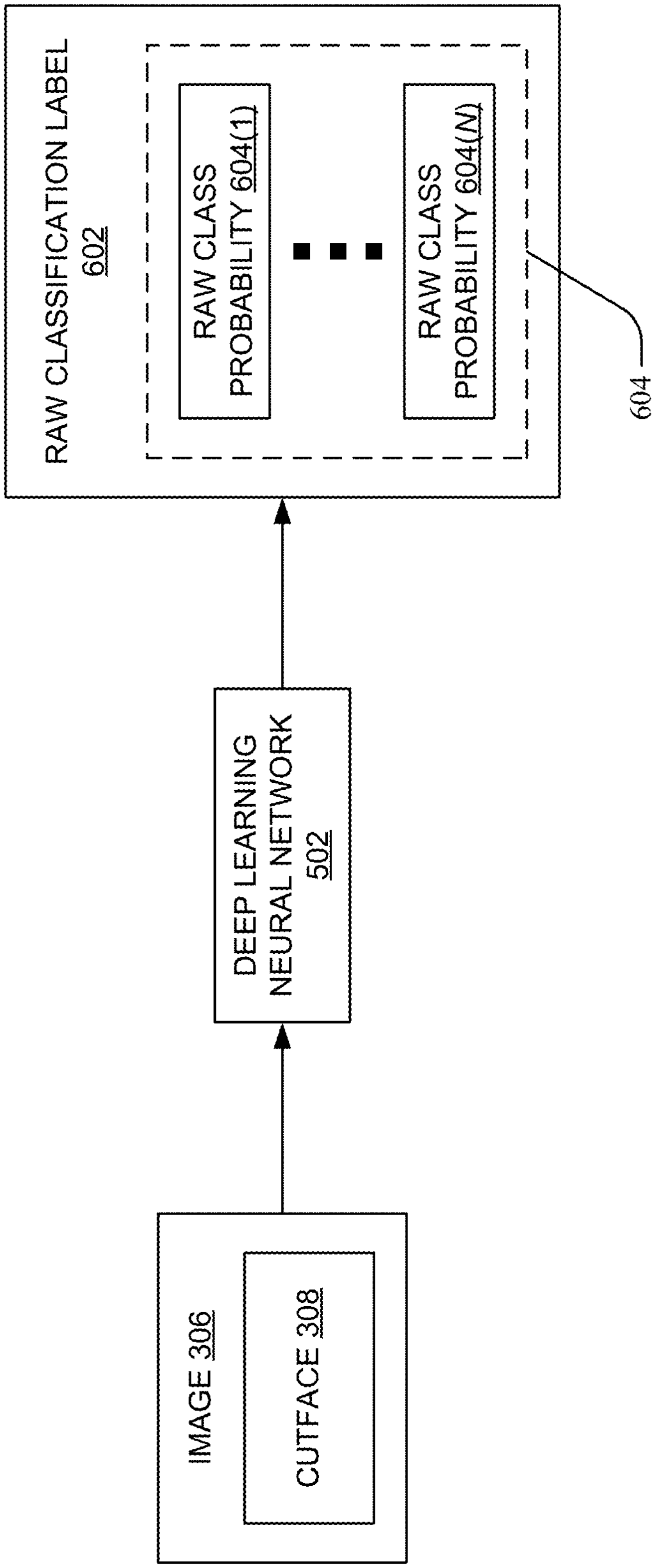

Now, consider FIG. 6. In various embodiments, as mentioned above, the deep learning neural network 502 can be configured as an image classifier. Accordingly, in various aspects, the model component 318 can electronically execute the deep learning neural network 502 on the image 306. In various instances, such execution can cause the deep learning neural network 502 to produce a raw classification label 602. More specifically, the model component 318 can feed the image 306 to an input layer of the deep learning neural network 502. In various aspects, the image 306 can complete a forward pass through one or more hidden layers of the deep learning neural network 502. In various instances, an output layer of the deep learning neural network 502 can calculate or compute the raw classification label 602, based on activation maps or feature maps generated by the one or more hidden layers.

In some cases, the deep learning neural network 502 can be configured to receive as input an entirety of the image 306. However, this is a mere non-limiting example. In other cases, the deep learning neural network 502 can instead be configured to receive as input any suitable portion of the image 306. As a non-limiting example, the deep learning neural network 502 can be configured to receive as input a device line that can be extracted from the image 306. In particular, the device line can be considered as a horizontal subsection of the image 306 that depicts an area or region of interest of the cutface 308. For instance, if the image 306 is a 600-by-600 pixel array (e.g., 600 rows of pixels by 600 columns of pixels), the device line can be a 100-by-600 pixel array (e.g., can be 100 contiguous rows of pixels that are cropped from the image 306 and that are believed or expected to depict or show a most interesting region or area of the cutface 308). In various aspects, the device line can be extracted via any suitable image processing techniques. For instance, the image 306 can be broken up into a plurality of regular vertical strips (e.g., each vertical strip can comprise one or more columns of pixels), and a sliding window of constant size can be moved, one or more pixel-rows at a time, downward along each vertical strip. At each position of the sliding window, a standard deviation of intensity values can be computed for whatever pixels that are within that sliding window at that position. For each vertical strip, there can be one position of the sliding window for which the computed standard deviation increases by more than any suitable threshold margin, and that position can be considered as delineating a top boundary of the device line in that vertical strip. By performing this sliding window technique for multiple vertical strips, the entire top boundary of the device line can be obtained (e.g., extrapolated via a line of best fit through those identified positions of the sliding window). In this way, the device line can be identified and thus extracted or cropped from the image 306, and the model component 318 can execute the deep learning neural network 502 on the device line rather than on the entirety of the image 306. That is, the model component 318 can feed the device line to the input layer of the deep learning neural network 502, the device line can complete a forward pass through the one or more hidden layers of the deep learning neural network 502, and the output layer of the deep learning neural network 502 can calculate or compute the raw classification label 602 based on activation maps or feature maps generated by the one or more hidden layers.

In any case, the raw classification label 602 can comprise a plurality of raw class probabilities 604. In various aspects, the plurality of raw class probabilities 604 can respectively correspond to the plurality of classes 506 and thus to the plurality of structures 305. So, because the plurality of classes 506 can comprise n classes, and because the plurality of structures 305 can comprise n structures, the plurality of raw class probabilities 604 can comprise n probabilities: a raw class probability 604(1) to a raw class probability 604($n$). In various instances, each of the plurality of raw class probabilities 604 can be a scalar that indicates the inferred or predicted probability or likelihood of the cutface 308 belonging to a respective one of the plurality of classes 506. In other words, each of the plurality of raw class probabilities 604 can be a scalar that indicates the inferred or predicted probability or likelihood of a respective one of the plurality of structures 305 being currently visible in or on the cutface 308.

As a non-limiting example, the raw class probability 604(1) can correspond to the class 506(1) and thus to the structure 305(1). So, the raw class probability 604(1) can be a real-valued, positive scalar whose magnitude indicates how likely (as determined or predicted by the deep learning neural network 502) it is that cutface 308 as depicted in the image 306 belongs to the class 506(1). In other words, the raw class probability 604(1) can be a real-valued, positive scalar whose magnitude indicates how likely (as determined or predicted by the deep learning neural network 502) it is that the structure 305(1) is currently visible, uncovered, revealed, or otherwise exposed in or on the cutface 308.

As another non-limiting example, the raw class probability 604($n$) can correspond to the class 506($n$) and thus to the structure 305($n$). So, the raw class probability 604($n$) can be a real-valued, positive scalar whose magnitude indicates how likely (as determined or predicted by the deep learning neural network 502) it is that cutface 308 as depicted in the image 306 belongs to the class 506($n$). In other words, the raw class probability 604($n$) can be a real-valued, positive scalar whose magnitude indicates how likely (as determined or predicted by the deep learning neural network 502) it is that the structure 305($n$) is currently visible, uncovered, revealed, or otherwise exposed in or on the cutface 308.

In various cases, note that the plurality of raw class probabilities 604 can sum to unity. That is, a total sum of the plurality of raw class probabilities 604 can be equal to 1.

Figure 7:
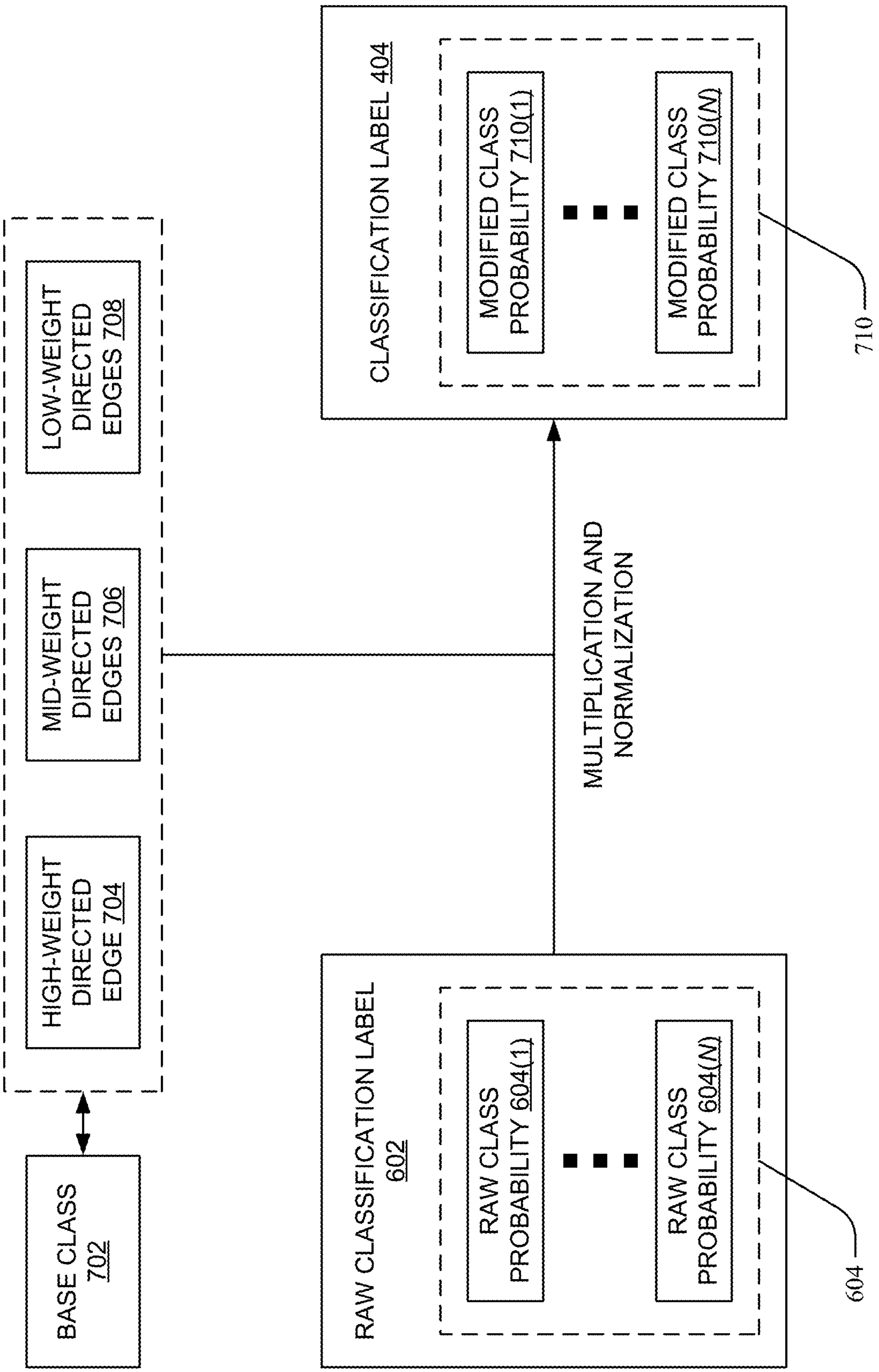

Now, consider FIG. 7. In various embodiments, the model component 318 can electronically modify the raw classification label 602, based on the class neighborhood graph 504. In various aspects, such modification can yield the classification label 404.

More specifically, there can be a base class 702. In various instances, the base class 702 can be any one of the plurality of classes 506. In particular, there can have been a previous image (not shown) that was captured by the scientific instrument 302, where that previous image can have depicted or illustrated a previous version of the cutface 308. In other words, that previous image can have shown whatever the cutface 308 looked like just before or prior to the most recent round or iteration of milling performed by the scientific instrument 302. In various aspects, the system 310 can have analyzed that previous image as described herein, and the base class 702 can be whichever one of the plurality of classes 506 to which the system 310 determined or predicted that that previous version of the cutface 308 belonged. Stated differently, the base class 702 can correspond to whichever of the plurality of structures 305 that was determined, predicted, or inferred to have been visible in or on the cutface 308 immediately prior to the most recent round or iteration of milling. In some cases, the base class 702 can be whichever one of the plurality of classes 506 that was indicated by a previous classification label that was generated by the model component 318 via modification according to the class neighborhood graph 504. However, if there is no such previous classification label (e.g., as will be the case for the very first iteration during which the class neighborhood graph 504 is utilized), the base class 702 can instead be whichever one of the plurality of classes 506 that was indicated by one or more previous raw classification labels that were generated by the model component 318.

In any case, the class neighborhood graph 504 can indicate edges that branch off or point away from the base class 702. In particular, the class neighborhood graph 504 can indicate that the base class 702 has a high-weight directed edge 704 with itself (e.g., the high-weight directed edge 704 can come from the plurality of high-weight directed edges 508). Furthermore, the class neighborhood graph 504 can indicate that the base class 702 has one or more mid-weight directed edges 706 with whichever classes, and thus whichever structures, are known or expected to be milling-neighbors of the base class 702 (e.g., the one or more mid-weight directed edges 706 can come from the plurality of mid-weight directed edges 510). Further still, the class neighborhood graph 504 can indicate that the base class 702 has one or more low-weight directed edges 708 with whichever classes, and thus whichever structures, are known or expected to not be milling-neighbors of the base class 702 (e.g., the one or more low-weight directed edges 708 can come from the plurality of low-weight directed edges 512).

In various aspects, the model component 318 can modify the raw classification label 602, by multiplying the plurality of raw class probabilities 604 with respective or corresponding weights from the high-weight directed edge 704, from the one or more mid-weight directed edges 706, and from the one or more low-weight directed edges 708.

As a non-limiting example, consider the raw class probability 604(1). As mentioned above, the raw class probability 604(1) can correspond to the class 506(1). In various aspects, the model component 318 can compute a first product, by multiplying the raw class probability 604(1) by whichever weight from the high-weight directed edge 704, from the one or more mid-weight directed edges 706, or from the one or more low-weight directed edges 708 corresponds to the class 506(1). In other words, the model component 318 can compute the first product, by multiplying the raw class probability 604(1) by the weight of whichever edge in the class neighborhood graph 504 points away from the base class 702 and toward the class 506(1). For instance, suppose that the class 506(1) is the same as the base class 702. In such case, the high-weight directed edge 704 can point away from the base class 702 and toward the class 506(1). Thus, the model component 318 can multiply the raw class probability 604(1) by the weight $W_{high}$, thereby yielding the first product. As another instance, suppose that the class 506(1) is different from the base class 702 and is known or expected to be a milling-neighbor of the base class 702. In such case, one of the one or more mid-weight directed edges 706 can point away from the base class 702 and toward the class 506(1). So, the model component 318 can multiply the raw class probability 604(1) by the weight $w_{mid}$, thereby yielding the first product. As even another instance, suppose that the class 506(1) is different from the base class 702 and is known or expected to not be a milling-neighbor of the base class 702. In such case, one of the one or more low-weight directed edges 708 can point away from the base class 702 and toward the class 506(1). Thus, the model component 318 can multiply the raw class probability 604(1) by the weight $w_{low}$, thereby yielding the first product.

As another non-limiting example, consider the raw class probability 604(*n*). As mentioned above, the raw class probability 604(*n*) can correspond to the class 506(*n*). In various aspects, the model component 318 can compute an n-th product, by multiplying the raw class probability 604(*n*) by whichever weight from the high-weight directed edge 704, from the one or more mid-weight directed edges 706, or from the one or more low-weight directed edges 708 corresponds to the class 506(*n*). In other words, the model component 318 can compute the n-th product, by multiplying the raw class probability 604(*n*) by the weight of whichever edge in the class neighborhood graph 504 points away from the base class 702 and toward the class 506(*n*). For instance, suppose that the class 506(*n*) is the same as the base class 702. In such case, the high-weight directed edge 704 can point away from the base class 702 and toward the class 506(*n*). Thus, the model component 318 can multiply the raw class probability 604(*n*) by the weight $W_{high}$, thereby yielding the n-th product. As another instance, suppose that the class 506(*n*) is different from the base class 702 and is known or expected to be a milling-neighbor of the base class 702. In such case, one of the one or more mid-weight directed edges 706 can point away from the base class 702 and toward the class 506(*n*). So, the model component 318 can multiply the raw class probability 604(*n*) by the weight $w_{mid}$, thereby yielding the n-th product. As even another instance, suppose that the class 506(*n*) is different from the base class 702 and is known or expected to not be a milling-neighbor of the base class 702. In such case, one of the one or more low-weight directed edges 708 can point away from the base class 702 and toward the class 506(*n*). Thus, the model component 318 can multiply the raw class probability 604(*n*) by the weight $w_{low}$, thereby yielding the n-th product.

Such multiplication based on the weights of the high-weight directed edge 704, of the one or more mid-weight directed edges 706, and of the one or more low-weight directed edges 708 can yield a total of n products (e.g., one product per raw class probability). In various aspects, the model component 318 can normalize such n products, such as by dividing each by the sum of all n of those products. In various instances, such normalization can yield a plurality of modified class probabilities 710. In particular, the normalized version of the first product can be referred to as a modified class probability 710(1), which can be considered as a modified or transformed version of the raw class probability 604(1). In other words, the modified class probability 710(1) can be considered as indicating a modified likelihood that the cutface 308 belongs to the class 506(1) (e.g., indicating a modified likelihood that the structure 305(1) is currently visible in or on the cutface 308). Similarly, the normalized version of the n-th product can be referred to as a modified class probability 710(*n*), which can be considered as a modified or transformed version of the raw class probability 604(*n*). That is, the modified class probability 710(*n*) can be considered as indicating a modified likelihood that the cutface 308 belongs to the class 506(*n*) (e.g., indicating a modified likelihood that the structure 305(*n*) is currently visible in or on the cutface 308).

In various cases, the modified class probability 710(1) to the modified class probability 710(*n*) can be collectively considered as the plurality of modified class probabilities 710. In various aspects, the classification label 404 can be considered as comprising or otherwise being made up of the plurality of modified class probabilities 710.

Figure 8:
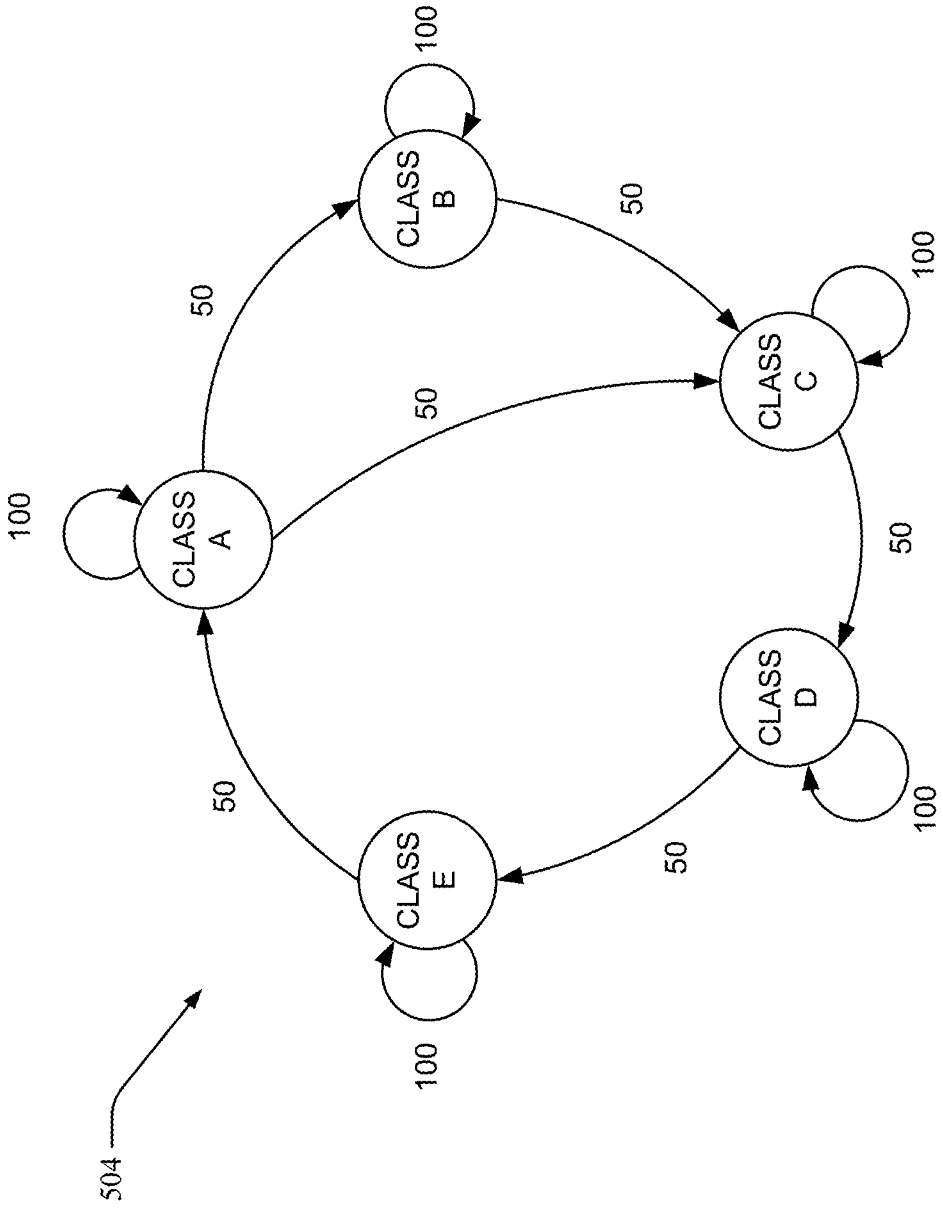

To help clarify various aspects described herein, consider the non-limiting example shown with respect to FIGS. 8-9.

FIG. 8 shows a non-limiting example of the class neighborhood graph 504. In this non-limiting example, the plurality of classes 506 can comprise a total of five classes (e.g., n=5): a class A representing a structure A; a class B representing a structure B; a class C representing a structure C; a class D representing a structure D; and a class E representing a structure E. As shown, those five classes can be coupled in various ways by various edges. To avoid confusion that would be caused by excessive visual clutter, FIG. 8 depicts only the high-weight directed edges (e.g., 508) and the mid-weight directed edges (e.g., 510) in this non-limiting example. In other words, the low-weight directed edges (e.g., 512) are visually omitted from FIG. 8, so as to prevent FIG. 8 from being excessively cluttered and not understandable. In this non-limiting example, $W_{high}$=100, $W_{mid}$=50, and $W_{low}$=0.1.

As shown, in this non-limiting example, the class A can have a high-weight edge directed to itself, a mid-weight edge directed to the class B, and another mid-weight edge directed to the class C. Although not explicitly shown, it is to be understood that the class A can thus have a low-weight edge directed to the class D and another low-weight edge directed to the class E. Accordingly, this can be interpreted to mean the following: the class A is a milling-neighbor of itself; the class B is a milling-neighbor of the class A; the class C is another milling-neighbor of the class A; the class D is not a milling-neighbor of the class A; and the class E is not a milling-neighbor of the class A.

As shown, in this non-limiting example, the class B can have a high-weight edge directed to itself and a mid-weight edge directed to the class C. Although not explicitly shown, it is to be understood that the class B can thus have a low-weight edge directed to the class D, another low-weight edge directed to the class E, and yet another low-weight edge directed to the class A. Accordingly, this can be interpreted to mean the following: the class B is a milling-neighbor of itself; the class C is a milling-neighbor of the class B; the class D is not a milling-neighbor of the class B;

the class E is not a milling-neighbor of the class B; and the class A is not a milling-neighbor of the class B.

As shown, in this non-limiting example, the class C can have a high-weight edge directed to itself and a mid-weight edge directed to the class D. Although not explicitly shown, it is to be understood that the class C can thus have a low-weight edge directed to the class E, another low-weight edge directed to the class A, and yet another low-weight edge directed to the class B. Accordingly, this can be interpreted to mean the following: the class C is a milling-neighbor of itself; the class D is a milling-neighbor of the class C; the class E is not a milling-neighbor of the class C; the class A is not a milling-neighbor of the class C; and the class B is not a milling-neighbor of the class C.

As shown, in this non-limiting example, the class D can have a high-weight edge directed to itself and a mid-weight edge directed to the class E. Although not explicitly shown, it is to be understood that the class D can thus have a low-weight edge directed to the class A, another low-weight edge directed to the class B, and yet another low-weight edge directed to the class C. Accordingly, this can be interpreted to mean the following: the class D is a milling-neighbor of itself; the class E is a milling-neighbor of the class D; the class A is not a milling-neighbor of the class D; the class B is not a milling-neighbor of the class D; and the class C is not a milling-neighbor of the class D.

As shown, in this non-limiting example, the class E can have a high-weight edge directed to itself and a mid-weight edge directed to the class A. Although not explicitly shown, it is to be understood that the class E can thus have a low-weight edge directed to the class B, another low-weight edge directed to the class C, and yet another low-weight edge directed to the class D. Accordingly, this can be interpreted to mean the following: the class E is a milling-neighbor of itself; the class A is a milling-neighbor of the class E; the class B is not a milling-neighbor of the class E; the class C is not a milling-neighbor of the class E; and the class D is not a milling-neighbor of the class E.

Now, FIG. 9 shows a non-limiting example of the raw classification label 602. As shown, in this non-limiting example, the raw classification label 602 can indicate a 20% raw probability for the class A, a 5% raw probability for the class B, a 30% raw probability for the class C, a 40% raw probability for the class D, and a 5% raw probability for the class E. In various aspects, this non-limiting example of the raw classification label 602 can be modified according to the non-limiting example of the class neighborhood graph 504 shown in FIG. 8.

For instance, suppose that the base class 702 (e.g., the previously predicted or inferred class) is the class A. In such case, because the class neighborhood graph 504 shown in FIG. 8 has a 100-weight edge directed from the base class 702 to the class A, the raw class A probability of 20% can be multiplied by 100, thereby yielding a first product of 20 (e.g., 0.2*100=20). Likewise, because the class neighborhood graph 504 shown in FIG. 8 has a 50-weight edge directed from the base class 702 to the class B, the raw class B probability of 5% can be multiplied by 50, thereby yielding a second product of 2.5 (e.g., 0.05*50=2.5). Similarly, because the class neighborhood graph 504 shown in FIG. 8 has a 50-weight edge directed from the base class 702 to the class C, the raw class C probability of 30% can be multiplied by 50, thereby yielding a third product of 15 (e.g., 0.3*50=15). In like fashion, because the class neighborhood graph 504 shown in FIG. 8 has a 0.1-weight edge directed from the base class 702 to the class D, the raw class D probability of 40% can be multiplied by 0.1, thereby yielding a fourth product of 0.04 (e.g., 0.4*0.1=0.04). Also, because the class neighborhood graph 504 shown in FIG. 8 has a 0.1-weight edge directed from the base class 702 to the class E, the raw class E probability of 5% can be multiplied by 0.1, thereby yielding a fifth product of 0.005 (e.g., 0.05*0.1=0.005). In various aspects, those five products can be normalized, so as to yield a non-limiting example of the classification label 404. Indeed, the sum of such five products can be 37.545 (e.g., 20+2.5+15+0.04+0.005=37.545), and so the classification label 404 can be as follows: the modified class A probability can be 53% (e.g., $$\frac{20}{37.545} \approx 0.53);$$

the modified class B probability can be 7% (e.g., $$\frac{2.5}{37.545} \approx 0.07);$$

the modified class C probability can be 40% (e.g., $$\frac{15}{37.545} \approx 0.4);$$

the modified class D probability can be 0% (e.g., $$\frac{0.04}{37.545} \approx 0);$$

and the modified class E probability can be 0% (e.g., $$\frac{0.005}{37.545} \approx 0).$$

In other words, in this situation, it can have been determined or inferred that the structure A (e.g., the base structure 702) was previously visible in or on the cutface 308, the deep learning neural network 502 can have predicted that the structure D is now currently visible in or on the cutface 308 (e.g., the raw class D probability is the highest in the raw classification label 602), and modification based on the class neighborhood graph 504 can be considered as modifying that prediction such that the structure A is now inferred to still be currently visible in or on the cutface 308 (e.g., the modified class A probability is the highest in the classification label 404 of this example). In other words, modification based on the class neighborhood graph 504 can be considered as a type of sanity reinforcement on the deep learning neural network 502. Indeed, if the structure A was visible in or on the cutface 308 immediately before the most recent round or iteration of milling, then structure D cannot now be visible, since the structure D is not a milling-neighbor of the structure A. Thus, the deep learning neural network 502 in this example can be considered as initially outputting a false positive, and modification based on the class neighborhood graph 504 can be considered as rectifying that false positive. In other words, modification based on the class neighborhood graph 504 as described herein can be considered as biasing the deep learning neural network 502 towards prediction of milling-neighbors and away from prediction of non-milling-neighbors.

As another instance, suppose that the base class 702 (e.g., the previously predicted or inferred class) is the class D instead of the class A. In such case, because the class neighborhood graph 504 shown in FIG. 8 has a 0.1-weight edge directed from the base class 702 to the class A, the raw class A probability of 20% can be multiplied by 0.1, thereby yielding a first product of 0.02 (e.g., 0.2*0.1=0.02). Likewise, because the class neighborhood graph 504 shown in FIG. 8 has a 0.1-weight edge directed from the base class 702 to the class B, the raw class B probability of 5% can be multiplied by 0.1, thereby yielding a second product of 0.005 (e.g., 0.05*0.1=0.005). Similarly, because the class neighborhood graph 504 shown in FIG. 8 has a 0.1-weight edge directed from the base class 702 to the class C, the raw class C probability of 30% can be multiplied by 0.1, thereby yielding a third product of 0.03 (e.g., 0.3*0.1=0.03). In like fashion, because the class neighborhood graph 504 shown in FIG. 8 has a 100-weight edge directed from the base class 702 to the class D, the raw class D probability of 40% can be multiplied by 100, thereby yielding a fourth product of 40 (e.g., 0.*100=40). Also, because the class neighborhood graph 504 shown in FIG. 8 has a 50-weight edge directed from the base class 702 to the class E, the raw class E probability of 5% can be multiplied by 50, thereby yielding a fifth product of 2.5 (e.g., 0.05*50=2.5). In various aspects, those five products can be normalized, so as to yield a non-limiting example of the classification label 404. Indeed, the sum of such five products can be 42.555 (e.g., 0.02+0.005+0.03+40+2.5=42.555), and so the classification label 404 can be as follows: the modified class A probability can be 0% (e.g., $$\frac{0.02}{42.555} \approx 0);$$

the modified class B probability can be 0% (e.g., $$\frac{0.005}{42.555} \approx 0);$$

the modified class C probability can be 0% (e.g., $$\frac{0.03}{42.555} \approx 0);$$

the modified class D probability can be 94% (e.g., $$\frac{40}{42.555} \approx 0.94);$$

and the modified class E probability can be 6% (e.g., $$\frac{2.5}{42.555} \approx 0.06).$$

In other words, in this situation, it can have been determined or inferred that the structure D (e.g., the base structure 702) was previously visible in or on the cutface 308, the deep learning neural network 502 can have predicted (albeit with not very high confidence) that the structure D is still currently visible in or on the cutface 308 (e.g., the raw class D probability is the highest in the raw classification label 602), and modification based on the class neighborhood graph 504 can be considered as modifying that prediction such that the structure D is inferred to still be currently visible in or on the cutface 308 with very high confidence (e.g., the modified class D probability is the highest in the classification label 404 of this example). Thus, not only can modification based on the class neighborhood graph 504 be considered as a type of sanity reinforcement that biases predictions of the deep learning neural network 502 toward milling-neighbors and away from non-milling-neighbors, such modification can also be considered as a type of precautionary reinforcement that biases predictions against transitioning from the previous class/structure to a milling-neighbor until the deep learning neural network 502 is strongly confident of such transition.

In any case, the model component 318 can electronically generate the classification label 404, by executing the graph-weighted neural network 402 on the image 306 (or on a device extracted therefrom). In various aspects, the classification label 404 can be considered as indicating one of the plurality of classes 506 and thus one of the plurality of structures 305. In particular, one of the plurality of modified class probabilities 710 can be higher than the others. That highest or maximum modified class probability can correspond to a given one of the plurality of classes 506 and thus to a given one of the plurality of structures 305. In other words, the classification label 404 can indicate that the cutface 308 currently belongs to that given class. Equivalently, the classification label 404 can indicate that the given structure is currently visible in or on the cutface 308.

Figure 10:
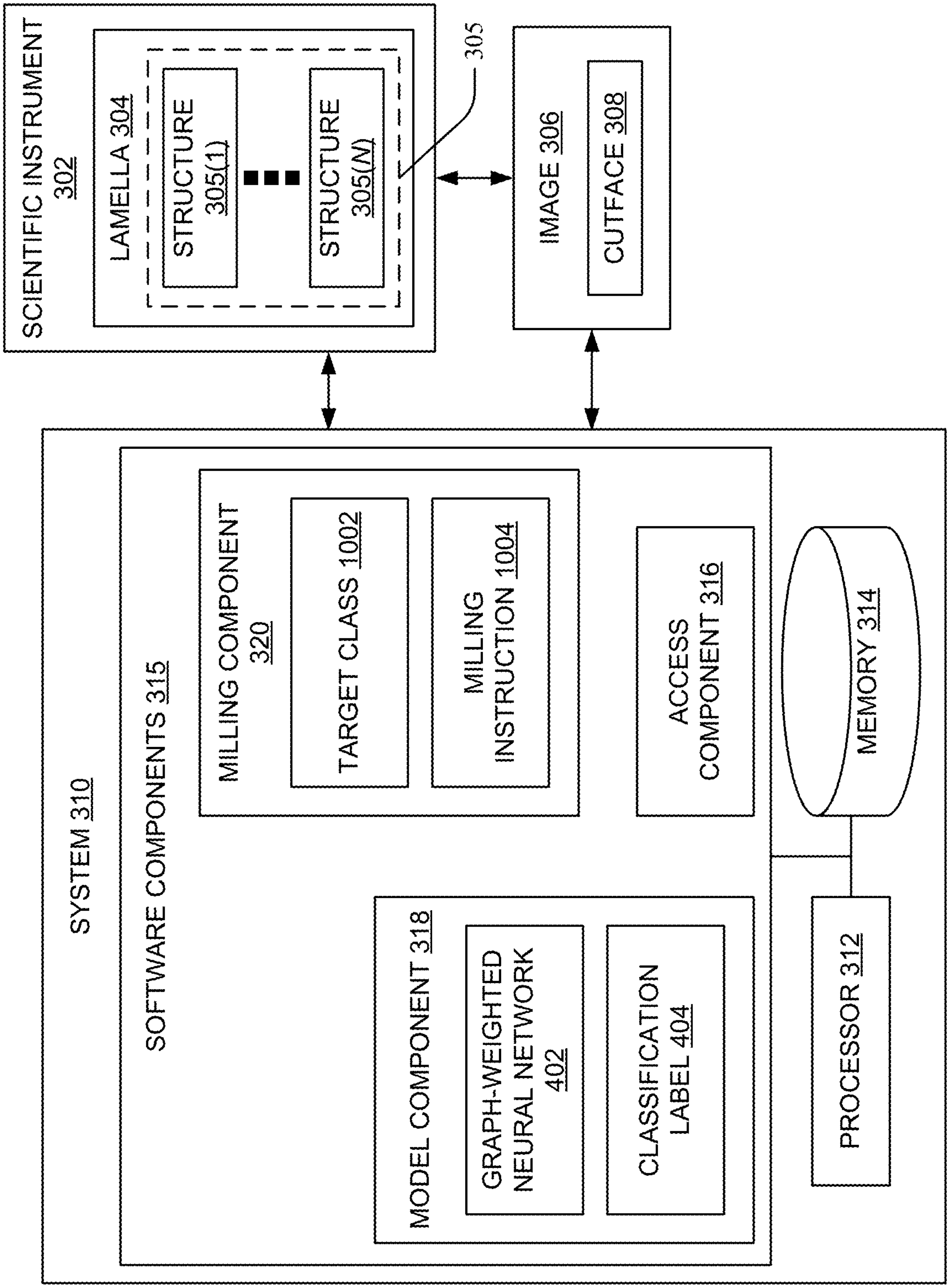
FIG. 10 illustrates a block diagram of an example, non-limiting system including a target class and a milling instruction that facilitates lamella end-pointing via graph-weighted neural networks in accordance with one or more embodiments described herein.

FIG. 10 illustrates a block diagram of an example, non-limiting system including a target class and a milling instruction that can facilitate lamella end-pointing via graph-weighted neural networks in accordance with one or more embodiments described herein.

In various embodiments, the milling component 320 can electronically identify a target class 1002. In various aspects, the target class 1002 can be whichever one of the plurality of classes 506, and thus can represent whichever one of the plurality of structures 305, that is desired to be physically isolated within the lamella 304. In various instances, the target class 1002 can be indicated or selected by any suitable user-input. As a non-limiting example, a technician associated with the scientific instrument 302 can interact with any suitable human-computer interface device (e.g., keyboard, keypad, touchscreen, voice command system) of the scientific instrument 302 or of the system 310, so as to manually select or designate which of the plurality of classes 506 is to be the target class 1002.

In various cases, the milling component 320 can electronically compare the target class 1002 to whichever class is indicated by the classification label 404.

If whichever class indicated by the classification label 404 is different from the target class 1002, the milling component 320 can electronically transmit a milling instruction 1004 to the scientific instrument 302. In various aspects, the milling instruction 1004 can be considered as any suitable electronic command that prompts or causes the scientific instrument 302 to perform an additional round or iteration of incremental milling (e.g., that prompts or causes the scientific instrument 302 to remove an additional 1 or 2 nm or less of material from the cutface 308). In other words, if whichever class indicated by the classification label 404 is different from the target class 1002, the milling component 320 can conclude that whichever structure that is represented by the target class 1002 is not yet visible in or on the cutface 308. So, the milling component 320 can conclude that additional milling is needed, hence the milling instruction 1004. Note that whichever class is indicated by the classification label 404 can be considered or treated as the base class 702 during the classification-weighting procedure that immediately follows such additional round or iteration of milling.

Instead, if whichever class indicated by the classification label 404 is the same as the target class 1002, the milling component 320 can refrain from electronically transmitting the milling instruction 1004 to the scientific instrument 302. Indeed, in such case, the milling component 320 can conclude that end-pointing of the lamella 304 is complete or finished, at least with respect to one side of the lamella 304. In some cases, if the other or reverse side of the lamella 304 has already been end-pointed as described herein (e.g., has already been milled so that whatever structure represented by the target class 1002 is visible in or on the cutface of that reverse side), the milling component 320 can generate or transmit any suitable electronic message indicating that end-pointing of the lamella 304 is fully complete. On the other hand, if the other or reverse side of the lamella 304 has not already been end-pointed as described herein (e.g., has not yet been milled so that whatever structure represented by the target class 1002 is visible in or on the cutface of that reverse side), the milling component 320 can generate or transmit any suitable electronic message indicating that end-pointing is complete for the current side of the lamella 304 and that end-pointing should next be performed on the reverse side of the lamella 304.

In any case, once end-pointing on the lamella 304 is fully complete, whatever structure represented by the target class 1002 can be considered as being physically isolated within the lamella 304 (e.g., the remainder of the plurality of structures 305 can have been removed from the lamella 304 via milling). Accordingly, any downstream or follow-on analysis can be subsequently performed on that isolated structure (e.g., transmission electron microscopy analysis can be performed on the isolated structure).

Figure 11:
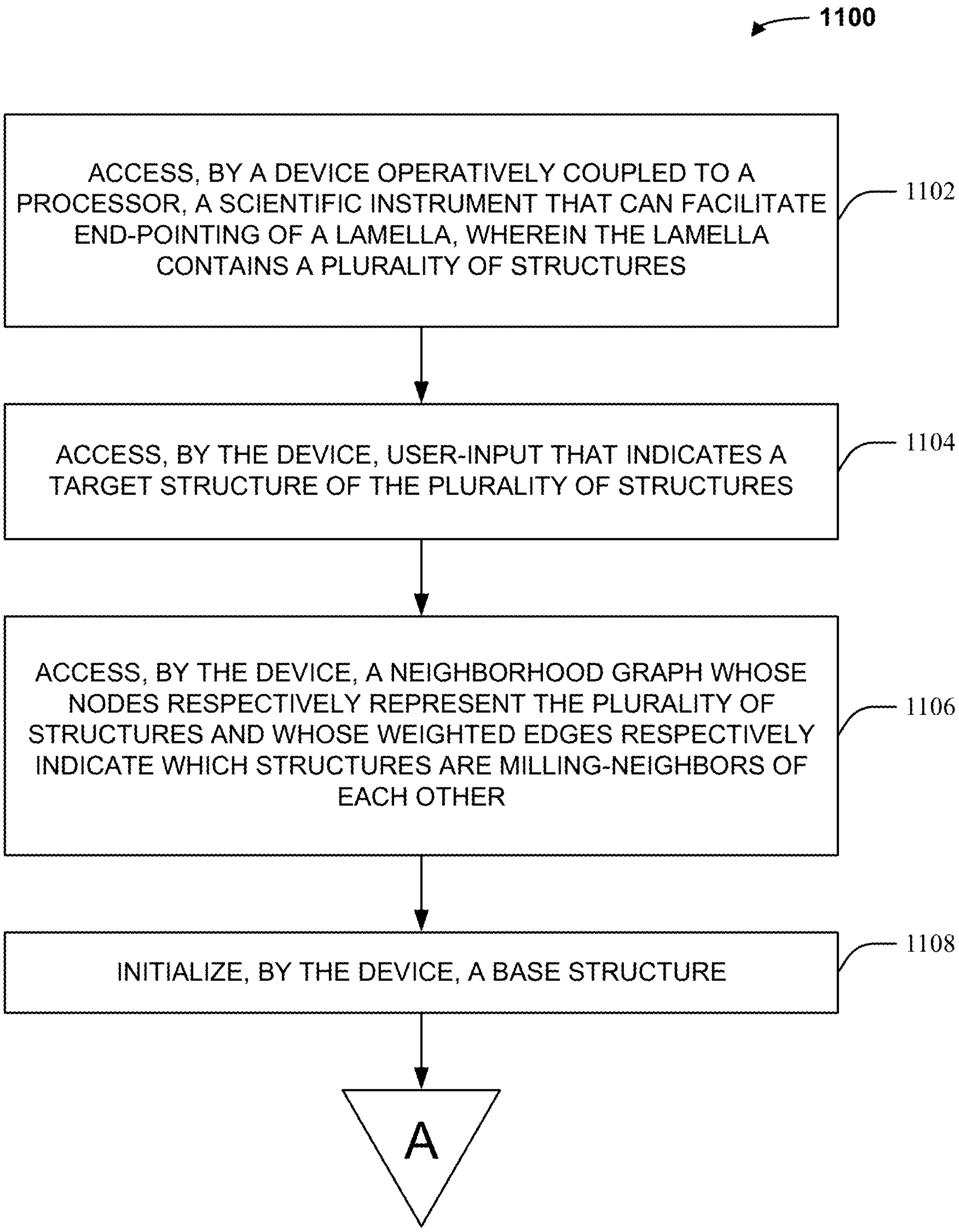
FIGS. 11-12 illustrate flow diagrams of example, non-limiting computer-implemented methods that facilitate lamella end-pointing via graph-weighted neural networks in accordance with one or more embodiments described herein.
Figure 12:
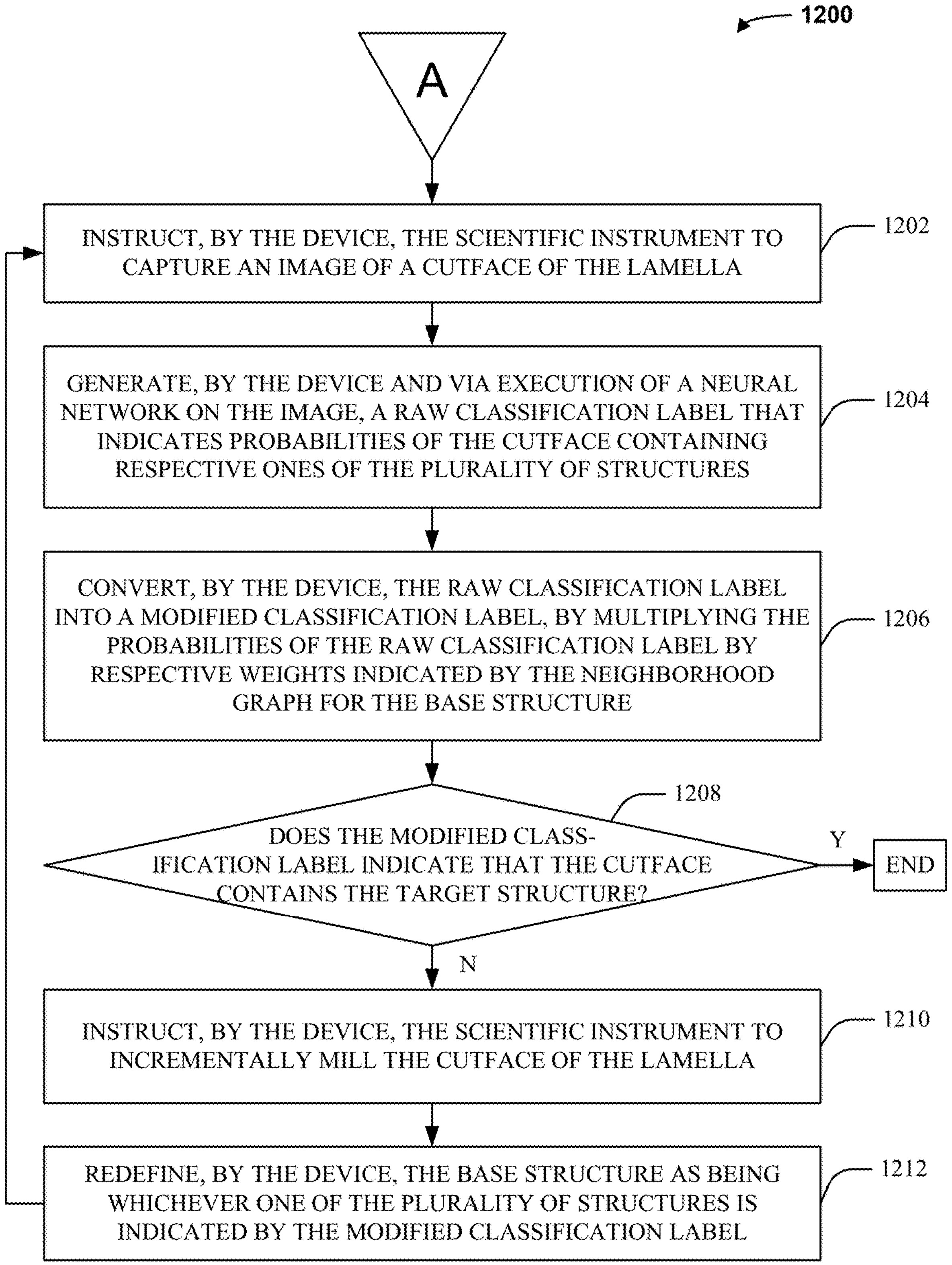

FIGS. 11-12 illustrate flow diagrams of example, non-limiting computer-implemented methods 1100 and 1200 that can facilitate lamella end-pointing via graph-weighted neural networks in accordance with one or more embodiments described herein. In various cases, the computer-implemented methods 1100 and 1200 can be facilitated by the system 310.

First, consider FIG. 11. In various embodiments, act 1102 can include accessing, by a device (e.g., via 316) operatively coupled to a processor (e.g., 312), a scientific instrument (e.g., 302) that can facilitate end-pointing of a lamella (e.g., 304). In various cases, the lamella can contain a plurality of structures (e.g., 305).

In various aspects, act 1104 can include accessing, by the device (e.g., via 316 or 320), user-input that indicates a target structure (e.g., represented by 1002) of the plurality of structures.

In various instances, act 1106 can include accessing, by the device (e.g., via 316 or 318), a neighborhood graph (e.g., 504) whose nodes (e.g., 506) respectively represent the plurality of structures and whose weighted edges (e.g., 508, 510, 512) respectively indicate which structures are milling-neighbors of each other.

In various cases, act 1108 can include initializing, by the device (e.g., via 318), a base structure (e.g., 702). In some situations, any suitable initialization technique can be implemented. As a non-limiting example, the base structure can be automatically identified based on one or more raw classification labels produced by a deep learning classifier (e.g., if multiple consecutive raw classification labels agree with each other, whichever structure they agree on can be treated as the very first base structure). In various aspects, the computer-implemented method 1100 can then proceed to act 1202 of the computer-implemented method 1200.

Now, consider FIG. 12. In various embodiments, act 1202 can include instructing, by the device (e.g., via any of 315), the scientific instrument to capture an image (e.g., 306) of a cutface (e.g., 308) of the lamella.

In various aspects, act 1204 can include generating, by the device (e.g., via 318) and via execution of a neural network (e.g., 502) on the image, a raw classification label (e.g., 602) that indicates probabilities (e.g., 604) of the cutface containing respective ones of the plurality of structures.

In various instances, act 1206 can include converting, by the device (e.g., via 318), the raw classification label into a modified classification label (e.g., 404), by multiplying probabilities of the raw classification label with respective weights (e.g., weights of 704, 706, and 708) indicated by the neighborhood graph for the base structure.

In various cases, act 1208 can include determining, by the device (e.g., via 320), whether or not the modified classification label indicates that the cutface contains the target structure. If so, the computer-implemented method 1200 can end. If not, the computer-implemented method 1200 can proceed to act 1210.

In various aspects, act 1210 can include instructing, by the device (e.g., via 320), the scientific instrument to incrementally mill the cutface of the lamella.

In various instances, act 1212 can include redefining, by the device (e.g., via 318 or 320), the base structure as being whichever one of the plurality of structures is indicated by the modified classification label. In various cases, the computer-implemented method 1200 can then proceed back to act 1202.

Figure 13:
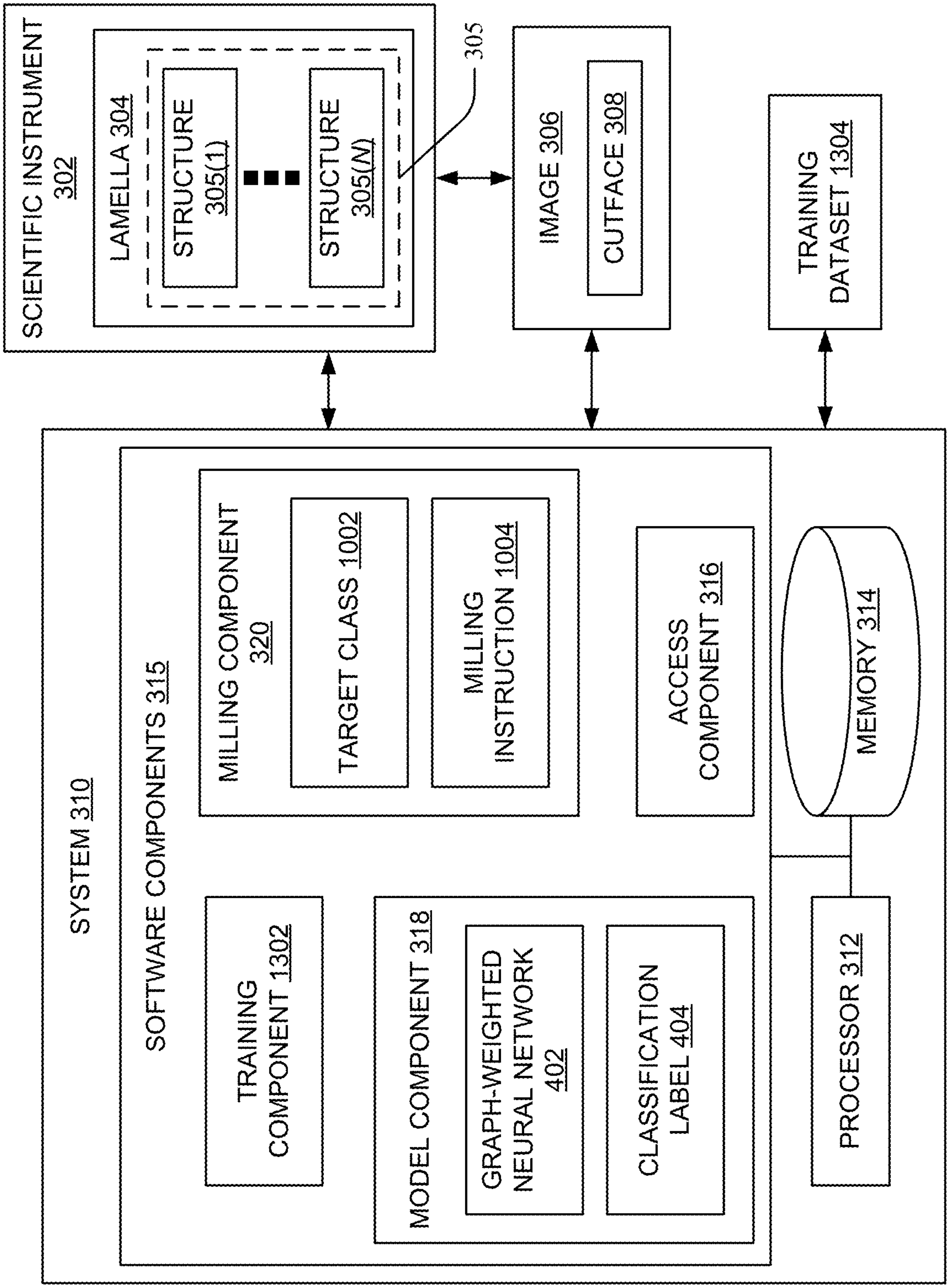
FIG. 13 illustrates a block diagram of an example, non-limiting system including a training component and a training dataset that facilitates lamella end-pointing via graph-weighted neural networks in accordance with one or more embodiments described herein.
Figure 14:
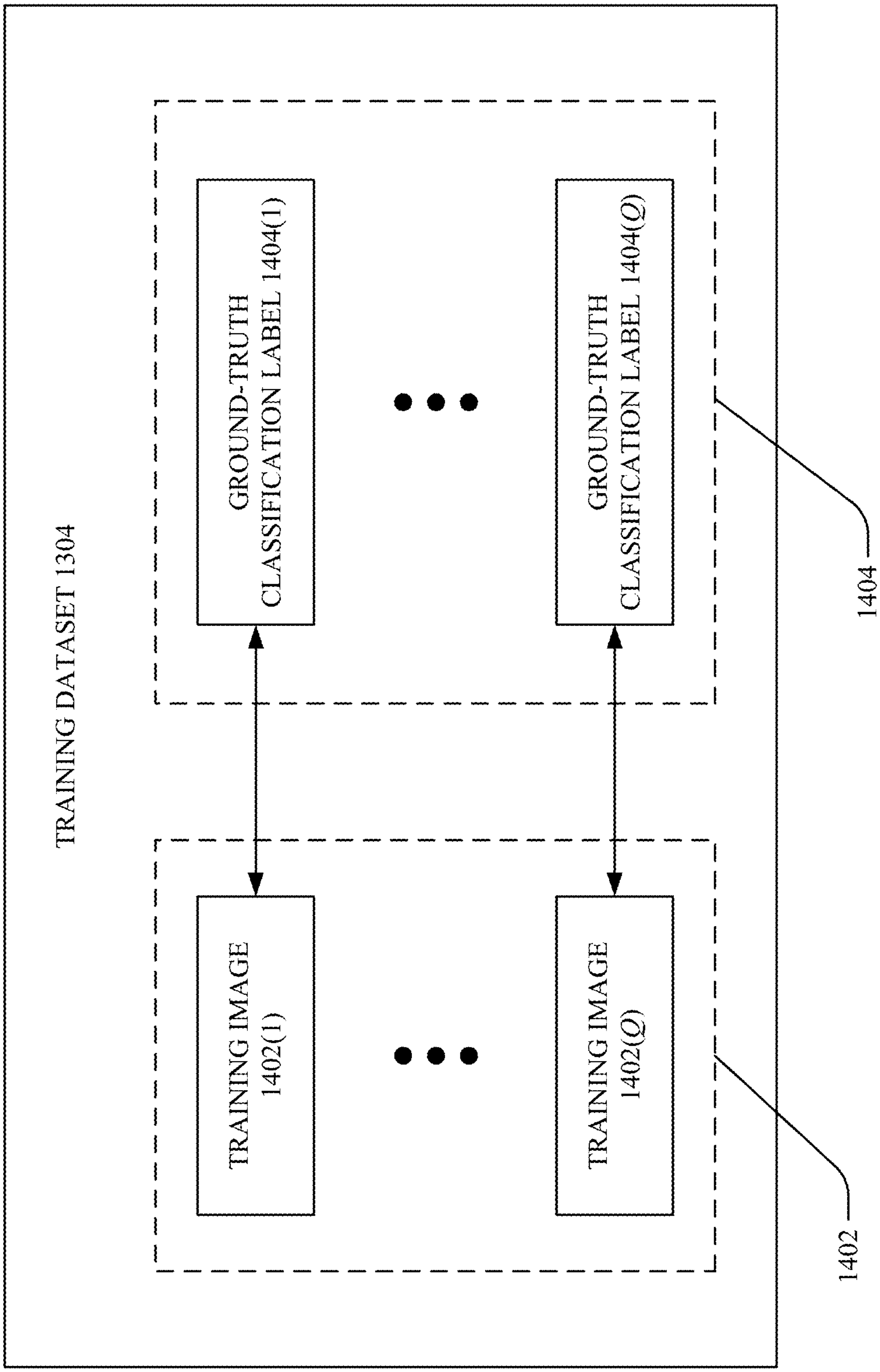
FIGS. 14-15 illustrate example, non-limiting block diagrams showing how a neural network can be trained in accordance with one or more embodiments described herein.
Figure 15:
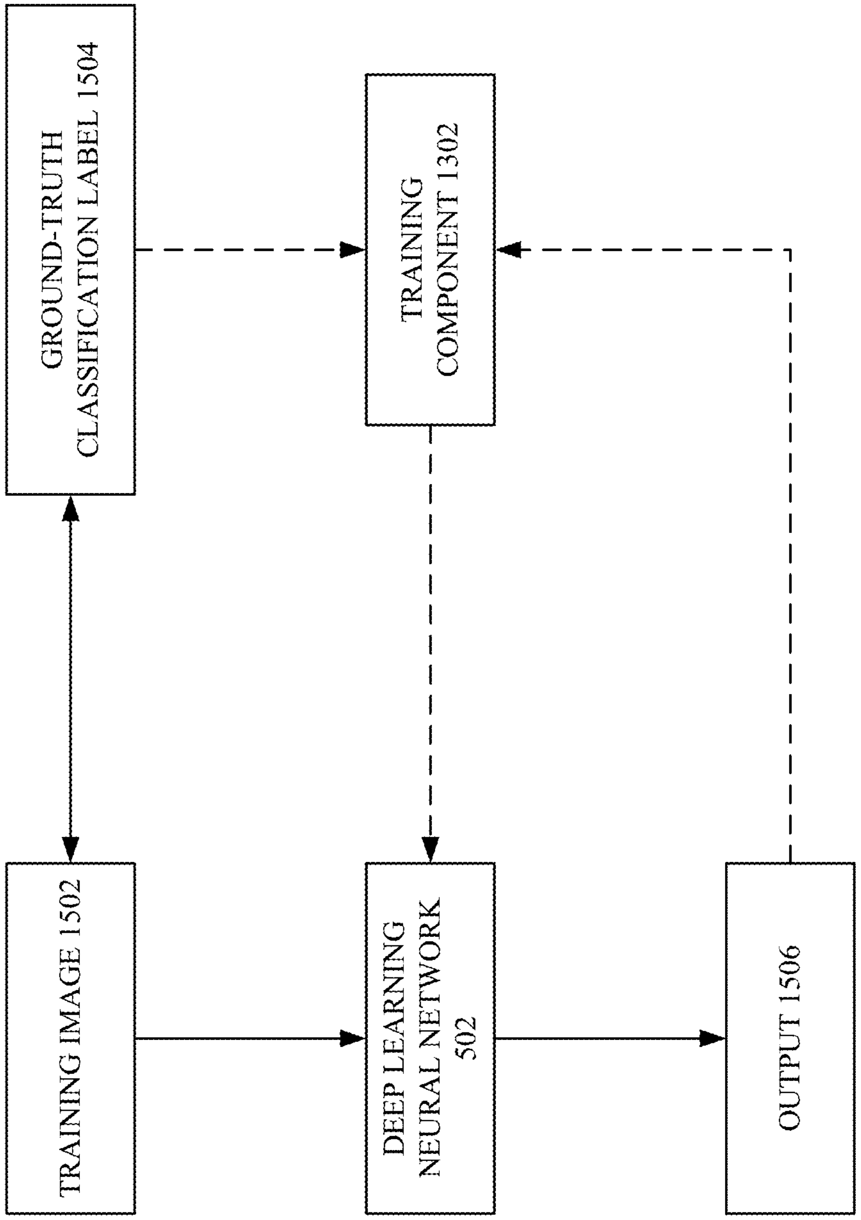

In order for the raw and modified classification labels described herein to be accurate, correct, or reliable, the deep learning neural network 502 can first undergo training, as described with respect to FIGS. 13-15.

FIG. 13 illustrates a block diagram of an example, non-limiting system including a training component and a training dataset that can facilitate lamella end-pointing via graph-weighted neural networks in accordance with one or more embodiments described herein. As shown, the one or more software components 315 can, in some cases, comprise a training component 1302.

In various aspects, the access component 316 can electronically receive, retrieve, or otherwise access, from any suitable source, a training dataset 1304, and the training component 1302 can electronically train the deep learning neural network 502 on the training dataset 1304. Non-limiting aspects are described with respect to FIGS. 14-15.

FIG. 14 illustrates an example, non-limiting block diagram of the training dataset 1304 in accordance with one or more embodiments described herein.

In various aspects, the training dataset 1304 can comprise a set of training images 1402. In various instances, the set of training images 1402 can include q images for any suitable positive integer q: a training image 1402(1) to a training image 1402($q$). In various instances, each of the set of training images 1402 can depict a respective cutface of a lamella that can be known to comprise the same structures (e.g., 305) as the lamella 304.

In various aspects, the training dataset 1304 can comprise a set of ground-truth classification labels 1404 that can respectively correspond to the set of training images 1402.

Accordingly, since the set of training images 1402 can have q images, the set of ground-truth classification labels 1404 can have q labels: a ground-truth classification label 1404(1) to a ground-truth classification label **1404(*q*). In various instances, each of the set of ground-truth classification labels 1404 can be a correct or accurate classification label that is known or deemed to correspond to a respective one of the set of training images 1402. As a non-limiting example, the ground-truth classification label 1404(1) can correspond to the training image 1402(1). Accordingly, the ground-truth classification label 1404(1) can indicate the correct or accurate structure that is known or deemed to be visible in or on the cutface depicted in the training image 1402(1). As another non-limiting example, the ground-truth classification label 1404(*q*) can indicate the correct or accurate structure that is known or deemed to be visible in or on the cutface depicted in the training image 1402(*q*)**.

FIG. 15 illustrates an example, non-limiting block diagram showing how the deep learning neural network 502 can be trained on the training dataset 1304 in accordance with one or more embodiments described herein.

In various aspects, prior to beginning training, the training component 1302 can initialize, in any suitable fashion (e.g., via random initialization), trainable internal parameters (e.g., convolutional kernels, weight matrices, bias values) of the deep learning neural network 502.

In various aspects, the training component 1302 can select a training image 1502 and a ground-truth classification label 1504 corresponding to the training image 1502 from the training dataset 1304. In various instances, the training component 1302 can execute the deep learning neural network 502 on the training image 1502 (or on a device line extracted therefrom), thereby causing the deep learning neural network 502 to produce an output 1506. More specifically, in some cases, the training component 1302 can feed the training image 1502 (or the device line extracted therefrom) to the input layer of the deep learning neural network 502, the training image 1502 (or the device line extracted therefrom) can complete a forward pass through the one or more hidden layers of the deep learning neural network 502, and the output layer of the deep learning neural network 502 can compute the output 1506 based on activation maps or feature maps provided by the one or more hidden layers of the deep learning neural network 502.

Note that the format, size, or dimensionality of the output 1506 can be dictated by the number, arrangement, sizes, or other characteristics of the neurons, convolutional kernels, or other internal parameters of the output layer (or of any other layers) of the deep learning neural network 502. Accordingly, the output 1506 can be forced to have any desired format, size, or dimensionality, by adding, removing, or otherwise adjusting characteristics of the output layer (or of any other layers) of the deep learning neural network 502. So, the output 1506 can be considered as the predicted or inferred classification label that the deep learning neural network 502 believes should correspond to the training image 1502. In contrast, the ground-truth classification label 1504 can be considered as the correct or accurate classification label that is known or deemed to correspond to the training image 1502. Note that, if the deep learning neural network 502 has so far undergone no or little training, then the output 1506 can be highly inaccurate (e.g., can be very different from the ground-truth classification label 1504).

In various aspects, the training component 1302 can compute any suitable error or loss (e.g., mean absolute error, mean squared error, cross-entropy error) between the output 1506 and the ground-truth classification label 1504. In various instances, the training component 1302 can incrementally update the trainable internal parameters of the deep learning neural network 502, via backpropagation (e.g., stochastic gradient descent) driven by the computed error or loss.

In various cases, such execution-and-update procedure can be repeated for any suitable number of training images (e.g., for each training image in the training dataset 1304). This can ultimately cause the trainable internal parameters of the deep learning neural network 502 to become iteratively optimized for accurately classifying the visible structures in inputted images of lamella cutfaces (at least of lamellas whose engineering designs match that of the lamella 304). In various aspects, the training component 1302 can implement any suitable training batch sizes, any suitable error, loss, or objective functions, or any suitable training termination criteria.

Although the above description mainly describes the deep learning neural network 502 as being trained in supervised fashion, this is a mere non-limiting example for ease of illustration and explanation. In various cases, the training component 1302 can implement any other suitable training paradigms (e.g., unsupervised training, reinforcement learning) to train the deep learning neural network 502.

In any case, because the class neighborhood graph 504 can be leveraged as described herein to improve or boost classification accuracy of the deep learning neural network 502, the deep learning neural network 502 need not undergo extensive or voluminous training. In other words, the training dataset 1304 need not contain thousands of images, the curation of which would require the sacrifice or destruction of many dozens or hundreds of lamellas. Instead, the training dataset 1304 can contain far fewer training images (e.g., on the order of a few dozen images) which can require the sacrifice or destruction of far fewer lamellas, and the deep learning neural network 502 can nevertheless effectively achieve satisfactory classification accuracy due to the implementation of the class neighborhood graph 504. Indeed, the present inventors reduced to practice an embodiment described herein, in which satisfactory classification accuracy was achieved for the deep learning neural network 502, even though the deep learning neural network 502 was trained only on images captured from a mere six sacrificed lamellas (e.g., a few dozen training images in total).

FIGS. 16-20 illustrate example, non-limiting experimental results in accordance with one or more embodiments described herein.

Figure 16:
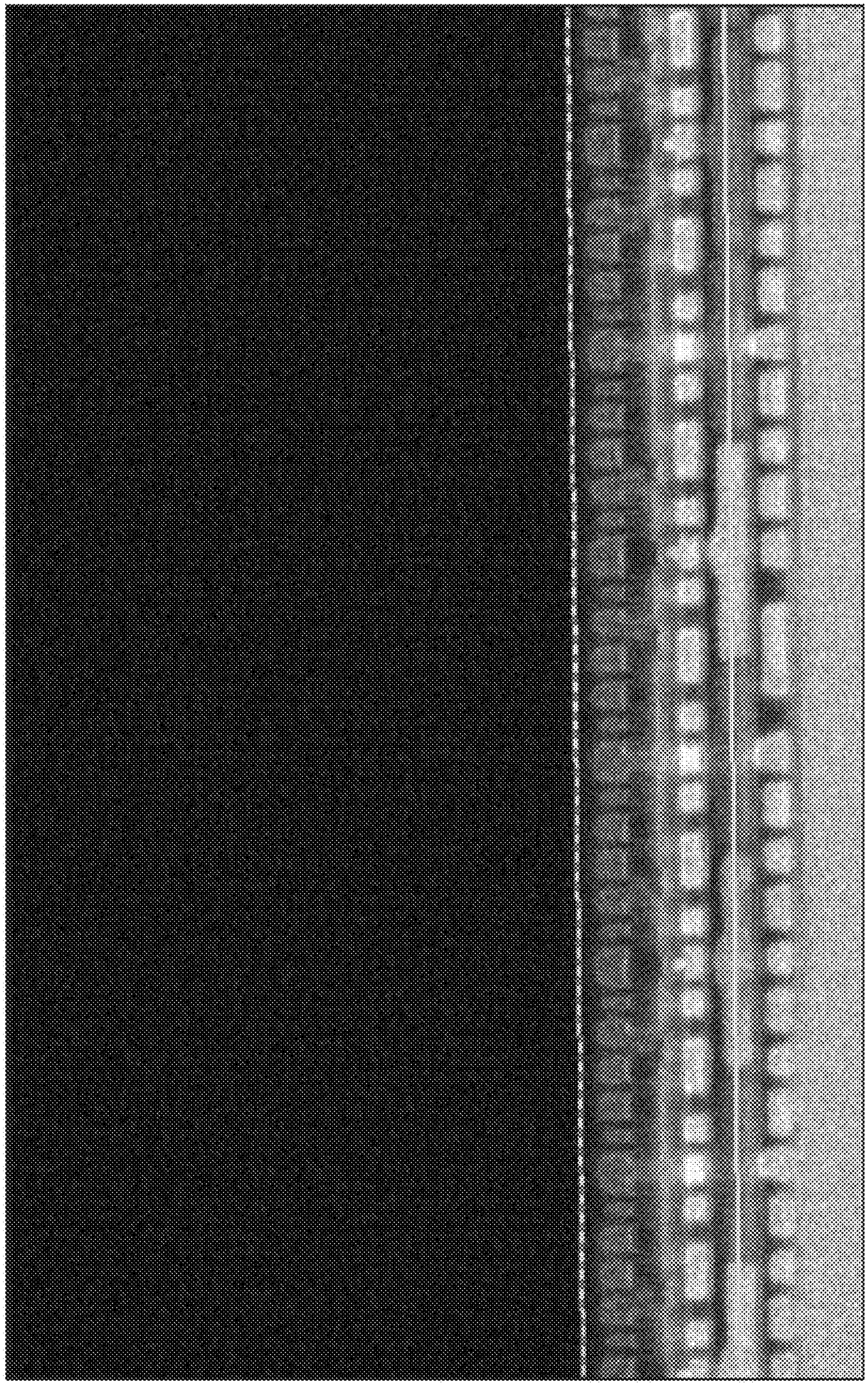
FIGS. 16-20 illustrate example, non-limiting experimental results in accordance with one or more embodiments described herein.

FIG. 16 illustrates an image 1600 that shows a real-world cutface of a real-world lamella.

Figure 17:
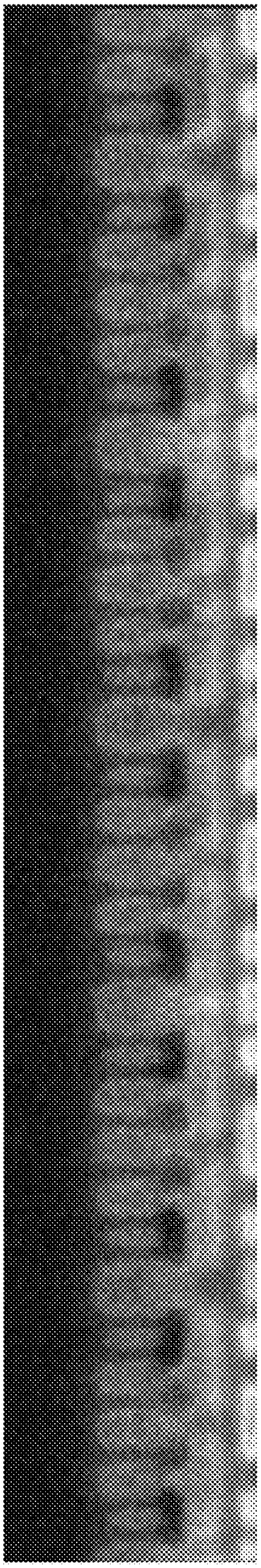

FIG. 17 illustrates a device line 1700 that was extracted or cropped from the image 1600 via the sliding window technique mentioned above.

Figure 18:
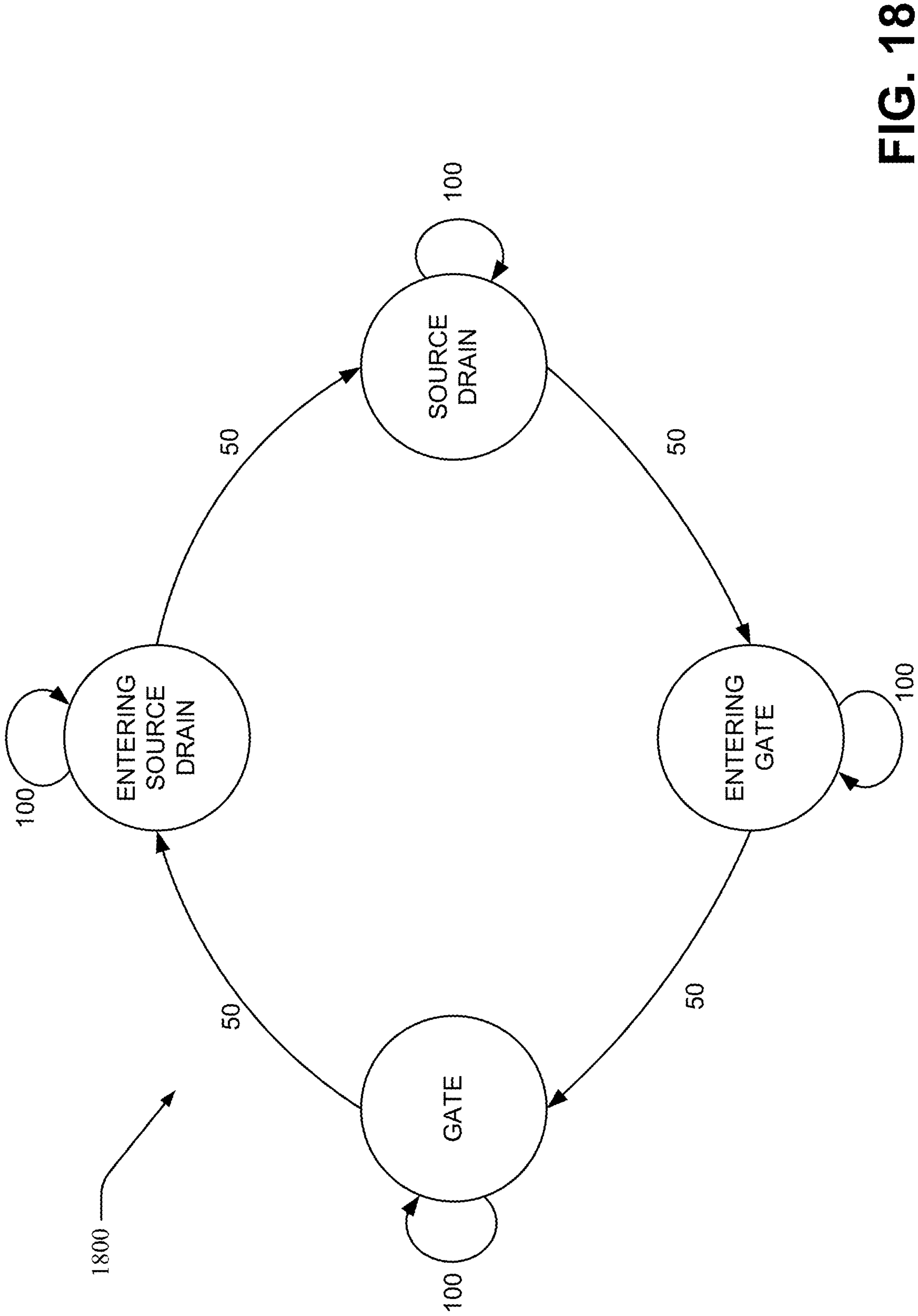

FIG. 18 shows a class neighborhood graph 1800 that was utilized in a non-limiting, example embodiment that was reduced to practice by the present inventors. In particular, the reduction to practice involved a lamella that contained a fin field effect transistor. As shown by the class neighborhood graph 1800, the fin field effect transistor was decomposed into four distinct classes: an entering source drain class; a source drain class; an entering gate class; and a gate class. As shown, the entering source drain class was assigned a high-weight edge with itself, a mid-weight edge with the source drain class, and low-weight edges with both the entering gate class and the gate class (as above, for ease of viewing, the low-weight edges are omitted to avoid visual clutter in FIG. 18). Also as shown, the source drain class was assigned a high-weight edge with itself, a mid-weight edge with the entering gate class, and low-weight edges with both the gate class and the entering source drain class. Furthermore, the entering gate class was assigned a high-weight edge with itself, a mid-weight edge with the gate class, and low-weight edges with both the entering source drain class and the source drain class. Lastly, the gate class was assigned a high-weight edge with itself, a mid-weight edge with the entering source drain class, and low-weight edges with both the entering gate class and the source drain class.

Figure 19:
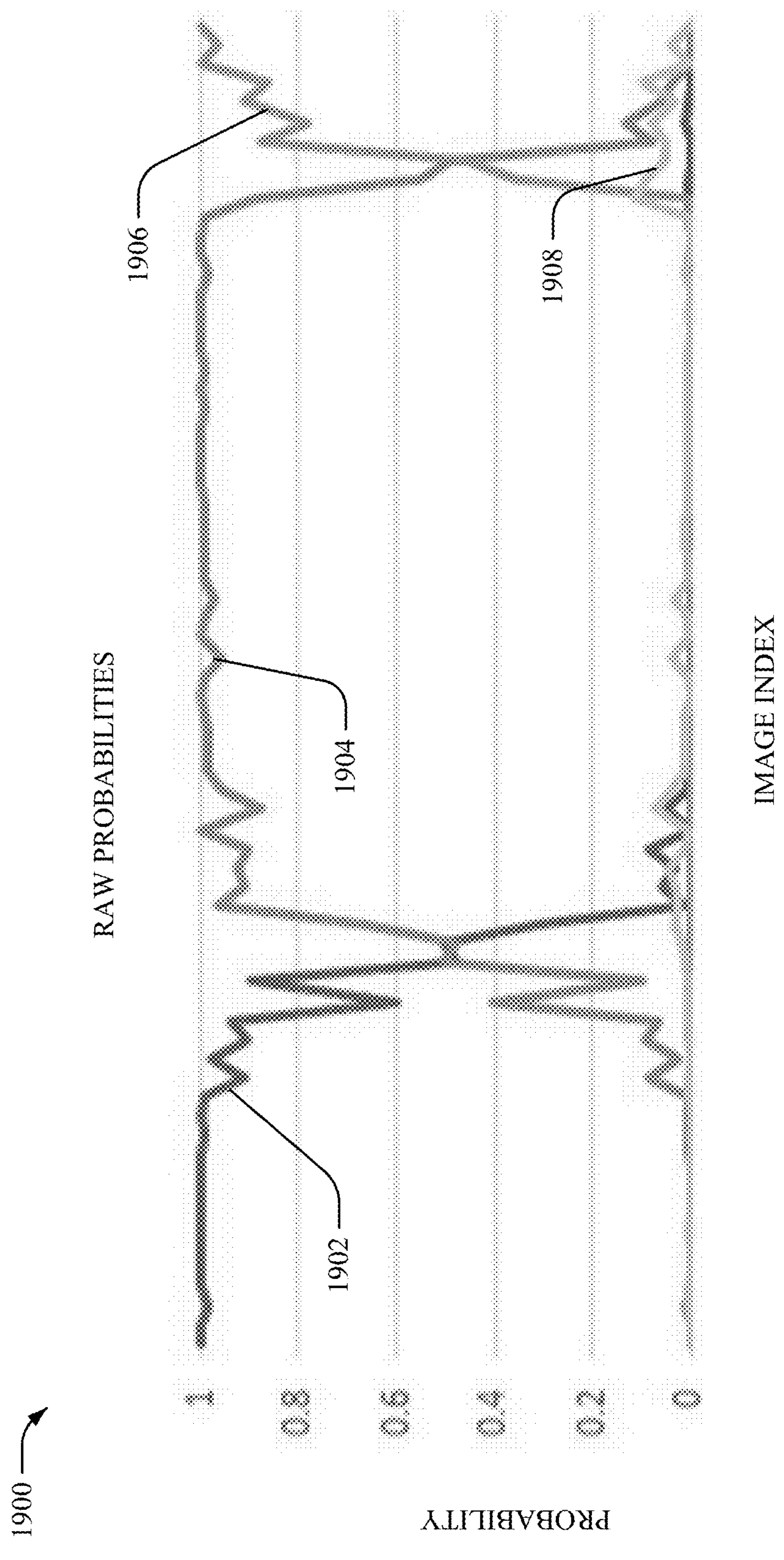

FIG. 19 depicts a graph 1900 showing raw probabilities produced, post-training, by the deep learning neural network 502 for a sequence of cutface images of a particular lamella containing the fin field effect transistor. The legend of the graph 1900 is as follows: numeral 1902 represents the gate class; numeral 1904 represents the entering source drain class; numeral 1906 represents the source drain class; and numeral 1908 represents the entering gate class. As shown, the raw probabilities become very noisy and uncertain near the interfaces between different classes/structures. In other words, the deep learning neural network 502 can be considered as becoming significantly unconfident or unreliable near structure/class transitions (e.g., for cutfaces that are near to a location where one structure ends and another begins). In still other words, the deep learning neural network 502 can be considered as being likely to misclassify cutfaces that are near structure/class transitions.

Figure 20:
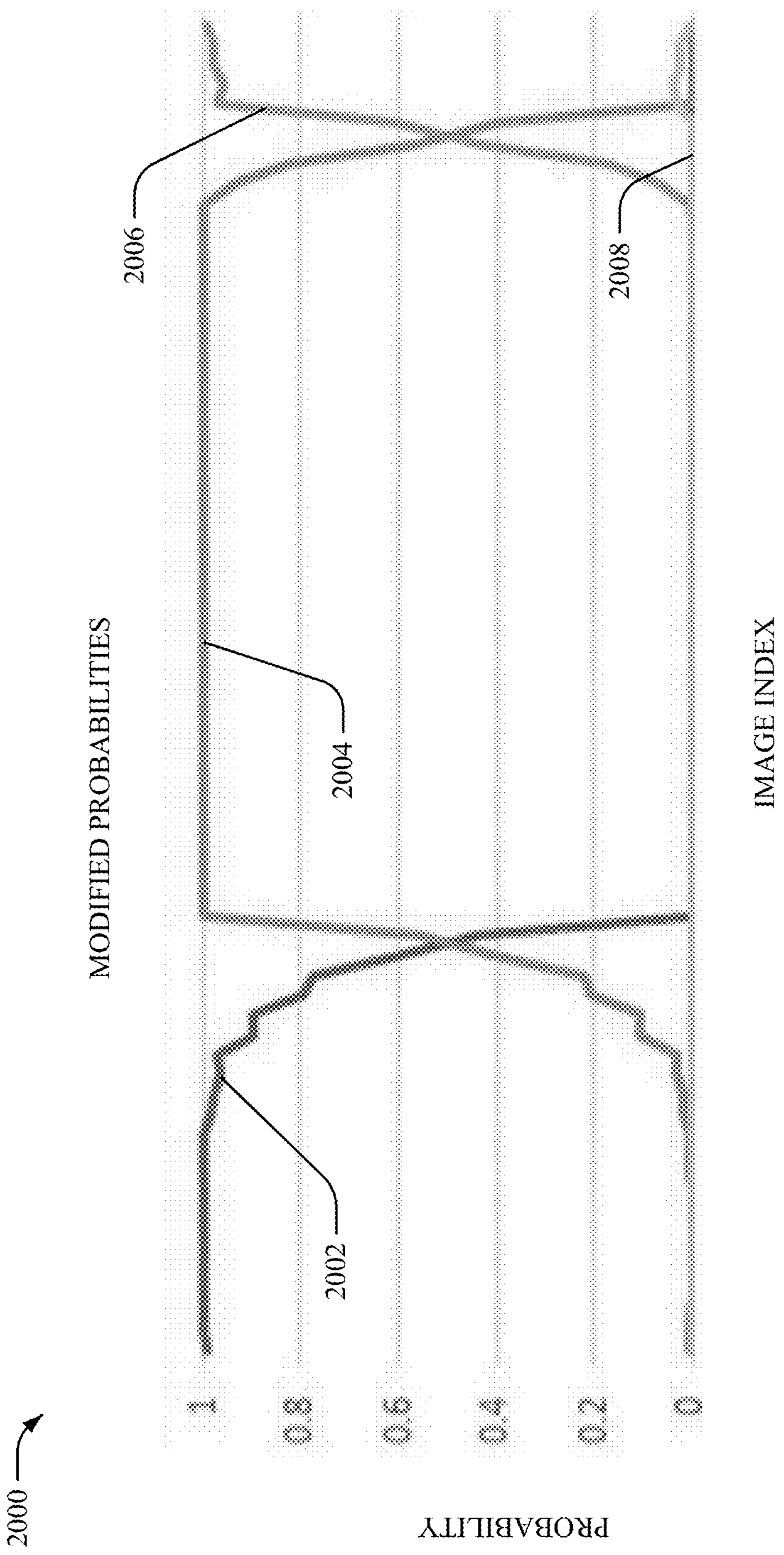

FIG. 20 depicts a graph 2000 showing modified probabilities that are achieved by multiplying and normalizing the raw probabilities shown in FIG. 19 according to the class neighborhood graph 1800 as described herein. The legend of the graph 2000 is as follows: numeral 2002 represents the gate class; numeral 2004 represents the entering source drain class; numeral 2006 represents the source drain class; and numeral 2008 represents the entering gate class. As shown, the modified probabilities are far smoother and less noisy than the raw probabilities, especially at or near structure/class transitions. Thus, the modified probabilities can be considered as being less vulnerable or susceptible to misclassifications than the raw probabilities. In other words, various embodiments described herein can be considered as a clever or inventive technique for helping to prevent or undo false positives or false negatives produced by the deep learning neural network 502. In still other words, various embodiments described herein can be considered as a creative technique for reducing indecision, noise, or uncertainty of the deep learning neural network 502 for lamella cutfaces that are located at or near structure/class transitions or interfaces.

It is to be understood and appreciated that all specific numerical values presented herein are mere non-limiting examples.

Figure 22:
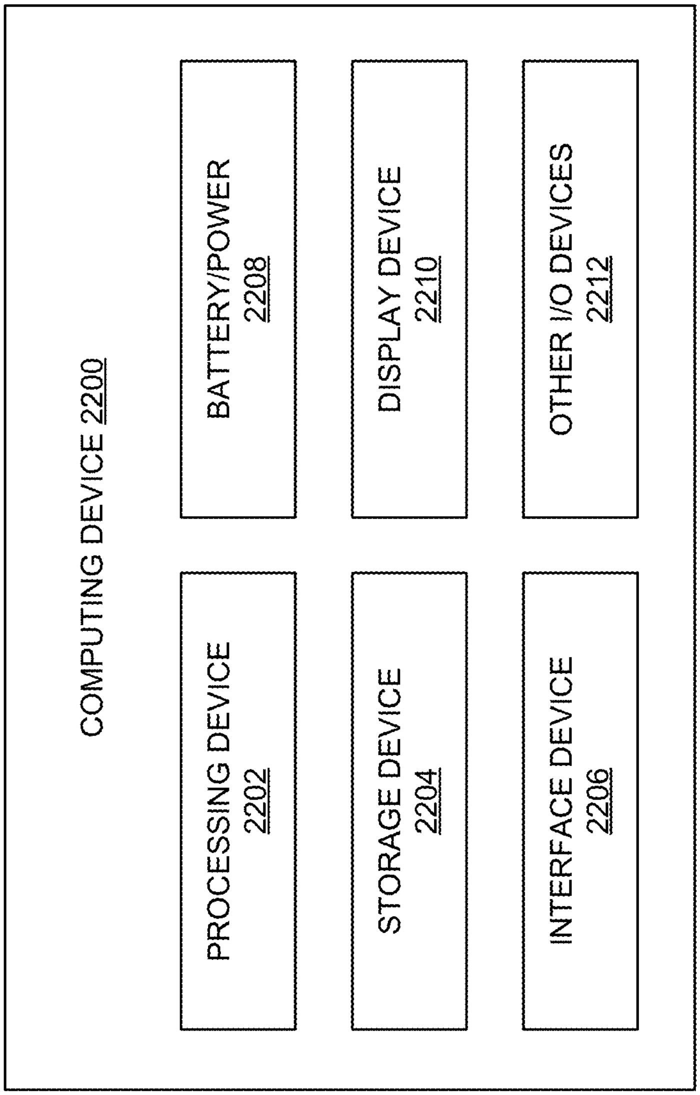
FIG. 22 illustrates an example, non-limiting block diagram of a computing device that can perform some or all of the methods or techniques disclosed herein, in accordance with various embodiments described herein.
Figure 23:
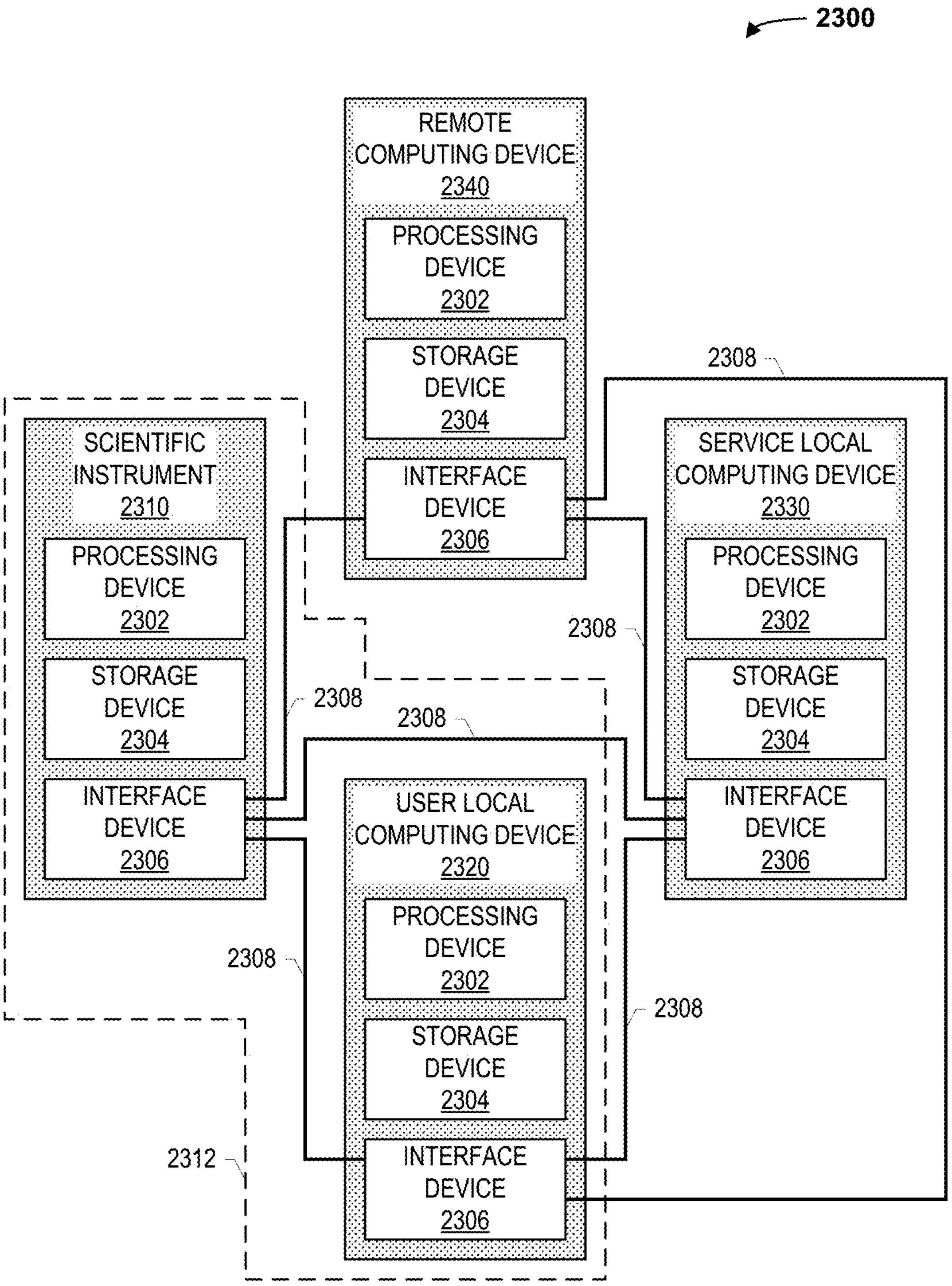
FIG. 23 illustrates an example, non-limiting block diagram of a scientific instrument support system in which some or all of the methods or techniques disclosed herein may be performed, in accordance with various embodiments described herein.

The scientific instrument systems, methods, or techniques disclosed herein may include interactions with a human user (e.g., via a user local computing device 2320 discussed herein with reference to FIG. 23). These interactions may include providing information to the user (e.g., information regarding the operation of a scientific instrument such as the scientific instrument 2310 of FIG. 23, information regarding a sample being analyzed or other test or measurement performed by a scientific instrument, information retrieved from a local or remote database, or other information) or providing an option for a user to input commands (e.g., to control the operation of a scientific instrument such as the scientific instrument 2310 of FIG. 23, or to control the analysis of data generated by a scientific instrument), queries (e.g., to a local or remote database), or other information. In some embodiments, these interactions may be performed through a graphical user interface (GUI) that includes a visual display on a display device (e.g., a display device 2210 discussed herein with reference to FIG. 22) that provides outputs to the user and/or prompts the user to provide inputs (e.g., via one or more input devices, such as a keyboard, mouse, trackpad, or touchscreen, included in other I/O devices 2212 discussed herein with reference to FIG. 22). The scientific instrument systems, methods, or techniques disclosed herein may include any suitable GUIs for interaction with a user.

Figure 21:
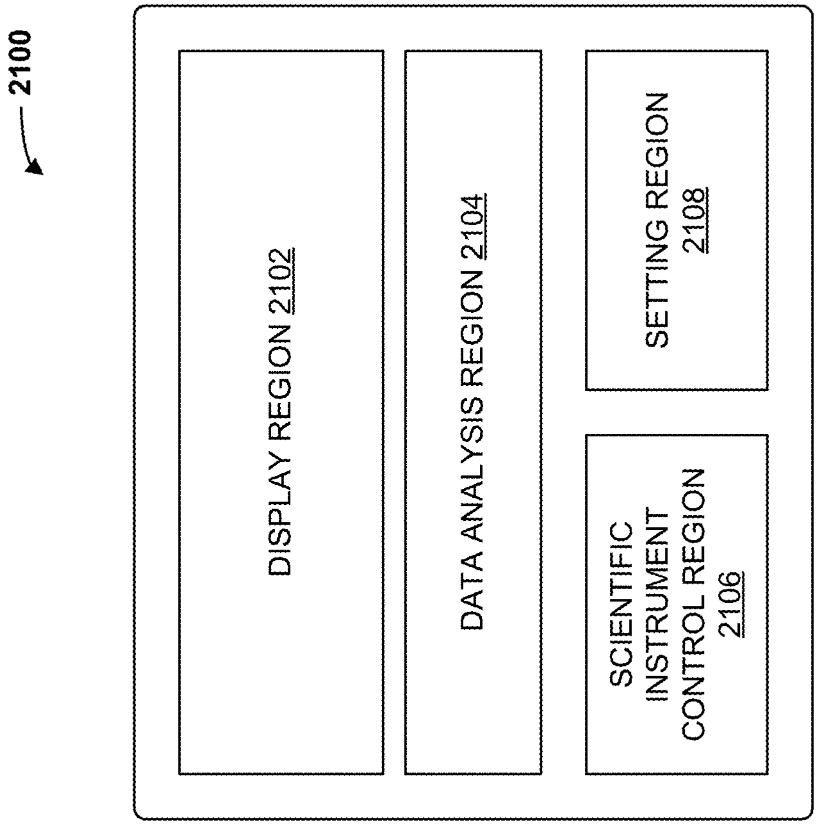
FIG. 21 illustrates an example, non-limiting block diagram of a graphical user interface that can be used in the performance of some or all of the methods or techniques disclosed herein, in accordance with various embodiments described herein.

FIG. 21 depicts an example graphical user interface 2100 (hereafter "GUI 2100") that can be used in the performance of some or all of the support methods or techniques disclosed herein, in accordance with various embodiments. In various aspects, the GUI 2100 can be provided on any suitable electronic display (e.g., a display device 2210 discussed herein with reference to FIG. 22) of a computing device (e.g., a computing device 2200 discussed herein with reference to FIG. 22) of a scientific instrument support system (e.g., a scientific instrument support system 2300 discussed herein with reference to FIG. 23), and a user or technician can interact with the GUI 2100 using any suitable input device (e.g., any of other I/O devices 2212 discussed herein with reference to FIG. 22) and input technique (e.g., movement of a cursor, motion capture, facial recognition, gesture detection, voice recognition, actuation of buttons).

The GUI 2100 can include a data display region 2102, a data analysis region 2104, a scientific instrument control region 2106, and a setting region 2108. The particular number and arrangement of regions depicted in FIG. 21 is merely illustrative, and any number and arrangement of regions, including any desired features, can be included in other embodiments of the GUI 2100.

The data display region 2102 can display data generated by a scientific instrument (e.g., a scientific instrument 2310 discussed herein with reference to FIG. 23).

The data analysis region 2104 can display any suitable data analysis results (e.g., the results of analyzing the data illustrated in the data display region 2102 or other data). In some embodiments, the data display region 2102 and the data analysis region 2104 can be combined in the GUI 2100 (e.g., to include both data output from a scientific instrument and some analysis of the data in a common graph or region).

The scientific instrument control region 2106 can include options that allow a user or technician to control a scientific instrument (e.g., the scientific instrument 2310 discussed herein with reference to FIG. 23). For example, the scientific instrument control region 2106 can include configurable parameters that govern operation of such scientific instrument (e.g., configurable parameters that govern voltages or electric currents of the scientific instrument, that govern interior temperatures of the scientific instrument, or that govern fluid flow rates of the scientific instrument).

The setting region 2108 can include options that allow a user or technician to control any features or functions of the GUI 2100 (or of other GUIs) or to perform common computing operations with respect to the data display region 2102 and the data analysis region 2104 (e.g., saving data on a storage device, such as the storage device 2204 discussed herein with reference to FIG. 22, sending data to another user, labeling data).

As noted above, the scientific instrument module 102 can be implemented by one or more computing devices. FIG. 22 is a block diagram of a computing device 2200 that can perform some or all of the scientific instrument methods or techniques disclosed herein, in accordance with various embodiments. In some embodiments, the scientific instrument module 102 can be implemented by a single instance of the computing device 2200 or by multiple instances of the computing device 2200. Further, as discussed below, the computing device 2200 (or multiple instances thereof) that implements the scientific instrument module 102 can be part of one or more of a scientific instrument 2310, a user local computing device 2320, a service local computing device 2330, or a remote computing device 2340 of FIG. 23.

The computing device 2200 is illustrated as having a number of components, but any one or more of these components can be omitted or duplicated, as suitable for the application and setting. In some embodiments, some or all of the components included in the computing device 2200 can be attached to one or more motherboards and enclosed in a housing (e.g., including plastic, metal, or other materials). In some embodiments, some these components can be fabricated onto a single system-on-a-chip (SoC) (e.g., an SoC may include one or more instances of a processing device 2202 and one or more instances of a storage device 2204). Additionally, in various embodiments, the computing device 2200 can omit one or more of the components illustrated in FIG. 22, but can include interface circuitry (not shown) for coupling to the one or more omitted components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 2200 can omit a display device 2210, but can include display device interface circuitry (e.g., a connector and driver circuitry) to which a display device 2210 can be coupled.

The computing device 2200 can include a processing device 2202 (e.g., one or more processing devices). As used herein, the term "processing device" can refer to any device or portion of a device that processes electronic data from registers or memory to transform that electronic data into other electronic data that may be stored in registers or memories. The processing device 2202 can include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2200 can include a storage device 2204 (e.g., one or more storage devices). The storage device 2204 can include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 2204 can include memory that shares a die with a processing device 2202. In such an embodiment, the memory may be used as cache memory and may include embedded dynamic random access memory (eDRAM) or spin transfer torque magnetic random access memory (STT-MRAM), for example. In some embodiments, the storage device 2204 can include non-transitory computer readable media having instructions thereon that, when executed by one or more processing devices (e.g., the processing device 2202), cause the computing device 2200 to perform any appropriate ones of or portions of the methods disclosed herein.

The computing device 2200 can include an interface device 2206 (e.g., one or more instances of the interface device 2206). The interface device 2206 can include one or more communication chips, connectors, or other hardware and software to govern communications between the computing device 2200 and other computing devices. For example, the interface device 2206 can include circuitry for managing wireless communications for the transfer of data to and from the computing device 2200. The term "wireless" and its derivatives may be used to describe circuits, devices, systems, methods, techniques, or communications channels that may communicate data through the use of modulated electromagnetic radiation through a nonsolid medium. The term does not imply that the associated devices do not contain any wires, although in some embodiments they might not. Circuitry included in the interface device 2206 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2")). In some embodiments, circuitry included in the interface device 2206 for managing wireless communications can operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 2206 for managing wireless communications can operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 2206 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 2206 may include one or more antennas (e.g., one or more antenna arrays) to receipt and/or transmission of wireless communications.

In some embodiments, the interface device 2206 can include circuitry for managing wired communications, such as electrical, optical, or any other suitable communication protocols. For example, the interface device 2206 can include circuitry to support communications in accordance with Ethernet technologies. In some embodiments, the interface device 2206 can support both wireless and wired communication, or can support multiple wired communication protocols or multiple wireless communication protocols. For example, a first set of circuitry of the interface device 2206 may be dedicated to shorter-range wireless communications such as Wi-Fi or Bluetooth, and a second set of circuitry of the interface device 2206 may be dedicated to longer-range wireless communications such as global positioning system (GPS), EDGE, GPRS, CDMA, WiMAX, LTE, EV-DO, or others. In some embodiments, a first set of circuitry of the interface device 2206 can be dedicated to wireless communications, and a second set of circuitry of the interface device 2206 can be dedicated to wired communications.

The computing device 2200 can include battery/power circuitry 2208. The battery/power circuitry 2208 can include one or more energy storage devices (e.g., batteries or capacitors) or circuitry for coupling components of the computing device 2200 to an energy source separate from the computing device 2200 (e.g., alternating current line power).

The computing device 2200 can include a display device 2210 (e.g., multiple display devices). The display device 2210 can include any visual indicators, such as a heads-up display, a computer monitor, a projector, a touchscreen display, a liquid crystal display (LCD), a light-emitting diode display, or a flat panel display.

The computing device 2200 can include other input/output (I/O) devices 2212. The other I/O devices 2212 can include one or more audio output devices (e.g., speakers, headsets, earbuds, alarms), one or more audio input devices (e.g., microphones or microphone arrays), location devices (e.g., GPS devices in communication with a satellite-based system to receive a location of the computing device 2200), audio codecs, video codecs, printers, sensors (e.g., thermocouples or other temperature sensors, humidity sensors, pressure sensors, vibration sensors, accelerometers, gyroscopes), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 2200 can have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra mobile personal computer), a desktop computing device, or a server computing device or other networked computing component.

One or more computing devices implementing any of the scientific instrument modules, methods, or techniques disclosed herein may be part of a scientific instrument support system. FIG. 23 is a block diagram of an example scientific instrument support system 2300 in which some or all of the scientific instrument support methods disclosed herein may be performed, in accordance with various embodiments. The scientific instrument modules, methods, or techniques disclosed herein (e.g., the scientific instrument module 102, the computer-implemented method 200, the system 310) can be implemented by one or more of a scientific instrument 2310, a user local computing device 2320, a service local computing device 2330, or a remote computing device 2340 of the scientific instrument support system 2300.

Any of the scientific instrument 2310, the user local computing device 2320, the service local computing device 2330, or the remote computing device 2340 can include any of the embodiments of the computing device 2200, and any of the scientific instrument 2310, the user local computing device 2320, the service local computing device 2330, or the remote computing device 2340 can take the form of any appropriate ones of the embodiments of the computing device 2200.

The scientific instrument 2310, the user local computing device 2320, the service local computing device 2330, or the remote computing device 2340 may each include a processing device 2302, a storage device 2304, and an interface device 2306. The processing device 2302 may take any suitable form, including any form of the processing device 2202, and the processing devices 2302 included in different ones of the scientific instrument 2310, the user local computing device 2320, the service local computing device 2330, or the remote computing device 2340 may take the same form or different forms. The storage device 2304 may take any suitable form, including any form of the storage device 2204, and the storage devices 2304 included in different ones of the scientific instrument 2310, the user local computing device 2320, the service local computing device 2330, or the remote computing device 2340 may take the same form or different forms. The interface device 2306 may take any suitable form, including any form of the interface device 2206, and the interface devices 2306 included in different ones of the scientific instrument 2310, the user local computing device 2320, the service local computing device 2330, or the remote computing device 2340 may take the same form or different forms.

The scientific instrument 2310, the user local computing device 2320, the service local computing device 2330, and the remote computing device 2340 can be in communication with other elements of the scientific instrument support system 2300 via communication pathways 2308. The communication pathways 2308 may communicatively couple the interface devices 2306 of different ones of the elements of the scientific instrument support system 2300, as shown, and may be wired or wireless communication pathways (e.g., in accordance with any of the communication techniques discussed herein with reference to the interface device 2206). The particular scientific instrument support system 2300 depicted in FIG. 23 includes communication pathways between each pair of the scientific instrument 2310, the user local computing device 2320, the service local computing device 2330, and the remote computing device 2340, but this "fully connected" implementation is merely illustrative, and in various embodiments, various ones of the communication pathways 2308 may be absent. For example, in some embodiments, a service local computing device 2330 can lack a direct communication pathway 2308 between its interface device 2306 and the interface device 2306 of the scientific instrument 2310, but can instead communicate with the scientific instrument 2310 via the communication pathway 2308 between the service local computing device 2330 and the user local computing device 2320 and the communication pathway 2308 between the user local computing device 2320 and the scientific instrument 2310.

The scientific instrument 2310 may include any appropriate scientific instrument, such as the scientific instrument 302.

The user local computing device 2320 can be a computing device (e.g., in accordance with any of the embodiments of the computing device 2200) that is local to a user of the scientific instrument 2310. In some embodiments, the user local computing device 2320 may also be local to the scientific instrument 2310, but this need not be the case; for example, a user local computing device 2320 that is in a user's home or office may be remote from, but in communication with, the scientific instrument 2310 so that the user may use the user local computing device 2320 to control or access data from the scientific instrument 2310. In some embodiments, the user local computing device 2320 may be a laptop, smartphone, or tablet device. In some embodiments the user local computing device 2320 can be a portable computing device.

The service local computing device 2330 can be a computing device (e.g., in accordance with any of the embodiments of the computing device 2200) that is local to an entity that services the scientific instrument 2310. For example, the service local computing device 2330 may be local to a manufacturer of the scientific instrument 2310 or to a third-party service company. In some embodiments, the service local computing device 2330 can communicate with the scientific instrument 2310, the user local computing device 2320, or the remote computing device 2340 (e.g., via a direct communication pathway 2308 or via multiple "indirect" communication pathways 2308, as discussed above) to receive data regarding the operation of the scientific instrument 2310, the user local computing device 2320, or the remote computing device 2340 (e.g., the results of self-tests of the scientific instrument 2310, calibration coefficients used by the scientific instrument 2310, the measurements of sensors associated with the scientific instrument 2310). In some embodiments, the service local computing device 2330 may communicate with the scientific instrument 2310, the user local computing device 2320, or the remote computing device 2340 (e.g., via a direct communication pathway 2308 or via multiple "indirect" communication pathways 2308, as discussed above) to transmit data to the scientific instrument 2310, the user local computing device 2320, or the remote computing device 2340 (e.g., to update programmed instructions, such as firmware, in the scientific instrument 2310, to initiate the performance of test or calibration sequences in the scientific instrument 2310, to update programmed instructions, such as software, in the user local computing device 2320 or the remote computing device 2340). A user of the scientific instrument 2310 can utilize the scientific instrument 2310 or the user local computing device 2320 to communicate with the service local computing device 2330 to report a problem with the scientific instrument 2310 or the user local computing device 2320, to request a visit from a technician to improve the operation of the scientific instrument 2310, to order consumables or replacement parts associated with the scientific instrument 2310, or for other purposes.

The remote computing device 2340 can be a computing device (e.g., in accordance with any of the embodiments of the computing device 2200 discussed herein) that is remote from the scientific instrument 2310 or from the user local computing device 2320. In some embodiments, the remote computing device 2340 can be included in a datacenter or other large-scale server environment. In some embodiments, the remote computing device 2340 may include network-attached storage (e.g., as part of the storage device 2304). The remote computing device 2340 can store data generated by the scientific instrument 2310, perform analyses of the data generated by the scientific instrument 2310 (e.g., in accordance with programmed instructions), facilitate communication between the user local computing device 2320 and the scientific instrument 2310, or facilitate communication between the service local computing device 2330 and the scientific instrument 2310.

In some embodiments, one or more of the elements of the scientific instrument support system 2300 illustrated in FIG. 23 can be omitted. Further, in some embodiments, multiple ones of various ones of the elements of the scientific instrument support system 2300 of FIG. 23 may be present. For example, a scientific instrument support system 2300 can include multiple user local computing devices 2320 (e.g., different user local computing devices 2320 associated with different users or in different locations). In another example, a scientific instrument support system 2300 may include multiple scientific instruments 2310, all in communication with service local computing device 2330 and/or a remote computing device 2340; in such an embodiment, the service local computing device 2330 may monitor these multiple scientific instruments 2310, and the service local computing device 2330 may cause updates or other information may be "broadcast" to multiple scientific instruments 2310 at the same time. Different ones of the scientific instruments 2310 in a scientific instrument support system 2300 can be located close to one another (e.g., in the same room) or farther from one another (e.g., on different floors of a building, in different buildings, in different cities, etc.). In some embodiments, a scientific instrument 2310 can be connected to an Internet-of-Things (IoT) stack that allows for command and control of the scientific instrument 2310 through a web-based application, a virtual or augmented reality application, a mobile application, or a desktop application. Any of these applications can be accessed by a user operating the user local computing device 2320 in communication with the scientific instrument 2310 by the intervening remote computing device 2340. In some embodiments, a scientific instrument 2310 may be sold by the manufacturer along with one or more associated user local computing devices 2320 as part of a local scientific instrument computing unit 2312.

In some embodiments, different ones of the scientific instruments 2310 included in a scientific instrument support system 2300 may be different types of scientific instruments 2310; for example, one scientific instrument 2310 may be a mass spectrometer, while another scientific instrument 2310 may be a chromatograph or autosampler. In some such embodiments, the remote computing device 2340 or the user local computing device 2320 can combine data from different types of scientific instruments 2310 included in a scientific instrument support system 2300.

In various instances, machine learning algorithms or models can be implemented in any suitable way to facilitate any suitable aspects described herein. To facilitate some of the above-described machine learning aspects of various embodiments, consider the following discussion of artificial intelligence (AI). Various embodiments described herein can employ artificial intelligence to facilitate automating one or more features or functionalities. The components can employ various AI-based schemes for carrying out various embodiments/examples disclosed herein. In order to provide for or aid in the numerous determinations (e.g., determine, ascertain, infer, calculate, predict, prognose, estimate, derive, forecast, detect, compute) described herein, components described herein can examine the entirety or a subset of the data to which it is granted access and can provide for reasoning about or determine states of the system or environment from a set of observations as captured via events or data. Determinations can be employed to identify a specific context or action, or can generate a probability distribution over states, for example. The determinations can be probabilistic; that is, the computation of a probability distribution over states of interest based on a consideration of data and events. Determinations can also refer to techniques employed for composing higher-level events from a set of events or data.

Such determinations can result in the construction of new events or actions from a set of observed events or stored event data, whether or not the events are correlated in close temporal proximity, and whether the events and data come from one or several event and data sources. Components disclosed herein can employ various classification (explicitly trained (e.g., via training data) as well as implicitly trained (e.g., via observing behavior, preferences, historical information, receiving extrinsic information, and so on)) schemes or systems (e.g., support vector machines, neural networks, expert systems, Bayesian belief networks, fuzzy logic, data fusion engines, and so on) in connection with performing automatic or determined action in connection with the claimed subject matter. Thus, classification schemes or systems can be used to automatically learn and perform a number of functions, actions, or determinations.

A classifier can map an input attribute vector, z=(Z1, Z2, Z3, Z4, Zn), to a confidence that the input belongs to a class, as by f(z)=confidence (class). Such classification can employ a probabilistic or statistical-based analysis (e.g., factoring into the analysis utilities and costs) to determinate an action to be automatically performed. A support vector machine (SVM) can be an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, or probabilistic classification models providing different patterns of independence, any of which can be employed. Classification as used herein also is inclusive of statistical regression that is utilized to develop models of priority.

Figure 24:
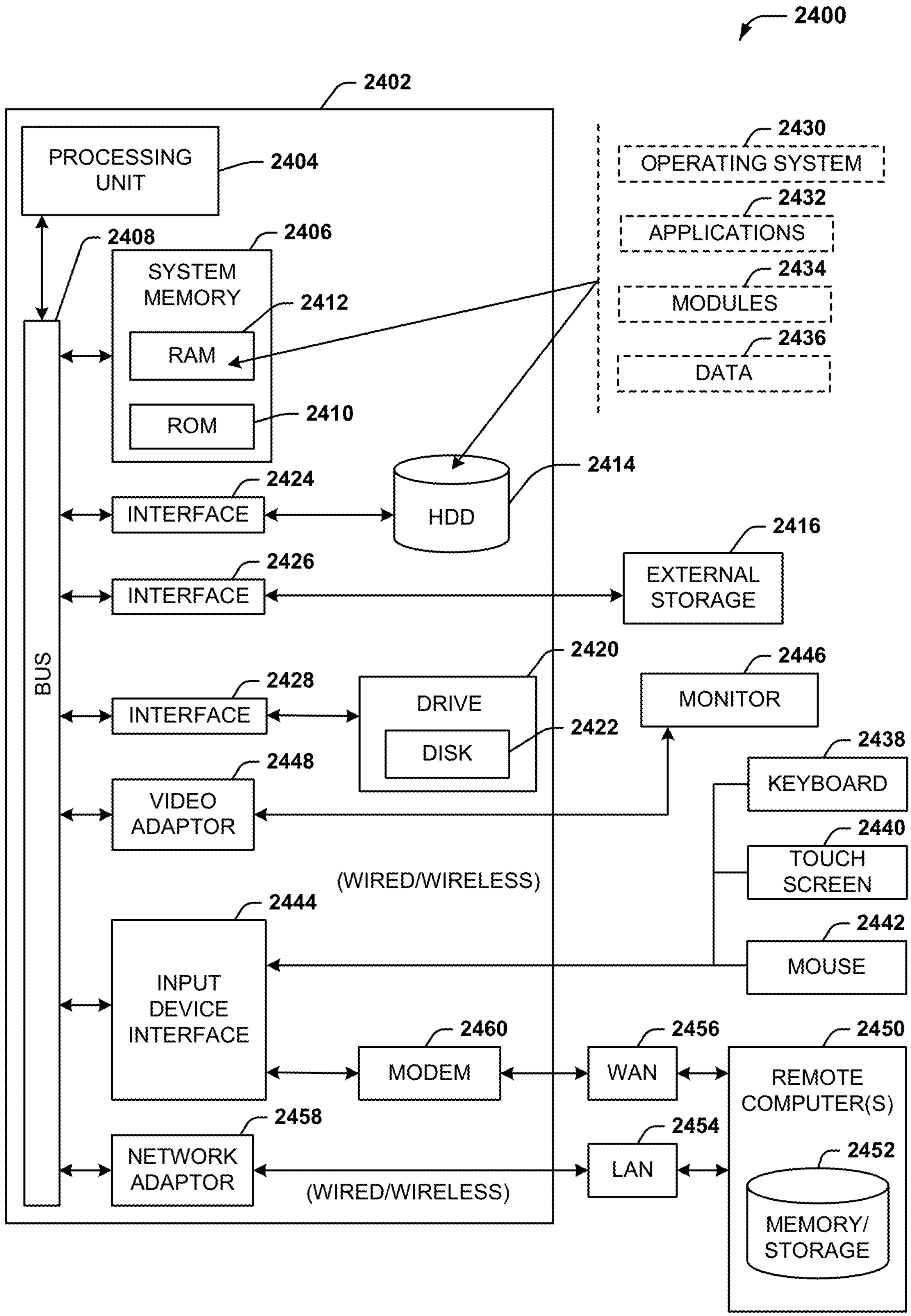
FIG. 24 illustrates a block diagram of an example, non-limiting operating environment in which one or more embodiments described herein can be facilitated.

In order to provide additional context for various embodiments described herein, FIG. 24 and the following discussion are intended to provide a brief, general description of a suitable computing environment 2400 in which the various embodiments of the embodiment described herein can be implemented. While the embodiments have been described above in the general context of computer-executable instructions that can run on one or more computers, those skilled in the art will recognize that the embodiments can be also implemented in combination with other program modules or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 24, the example environment 2400 for implementing various embodiments of the aspects described herein includes a computer 2402, the computer 2402 including a processing unit 2404, a system memory 2406 and a system bus 2408. The system bus 2408 couples system components including, but not limited to, the system memory 2406 to the processing unit 2404. The processing unit 2404 can be any of various commercially available processors. Dual microprocessors and other multi-processor architectures can also be employed as the processing unit 2404.

The system bus 2408 can be any of several types of bus structure that can further interconnect to a memory bus (with or without a memory controller), a peripheral bus, and a local bus using any of a variety of commercially available bus architectures. The system memory 2406 includes ROM 2410 and RAM 2412. A basic input/output system (BIOS) can be stored in a non-volatile memory such as ROM, erasable programmable read only memory (EPROM), EEPROM, which BIOS contains the basic routines that help to transfer information between elements within the computer 2402, such as during startup. The RAM 2412 can also include a high-speed RAM such as static RAM for caching data.

The computer 2402 further includes an internal hard disk drive (HDD) 2414 (e.g., EIDE, SATA), one or more external storage devices 2416 (e.g., a magnetic floppy disk drive (FDD) 2416, a memory stick or flash drive reader, a memory card reader, etc.) and a drive 2420, e.g., such as a solid state drive, an optical disk drive, which can read or write from a disk 2422, such as a CD-ROM disc, a DVD, a BD, etc.

Alternatively, where a solid state drive is involved, disk 2422 would not be included, unless separate. While the internal HDD 2414 is illustrated as located within the computer 2402, the internal HDD 2414 can also be configured for external use in a suitable chassis (not shown). Additionally, while not shown in environment 2400, a solid state drive (SSD) could be used in addition to, or in place of, an HDD 2414. The HDD 2414, external storage device(s) 2416 and drive 2420 can be connected to the system bus 2408 by an HDD interface 2424, an external storage interface 2426 and a drive interface 2428, respectively. The interface 2424 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2402, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2412, including an operating system 2430, one or more application programs 2432, other program modules 2434 and program data 2436. All or portions of the operating system, applications, modules, or data can also be cached in the RAM 2412. The systems and methods described herein can be implemented utilizing various commercially available operating systems or combinations of operating systems.

Computer 2402 can optionally comprise emulation technologies. For example, a hypervisor (not shown) or other intermediary can emulate a hardware environment for operating system 2430, and the emulated hardware can optionally be different from the hardware illustrated in FIG. 24. In such an embodiment, operating system 2430 can comprise one virtual machine (VM) of multiple VMs hosted at computer 2402. Furthermore, operating system 2430 can provide runtime environments, such as the Java runtime environment or the .NET framework, for applications 2432. Runtime environments are consistent execution environments that allow applications 2432 to run on any operating system that includes the runtime environment. Similarly, operating system 2430 can support containers, and applications 2432 can be in the form of containers, which are lightweight, standalone, executable packages of software that include, e.g., code, runtime, system tools, system libraries and settings for an application.

Further, computer 2402 can be enable with a security module, such as a trusted processing module (TPM). For instance with a TPM, boot components hash next in time boot components, and wait for a match of results to secured values, before loading a next boot component. This process can take place at any layer in the code execution stack of computer 2402, e.g., applied at the application execution level or at the operating system (OS) kernel level, thereby enabling security at any level of code execution.

A user can enter commands and information into the computer 2402 through one or more wired/wireless input devices, e.g., a keyboard 2438, a touch screen 2440, and a pointing device, such as a mouse 2442. Other input devices (not shown) can include a microphone, an infrared (IR) remote control, a radio frequency (RF) remote control, or other remote control, a joystick, a virtual reality controller or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 2404 through an input device interface 2444 that can be coupled to the system bus 2408, but can be connected by other interfaces, such as a parallel port, an IEEE 1394 serial port, a game port, a USB port, an IR interface, a BLUETOOTH® interface, etc.

A monitor 2446 or other type of display device can be also connected to the system bus 2408 via an interface, such as a video adapter 2448. In addition to the monitor 2446, a computer typically includes other peripheral output devices (not shown), such as speakers, printers, etc.

The computer 2402 can operate in a networked environment using logical connections via wired or wireless communications to one or more remote computers, such as a remote computer(s) 2450. The remote computer(s) 2450 can be a workstation, a server computer, a router, a personal computer, portable computer, microprocessor-based entertainment appliance, a peer device or other common network node, and typically includes many or all of the elements described relative to the computer 2402, although, for purposes of brevity, only a memory/storage device 2452 is illustrated. The logical connections depicted include wired/wireless connectivity to a local area network (LAN) 2454 or larger networks, e.g., a wide area network (WAN) 2456. Such LAN and WAN networking environments are commonplace in offices and companies, and facilitate enterprise-wide computer networks, such as intranets, all of which can connect to a global communications network, e.g., the Internet.

When used in a LAN networking environment, the computer 2402 can be connected to the local network 2454 through a wired or wireless communication network interface or adapter 2458. The adapter 2458 can facilitate wired or wireless communication to the LAN 2454, which can also include a wireless access point (AP) disposed thereon for communicating with the adapter 2458 in a wireless mode.

When used in a WAN networking environment, the computer 2402 can include a modem 2460 or can be connected to a communications server on the WAN 2456 via other means for establishing communications over the WAN 2456, such as by way of the Internet. The modem 2460, which can be internal or external and a wired or wireless device, can be connected to the system bus 2408 via the input device interface 2444. In a networked environment, program modules depicted relative to the computer 2402 or portions thereof, can be stored in the remote memory/storage device 2452. It will be appreciated that the network connections shown are example and other means of establishing a communications link between the computers can be used.

When used in either a LAN or WAN networking environment, the computer 2402 can access cloud storage systems or other network-based storage systems in addition to, or in place of, external storage devices 2416 as described above, such as but not limited to a network virtual machine providing one or more aspects of storage or processing of information. Generally, a connection between the computer 2402 and a cloud storage system can be established over a LAN 2454 or WAN 2456 e.g., by the adapter 2458 or modem 2460, respectively. Upon connecting the computer 2402 to an associated cloud storage system, the external storage interface 2426 can, with the aid of the adapter 2458 or modem 2460, manage storage provided by the cloud storage system as it would other types of external storage. For instance, the external storage interface 2426 can be configured to provide access to cloud storage sources as if those sources were physically connected to the computer 2402.

The computer 2402 can be operable to communicate with any wireless devices or entities operatively disposed in wireless communication, e.g., a printer, scanner, desktop or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 25:
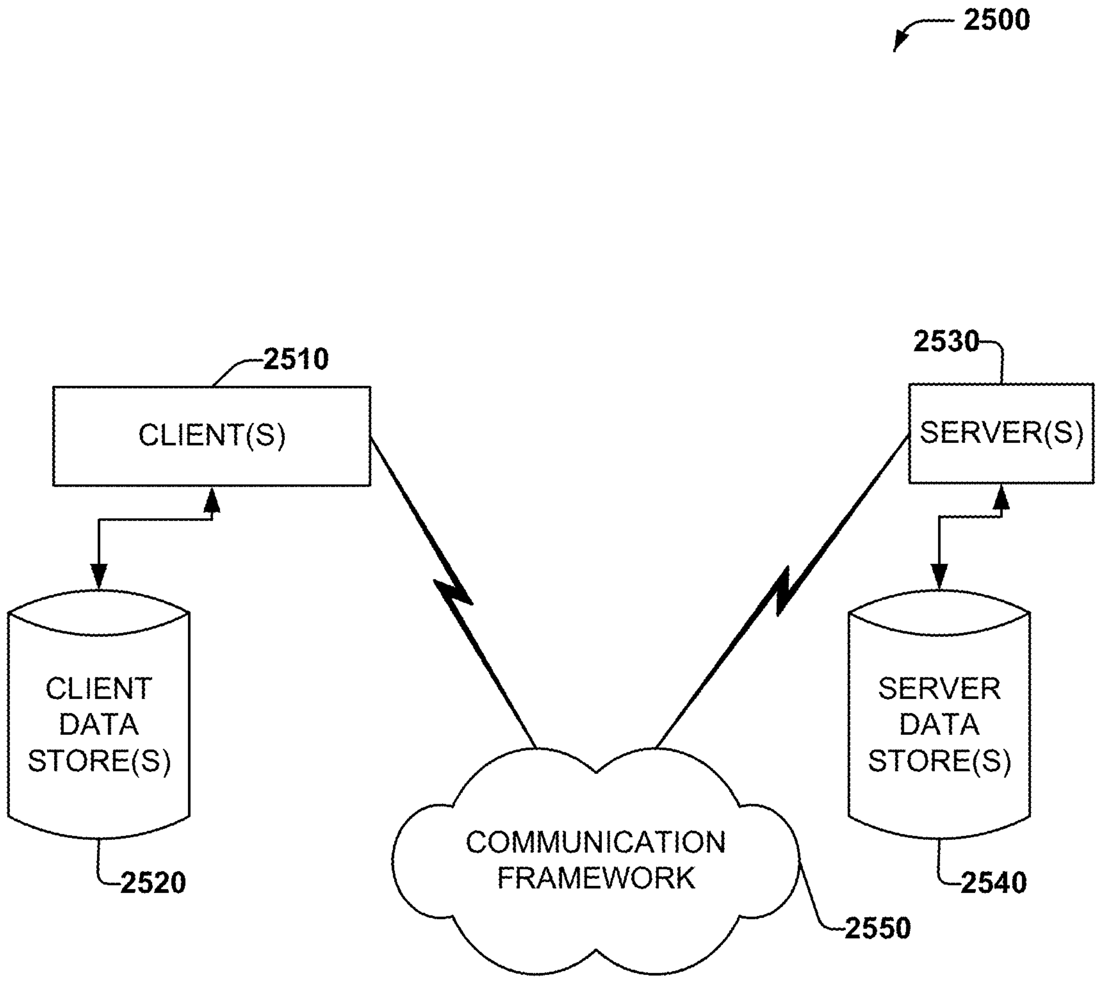
FIG. 25 illustrates an example networking environment operable to execute various implementations described herein.

FIG. 25 is a schematic block diagram of a sample computing environment 2500 with which the disclosed subject matter can interact. The sample computing environment 2500 includes one or more client(s) 2510. The client(s) 2510 can be hardware or software (e.g., threads, processes, computing devices). The sample computing environment 2500 also includes one or more server(s) 2530. The server(s) 2530 can also be hardware or software (e.g., threads, processes, computing devices). The servers 2530 can house threads to perform transformations by employing one or more embodiments as described herein, for example. One possible communication between a client 2510 and a server 2530 can be in the form of a data packet adapted to be transmitted between two or more computer processes. The sample computing environment 2500 includes a communication framework 2550 that can be employed to facilitate communications between the client(s) 2510 and the server(s) 2530. The client(s) 2510 are operably connected to one or more client data store(s) 2520 that can be employed to store information local to the client(s) 2510. Similarly, the server (s) 2530 are operably connected to one or more server data store(s) 2540 that can be employed to store information local to the servers 2530.

Figure 26:
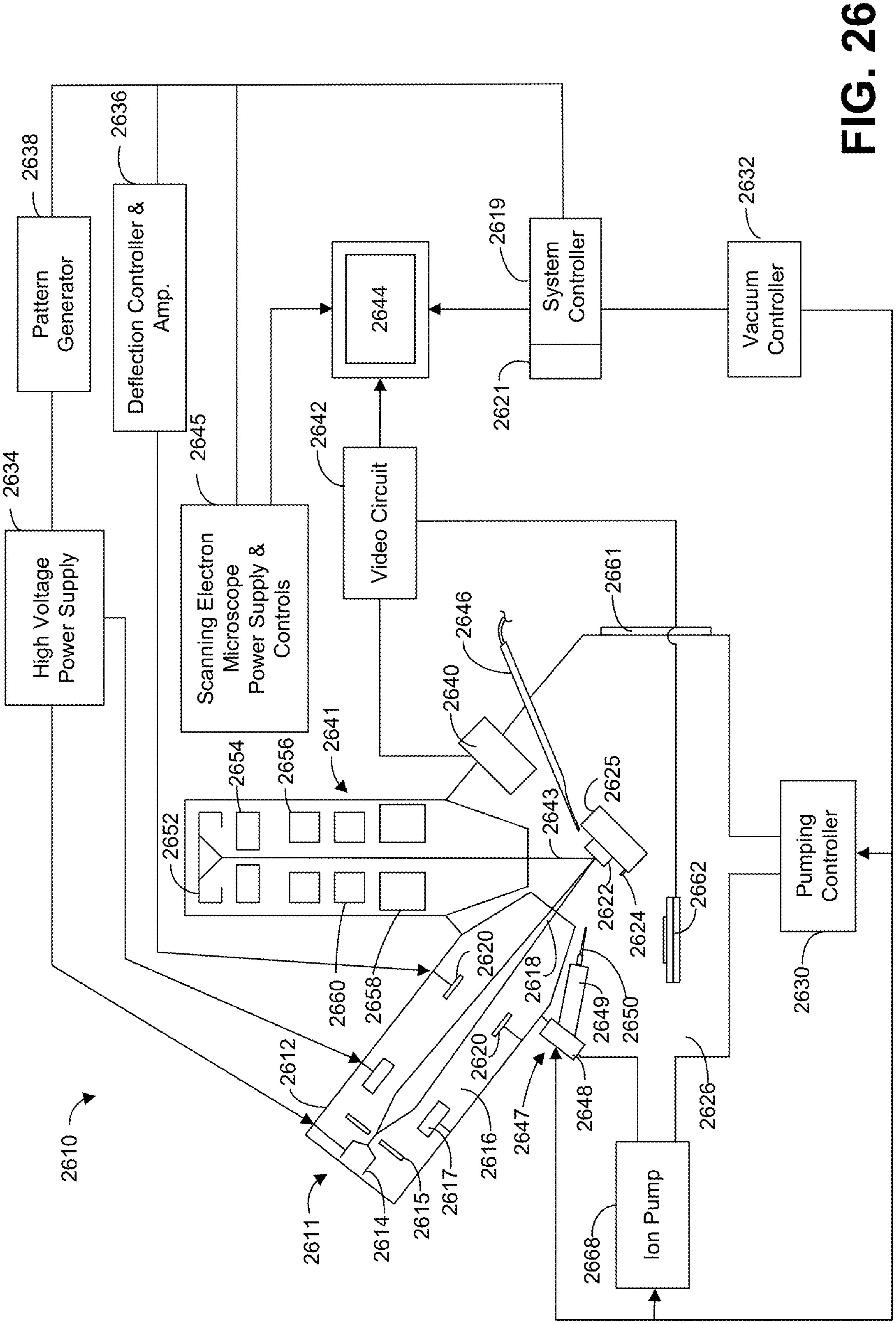
FIG. 26 illustrates an example dual beam microscope that can be implemented in accordance with various embodiments described herein.

An example, non-limiting apparatus for performing various embodiments described herein is shown in FIG. 26. FIG. 26 illustrates a non-limiting example of a dual beam system 2610 with a vertically mounted scanning electron microscope (SEM) column and a focused ion beam (FIB) column mounted at an angle of approximately 52 degrees from the vertical. Such dual beam systems are commercially available, for example, from FEI Company, Hillsboro, Oregon, the assignee of the present application. While FIG. 26 shows an example of suitable microscopy hardware with which various embodiments described herein can be implemented, it is to be appreciated that such microscopy hardware is non-limiting. In other words, various embodiments described herein can be implemented in conjunction with any other suitable types of microscopy hardware. The dual beam system 2610 is a non-limiting example of the scientific instrument 302 or of any other scientific instruments discussed above.

A scanning electron microscope 2641, along with a power supply and control unit 2645, can be provided with the dual beam system 2610. An electron beam 2643 can be emitted from a cathode 2652 by applying voltage between the cathode 2652 and an anode 2654. The electron beam 2643 can be focused to a fine spot by means of a condensing lens 2656 and an objective lens 2658. The electron beam 2643 can be scanned two-dimensionally on any suitable specimen by means of a deflection coil 2660. Operation of the condensing lens 2656, the objective lens 2658, or the deflection coil 2660 can be controlled by the power supply and control unit 2645.

The electron beam 2643 can be focused onto a substrate 2622, which can be on a movable X-Y stage 2625 within a lower chamber 2626. When the electrons in the electron beam 2643 strike the substrate 2622, secondary electrons can be emitted. These secondary electrons can be detected by a secondary electron detector 2640 as discussed below. A scanning transmission electron microscopy (STEM) detector 2662, located beneath a transmission electron microscopy (TEM) sample holder 2624 and the movable X-Y stage 2625, can collect electrons that are transmitted through the sample mounted on the TEM sample holder 2624 as discussed above.

The dual beam system 2610 can also include a focused ion beam (FIB) system 2611 which can comprise an evacuated chamber having an upper neck portion 2612 within which can be located an ion source 2614 and a focusing column 2616 including extractor electrodes and an electrostatic optical system. The axis of the focusing column 2616 can be tilted 52 degrees (or any other suitable angular displacement) from the axis of the electron column. The ion column 2612 can include an ion source 2614, an extraction electrode 2615, a focusing element 2617, deflection elements 2620, and a focused ion beam 2618. The focused ion beam 2618 can pass from the ion source 2614 through the focusing column 2616 and between electrostatic deflection means schematically indicated at numeral 2620 toward the substrate 2622, which can comprise, for example, a semiconductor device positioned on the movable X-Y stage 2625 within the lower chamber 2626.

The movable X-Y stage 2625 can move in a horizontal plane (along X and Y axes) and vertically (along Z axis). The movable X-Y stage 2625 can tilt approximately sixty (60) degrees and rotate about the Z axis. In some embodiments, a separate TEM sample stage (not shown) can be used. Such a TEM sample stage can be moveable in the X, Y, and Z axes. A door 2661 can be opened for inserting the substrate 2622 onto the movable X-Y stage 2625 or also for servicing an internal gas supply reservoir, if one is used. The door 2661 can be interlocked so that it cannot be opened if the system is under vacuum.

An ion pump 2668 can be employed for evacuating the neck portion 2612. The chamber 2626 can be evacuated with a turbomolecular and mechanical pumping system 2630 under the control of a vacuum controller 2632. Such vacuum system can provide within the chamber 2626 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

A high voltage power supply 2634 can provide an appropriate acceleration voltage to electrodes in the focusing column 2616 for energizing and the focused ion beam 2618. When it strikes the substrate 2622, material can be sputtered (that is, physically ejected) from the sample. Alternatively, the focused ion beam 2618 can decompose a precursor gas to deposit a material.

The high voltage power supply 2634 can be connected to the ion source 2614 (which can be a liquid metal ion source)

as well as to appropriate electrodes in the ion beam focusing column 2616 for forming an approximately 1 keV to 60 keV ion beam 2618 and directing the same toward a sample. A deflection controller and amplifier 2636, operated in accordance with a prescribed pattern provided by a pattern generator 2638, can be coupled to the deflection elements 2620 (which can be deflection plates) whereby the focused ion beam 2618 may be controlled manually or automatically to trace out a corresponding pattern on the upper surface of the substrate 2622. In some systems, the deflection elements 2620 can be placed before the final lens. Beam blanking electrodes (not shown) within the ion beam focusing column 2616 can cause the focused ion beam 2618 to impact onto a blanking aperture (not shown) instead of the substrate 2622 when a blanking controller (not shown) applies a blanking voltage to a blanking electrode.

The ion source 2614 can provide a metal ion beam of gallium, for example. In other examples, the ion source 2614 may be a plasma ion source that extracts ions from a generated plasma. The source can be capable of being focused into a sub one-tenth micrometer wide beam at the substrate 2622 for either modifying the substrate 2622 by ion milling, enhanced etch, material deposition, or for the purpose of imaging the substrate 2622.

A charged particle detector 2640, such as an Everhart Thornley or multi-channel plate, used for detecting secondary ion or electron emission can be connected to a video circuit 2642 that can supply drive signals to a video monitor 2644 and receive deflection signals from a system controller 2619. The location of the charged particle detector 2640 within the lower chamber 2626 can vary in different embodiments. For example, the charged particle detector 2640 can be coaxial with the ion beam and include a hole for allowing the ion beam to pass. In other embodiments, secondary particles can be collected through a final lens and then diverted off axis for collection.

A micromanipulator 2647 can precisely move objects within the vacuum chamber. The micromanipulator 2647 may comprise precision electric motors 2648 positioned outside the vacuum chamber to provide X, Y, Z, and theta control of a portion 2649 positioned within the vacuum chamber. The micromanipulator 2647 can be fitted with different end effectors for manipulating small objects. In various embodiments described herein, the end effector can be a thin probe 2650.

A gas delivery system 2646 can extend into the lower chamber 2626 for introducing and directing a gaseous vapor toward the substrate 2622. U.S. Pat. No. 5,851,413 to Casella et al. for "Gas Delivery Systems for Particle Beam Processing," assigned to the assignee of the present invention, describes a suitable gas delivery system 2646. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

The system controller 2619 can control the operations of the various parts of the dual beam system 2610. Through the system controller 2619, a user can cause the focused ion beam 2618 or the electron beam 2643 to be scanned in a desired manner through commands entered into any suitable user interface (not shown). Alternatively, the system controller 2619 may control the dual beam system 2610 in accordance with programmed instructions stored in a memory 2621. In various embodiments, any of the one or more software components 315 (e.g., the access component 316, the model component 318, the milling component 320, the training component 1302) can be implemented in or otherwise executed by the system controller 2619.

Various embodiments may be a system, a method, an apparatus or a computer program product at any possible technical detail level of integration. The computer program product can include a computer readable storage medium (or media) having computer readable program instructions thereon for causing a processor to carry out aspects of various embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network or a wireless network. The network can comprise copper transmission cables, optical transmission fibers, wireless transmission, routers, firewalls, switches, gateway computers or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various embodiments can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform various aspects.

Various aspects are described herein with reference to flowchart illustrations or block diagrams of methods, apparatus (systems), and computer program products according to various embodiments. It will be understood that each block of the flowchart illustrations or block diagrams, and combinations of blocks in the flowchart illustrations or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks. These computer readable program instructions can also be stored in a computer readable storage medium that can direct a computer, a programmable data processing apparatus, or other devices to function in a particular manner, such that the computer readable storage medium having instructions stored therein comprises an article of manufacture including instructions which implement aspects of the function/act specified in the flowchart or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart or block diagram block or blocks.

The flowcharts and block diagrams in the Figures illustrate the architecture, functionality, and operation of possible implementations of systems, methods, and computer program products according to various embodiments. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer or computers, those skilled in the art will recognize that this disclosure also can or can be implemented in combination with other program modules. Generally, program modules include routines, programs, components, data structures, etc. that perform particular tasks or implement particular abstract data types. Moreover, those skilled in the art will appreciate that various aspects can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, or a computer. By way of illustration, both an application running on a server and the server can be a component. One or more components can reside within a process or thread of execution and a component can be localized on one computer or distributed between two or more computers. In another example, respective components can execute from various computer readable media having various data structures stored thereon. The components can communicate via local or remote processes such as in accordance with a signal having one or more data packets (e.g., data from one component interacting with another component in a local system, distributed system, or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. As used herein, the term "and/or" is intended to have the same meaning as "or." Moreover, articles "a" and "an" as used in the subject specification and annexed drawings should generally be construed to mean "one or more" unless specified otherwise or clear from context to be directed to a singular form. As used herein, the terms "example" or "exemplary" are utilized to mean serving as an example, instance, or illustration. For the avoidance of doubt, the subject matter disclosed herein is not limited by such examples. In addition, any aspect or design described herein as an "example" or "exemplary" is not necessarily to be construed as preferred or advantageous over other aspects or designs, nor is it meant to preclude equivalent exemplary structures and techniques known to those of ordinary skill in the art.

The herein disclosure describes non-limiting examples. For ease of description or explanation, various portions of the herein disclosure utilize the term "each," "every," or "all" when discussing various examples. Such usages of the term "each," "every," or "all" are non-limiting. In other words, when the herein disclosure provides a description that is applied to "each," "every," or "all" of some particular object or component, it should be understood that this is a non-limiting example, and it should be further understood that, in various other examples, it can be the case that such description applies to fewer than "each," "every," or "all" of that particular object or component.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Various non-limiting aspects are described in the following examples.

EXAMPLE 1: A system can comprise: a processor that executes computer-executable components stored in a non-transitory computer-readable memory, wherein the computer-executable components comprise: an access component that can access an image captured by a scientific instrument, wherein the image can depict a cutface of a lamella; and a model component that can generate, via execution of a graph-weighted neural network, a classification label for the cutface, wherein the classification label can indicate to which one of a plurality of defined classes the cutface belongs.

EXAMPLE 2: The system of any preceding example can be implemented, wherein the computer-executable components further comprise: a milling component that can, in response to the classification label indicating that the cutface does not belong to a target class of the plurality of defined classes, instruct the scientific instrument to incrementally mill the cutface of the lamella.

EXAMPLE 3: The system of any preceding example can be implemented, wherein the graph-weighted neural network can comprise a deep learning neural network and a class neighborhood graph, wherein nodes of the class neighborhood graph can represent respective ones of the plurality of defined classes, and wherein weighted edges of the class neighborhood graph can indicate which of the plurality of defined classes do and do not physically neighbor one another within the lamella along a direction of milling.

EXAMPLE 4: The system of any preceding example can be implemented, wherein the deep learning neural network can receive the image or a portion thereof as input and produce a raw classification label as output, wherein the raw classification label can indicate raw probabilities that the cutface belongs to respective ones of the plurality of defined classes, wherein the graph component can multiply the raw probabilities by respective weighted edges indicated in the class neighborhood graph and normalize resulting products, thereby yielding modified probabilities, and wherein the modified probabilities can collectively form the classification label.

EXAMPLE 5: The system of any preceding example can be implemented, wherein the class neighborhood graph can comprise a first node, one or more second nodes, and one or more third nodes, wherein the first node can represent a first class of the plurality of defined classes, wherein the one or more second nodes can respectively represent one or more second classes of the plurality of defined classes that are expected to physically neighbor the first class along the direction of milling, wherein the one or more third nodes can respectively represent one or more third classes of the plurality of defined classes that are expected to not physically neighbor the first class along the direction of milling, wherein the first node can have a high-weight edge with itself, wherein the first node can have one or more intermediate-weight edges with the one or more second nodes, and wherein the first node can have one or more low-weight edges with the one or more third nodes.

EXAMPLE 6: The system of any preceding example can be implemented, wherein the class neighborhood graph can be generated based on collection and annotation of training images for the deep learning neural network.

EXAMPLE 7: The system of any preceding example can be implemented, wherein the class neighborhood graph can be generated based on a computer-aided design file associated with the lamella.

EXAMPLE 8: The system of any preceding example can be implemented, wherein the lamella can comprise a field effect transistor, and wherein the plurality of defined classes can comprise one or more first classes associated with a gate of the field effect transistor, one or more second classes associated with a source drain of the field effect transistor, or one or more third classes associated with a fin of the field effect transistor.

In various embodiments, any combination or combinations of examples 1-8 can be implemented.

EXAMPLE 9: A computer-implemented method can comprise: accessing, by a device operatively coupled to a processor, an image captured by a scientific instrument, wherein the image can depict a cutface of a lamella; and generating, by the device and via execution of a graph-weighted neural network, a classification label for the cutface, wherein the classification label can indicate to which one of a plurality of defined classes the cutface belongs.

EXAMPLE 10: The computer-implemented method of any preceding example can be implemented, further comprising: instructing, by the device and in response to the classification label indicating that the cutface does not belong to a target class of the plurality of defined classes, the scientific instrument to incrementally mill the cutface of the lamella.

EXAMPLE 11: The computer-implemented method of any preceding example can be implemented, wherein the graph-weighted neural network can comprise a deep learning neural network and a class neighborhood graph, wherein nodes of the class neighborhood graph can represent respective ones of the plurality of defined classes, and wherein weighted edges of the class neighborhood graph can indicate which of the plurality of defined classes do and do not physically neighbor one another within the lamella along a direction of milling.

EXAMPLE 12: The computer-implemented method of any preceding example can be implemented, wherein the deep learning neural network can receive the image or a portion thereof as input and produce a raw classification label as output, wherein the raw classification label can indicate raw probabilities that the cutface belongs to respective ones of the plurality of defined classes, wherein the device can multiply the raw probabilities by respective weighted edges indicated in the class neighborhood graph and normalize resulting products, thereby yielding modified probabilities, and wherein the modified probabilities can collectively form the classification label.

EXAMPLE 13: The computer-implemented method of any preceding example can be implemented, wherein the class neighborhood graph can comprise a first node, one or more second nodes, and one or more third nodes, wherein the first node can represent a first class of the plurality of defined classes, wherein the one or more second nodes can respectively represent one or more second classes of the plurality of defined classes that are expected to physically neighbor the first class along the direction of milling, wherein the one or more third nodes can respectively represent one or more third classes of the plurality of defined classes that are expected to not physically neighbor the first class along the direction of milling, wherein the first node can have a high-weight edge with itself, wherein the first node can have one or more intermediate-weight edges with the one or more second nodes, and wherein the first node can have one or more low-weight edges with the one or more third nodes.

EXAMPLE 14: The computer-implemented method of any preceding example can be implemented, wherein the class neighborhood graph can be generated based on collection and annotation of training images for the deep learning neural network.

EXAMPLE 15: The computer-implemented method of any preceding example can be implemented, wherein the class neighborhood graph can be generated based on a computer-aided design file associated with the lamella.

EXAMPLE 16: The computer-implemented method of any preceding example can be implemented, wherein the lamella can comprise a field effect transistor, and wherein the plurality of defined classes can comprise one or more first classes associated with a gate of the field effect transistor, one or more second classes associated with a source drain of the field effect transistor, or one or more third classes associated with a fin of the field effect transistor.

In various embodiments, any combination or combinations of examples 9-16 can be implemented.

EXAMPLE 17: A computer program product for facilitating lamella end-pointing via graph-weighted neural networks can comprise a non-transitory computer-readable memory having program instructions embodied therewith. In various aspects, the program instructions can be executable by a processor to cause the processor to: access an image captured by a dual beam charged-particle microscope, wherein the image can depict a cutface of a lamella; generate, via execution of a graph-weighted neural network, a classification label for the cutface, wherein the classification label can indicate which one of a plurality of structures the cutface contains; and instruct, in response to the classification label indicating that the cutface does not contain a target structure, the dual beam charged-particle microscope to incrementally mill the cutface of the lamella.

EXAMPLE 18: The computer program product of any preceding example can be implemented, wherein the graph-weighted neural network can comprise a deep learning neural network and a neighborhood graph, wherein nodes of the neighborhood graph can represent respective ones of the plurality of structures, and wherein weighted edges of the neighborhood graph can indicate which of the plurality of structures do and do not physically neighbor one another within the lamella along a direction of milling.

EXAMPLE 19: The computer program product of any preceding example can be implemented, wherein the deep learning neural network can receive the image or a portion thereof as input and produce a raw classification label as output, wherein the raw classification label can indicate raw probabilities that the cutface contains respective ones of the plurality of structures, wherein the processor can multiply the raw probabilities by respective weighted edges indicated in the neighborhood graph and normalize resulting products, thereby yielding modified probabilities, and wherein the modified probabilities can collectively form the classification label.

EXAMPLE 20: The computer program product of any preceding example can be implemented, wherein the neighborhood graph can comprise a first node, one or more second nodes, and one or more third nodes, wherein the first node can represent a first structure of the plurality of structures, wherein the one or more second nodes can respectively represent one or more second structures of the plurality of structures that are expected to physically neighbor the first structure along the direction of milling, wherein the one or more third nodes can respectively represent one or more third structures of the plurality of structures that are expected to not physically neighbor the first structure along the direction of milling, wherein the first node can have a high-weight edge with itself, wherein the first node can have one or more intermediate-weight edges with the one or more second nodes, and wherein the first node can have one or more low-weight edges with the one or more third nodes.

In various embodiments, any combination or combinations of examples 17-20 can be implemented.

In various embodiments, any combination or combinations of examples 1-20 can be implemented.

What is claimed is:

1. A system, comprising:

a processor that executes computer-executable components stored in a non-transitory computer-readable memory, wherein the computer-executable components comprise:

an access component that accesses an image captured by a scientific instrument, wherein the image depicts a cutface of a lamella; and a model component that generates, via execution of a graph-weighted neural network, a classification label for the cutface, wherein the classification label indicates to which one of a plurality of defined classes the cutface belongs, wherein the graph-weighted neural network comprises a deep learning neural network and a class neighborhood graph, wherein nodes of the class neighborhood graph represent respective ones of the plurality of defined classes, and wherein weighted edges of the class neighborhood graph indicate which of the plurality of defined classes do and do not physically neighbor one another within the lamella along a direction of milling.

2. The system of claim 1, wherein the computer-executable components further comprise:

a milling component that, in response to the classification label indicating that the cutface does not belong to a target class of the plurality of defined classes, instructs the scientific instrument to incrementally mill the cutface of the lamella.

3. The system of claim 1, wherein the deep learning neural network receives the image or a portion thereof as input and produces a raw classification label as output, wherein the raw classification label indicates raw probabilities that the cutface belongs to respective ones of the plurality of defined classes, wherein the graph component multiplies the raw probabilities by respective weighted edges indicated in the class neighborhood graph and normalizes resulting products, thereby yielding modified probabilities, and wherein the modified probabilities collectively form the classification label.

4. The system of claim 1, wherein the class neighborhood graph comprises a first node, one or more second nodes, and one or more third nodes, wherein the first node represents a first class of the plurality of defined classes, wherein the one or more second nodes respectively represent one or more second classes of the plurality of defined classes that are known to physically neighbor the first class along the direction of milling, wherein the one or more third nodes respectively represent one or more third classes of the plurality of defined classes that are known to not physically neighbor the first class along the direction of milling, wherein the first node has a high-weight edge with itself, wherein the first node has one or more intermediate-weight edges with the one or more second nodes, and wherein the first node has one or more low-weight edges with the one or more third nodes.

5. The system of claim 1, wherein the class neighborhood graph is generated based on collection and annotation of training images for the deep learning neural network.

6. The system of claim 1, wherein the class neighborhood graph is generated based on a computer-aided design file associated with the lamella.

7. The system of claim 1, wherein the lamella comprises a field effect transistor, and wherein the plurality of defined classes comprise one or more first classes associated with a gate of the field effect transistor, one or more second classes associated with a source drain of the field effect transistor, or one or more third classes associated with a fin of the field effect transistor.

8. A computer-implemented method, comprising:

accessing, by a device operatively coupled to a processor, an image captured by a scientific instrument, wherein the image depicts a cutface of a lamella, wherein the lamella comprises a field effect transistor; and generating, by the device and via execution of a graph-weighted neural network, a classification label for the cutface, wherein the classification label indicates to which one of a plurality of defined classes the cutface belongs, wherein the plurality of defined classes comprise one or more first classes associated with a gate of the field effect transistor, one or more second classes associated with a source drain of the field effect transistor, or one or more third classes associated with a fin of the field effect transistor.

9. The computer-implemented method of claim 8, further comprising:

instructing, by the device and in response to the classification label indicating that the cutface does not belong to a target class of the plurality of defined classes, the scientific instrument to incrementally mill the cutface of the lamella.

10. The computer-implemented method of claim 8, wherein the graph-weighted neural network comprises a deep learning neural network and a class neighborhood graph, wherein nodes of the class neighborhood graph represent respective ones of the plurality of defined classes, and wherein weighted edges of the class neighborhood graph indicate which of the plurality of defined classes do and do not physically neighbor one another within the lamella along a direction of milling.

11. The computer-implemented method of claim 10, wherein the deep learning neural network receives the image or a portion thereof as input and produces a raw classification label as output, wherein the raw classification label indicates raw probabilities that the cutface belongs to respective ones of the plurality of defined classes, wherein the device multiplies the raw probabilities by respective weighted edges indicated in the class neighborhood graph and normalizes resulting products, thereby yielding modified probabilities, and wherein the modified probabilities collectively form the classification label.

12. The computer-implemented method of claim 10, wherein the class neighborhood graph comprises a first node, one or more second nodes, and one or more third nodes, wherein the first node represents a first class of the plurality of defined classes, wherein the one or more second nodes respectively represent the one or more second classes of the plurality of defined classes that are known to physically neighbor the first class along the direction of milling, wherein the one or more third nodes respectively represent the one or more third classes of the plurality of defined classes that are known to not physically neighbor the first class along the direction of milling, wherein the first node has a high-weight edge with itself, wherein the first node has one or more intermediate-weight edges with the one or more second nodes, and wherein the first node has one or more low-weight edges with the one or more third nodes.

13. The computer-implemented method of claim 10, wherein the class neighborhood graph is generated based on collection and annotation of training images for the deep learning neural network.

14. The computer-implemented method of claim 10, wherein the class neighborhood graph is generated based on a computer-aided design file associated with the lamella.

15. A computer program product for facilitating lamella end-pointing via graph-weighted neural networks, the computer program product comprising a non-transitory computer-readable memory having program instructions embodied therewith, the program instructions executable by a processor to cause the processor to:

access an image captured by a dual beam charged-particle microscope, wherein the image depicts a cutface of a lamella;

generate, via execution of a graph-weighted neural network, a classification label for the cutface, wherein the classification label indicates which one of a plurality of structures the cutface contains, wherein the graph-weighted neural network comprises a deep learning neural network and a neighborhood graph, wherein nodes of the neighborhood graph represent respective ones of the plurality of structures, and wherein weighted edges of the neighborhood graph indicate which of the plurality of structures do and do not physically neighbor one another within the lamella along a direction of milling; and instruct, in response to the classification label indicating that the cutface does not contain a target structure, the dual beam charged-particle microscope to incrementally mill the cutface of the lamella.

16. The computer program product of claim 15, wherein the deep learning neural network receives the image or a portion thereof as input and produces a raw classification label as output, wherein the raw classification label indicates raw probabilities that the cutface contains respective ones of the plurality of structures, wherein the processor multiplies the raw probabilities by respective weighted edges indicated in the neighborhood graph and normalizes resulting products, thereby yielding modified probabilities, and wherein the modified probabilities collectively form the classification label.

17. The computer program product of claim 15, wherein the neighborhood graph comprises a first node, one or more second nodes, and one or more third nodes, wherein the first node represents a first structure of the plurality of structures, wherein the one or more second nodes respectively represent one or more second structures of the plurality of structures that are known to physically neighbor the first structure along the direction of milling, wherein the one or more third nodes respectively represent one or more third structures of the plurality of structures that are known to not physically neighbor the first structure along the direction of milling, wherein the first node has a high-weight edge with itself, wherein the first node has one or more intermediate-weight edges with the one or more second nodes, and wherein the first node has one or more low-weight edges with the one or more third nodes.

18. The computer program product of claim 15, wherein the neighborhood graph is generated based on collection and annotation of training images for the deep learning neural network.

19. The computer program product of claim 15, wherein the neighborhood graph is generated based on a computer-aided design file associated with the lamella.

20. The computer program product of claim 15, wherein the lamella comprises a field effect transistor, and wherein the plurality of structures comprise one or more first structures associated with a gate of the field effect transistor, one or more second structures associated with a source drain of the field effect transistor, or one or more third structures associated with a fin of the field effect transistor.

* * * * *